US 8,240,582 B2

(12) United States Patent
Suzuki et al.

(10) Patent No.: US 8,240,582 B2
(45) Date of Patent: Aug. 14, 2012

(54) STACKED PIEZOELECTRIC DEVICE

(75) Inventors: Satoshi Suzuki, Nisshin (JP); Atsushi Murai, Kuwana (JP); Hiroaki Asano, Kuwana (JP); Kouji Noda, Aichi-ken (JP); Toshiatu Nagaya, Kuwana (JP); Akio Iwase, Nishio (JP); Akira Fujii, Yokkaichi (JP); Shige Kadotani, Aichi-ken (JP)

(73) Assignee: Denso Corporation, Kariya (JP)

( * ) Notice: Subject to any disclaimer, the term of this patent is extended or adjusted under 35 U.S.C. 154(b) by 403 days.

(21) Appl. No.: 12/528,683

(22) PCT Filed: Feb. 26, 2008

(86) PCT No.: PCT/JP2008/053229
§ 371 (c)(1),
(2), (4) Date: Feb. 2, 2010

(87) PCT Pub. No.: WO2008/105382
PCT Pub. Date: Sep. 4, 2008

(65) Prior Publication Data
US 2010/0140379 A1   Jun. 10, 2010

(30) Foreign Application Priority Data

Feb. 26, 2007  (JP) ................................ 2007-046070
Jan. 29, 2008  (JP) ................................ 2008-017946
Feb. 22, 2008  (JP) ................................ 2008-042111

(51) Int. Cl.
*B05B 1/08* (2006.01)

(52) U.S. Cl. ................................ 239/102.2; 239/533.12

(58) Field of Classification Search ................ 239/102.1, 239/102.2, 569; 310/364, 366, 367, 332, 310/328, 330
See application file for complete search history.

(56) References Cited

U.S. PATENT DOCUMENTS

| 4,523,121 A | 6/1985 | Takahashi et al. |
| 5,233,260 A * | 8/1993 | Harada et al. ................ 310/328 |
| 5,834,879 A * | 11/1998 | Watanabe et al. ............ 310/328 |
| 6,215,230 B1 * | 4/2001 | Ide et al. ...................... 310/366 |
| 7,564,173 B2 * | 7/2009 | Namerikawa et al. ........ 310/328 |
| 2005/0168106 A1 | 8/2005 | Iwase et al. |
| 2006/0066178 A1 | 3/2006 | Lindner et al. |

(Continued)

FOREIGN PATENT DOCUMENTS
JP    S58-196077    11/1983
(Continued)

OTHER PUBLICATIONS

International Search Report for PCT/JP2008/053229 mailed Mar. 25, 2008.

(Continued)

*Primary Examiner* — Davis Hwu
(74) *Attorney, Agent, or Firm* — Nixon & Vanderhye PC

(57) ABSTRACT

A stacked piezoelectric device 1 including a ceramic laminate formed by laminating piezoelectric ceramic layers and inner electrode layers alternately and a pair of side electrodes. The inner electrode layers 13 and 14 have inner electrode portions 131 and 141 and the recessed portions 132 and 142. The ceramic laminate 15 has the stress absorbing portions 11 and 12. A recessed distance of one of two of the recessed portions 132 and 142 which interleave the stress absorbing portions 11 and 12 therebetween which is located on the same side surface as the stress absorbing portion 11 or 12 is greater than the depth of the stress absorbing portion 11 and 12.

18 Claims, 46 Drawing Sheets

U.S. PATENT DOCUMENTS

| | | |
|---|---|---|
| 2006/0119220 A1 | 6/2006 | Iwase et al. |
| 2006/0177147 A1 | 8/2006 | Asahi et al. |
| 2010/0139621 A1* | 6/2010 | Murai et al. .................. 123/472 |

FOREIGN PATENT DOCUMENTS

| | | |
|---|---|---|
| JP | 62-271478 | 11/1987 |
| JP | H03-241782 | 10/1991 |
| JP | H05-335644 | 12/1993 |
| JP | H08-274381 | 10/1996 |
| JP | 11-186625 | 7/1999 |
| JP | 2000-244033 | 9/2000 |
| JP | 2001-156348 | 6/2001 |
| JP | 2004-288794 | 10/2004 |
| JP | 2005-191047 | 7/2005 |
| JP | 2005-223013 | 8/2005 |
| JP | 2005-340540 | 12/2005 |
| JP | 2006-165193 | 6/2006 |
| JP | 2006-173348 | 6/2006 |
| JP | 2006-179525 | 7/2006 |
| JP | 2006-210423 | 8/2006 |
| JP | 2006-216850 | 8/2006 |
| JP | 2006-229068 | 8/2006 |
| JP | 2006-237246 | 9/2006 |
| WO | WO 2007/031700 A1 | 3/2007 |

OTHER PUBLICATIONS

Notification of Transmittal of copies of Translation of the International Preliminary Report on Patentability and Written Opinion for PCT/JP2008/053229, mailed Sep. 11, 2009, 5 pages.

"Longitudinal Mode Multilayer Piezoceramic Actuators" by Sadayuki Takahashi: Ceramic Bulletin, vol. 65, No. 8, 1986; pp. 1156-1157.

* cited by examiner

STACKED PIEZOELECTRIC DEVICE

This application is the U.S. national phase of International Application No. PCT/JP2008/053229 filed 26 Feb. 2008 which designated the U.S. and claims priority to Japanese Patent Application Nos. 2007-046070 filed 26 Feb. 2007, 2008-017946 filed 29 Jan. 2008 and 2008-042111 filed 22 Feb. 2008, the entire contents of each of which are hereby incorporated by reference.

TECHNICAL FIELD

The present invention relates to a stacked piezoelectric device equipped with a ceramic laminate made up of a plurality of piezoelectric ceramic layers and a plurality of inner electrode layers which are laminated alternately, a pair of side electrodes formed on side surfaces of the ceramic layer laminate, and stress absorbing portions formed in slit-like areas depressed inwardly into the sides of the ceramic laminate.

BACKGROUND ART

Conventionally, stacked piezoelectric devices are used as drive source of fuel injectors. The stacked piezoelectric device is made up of, for example, a ceramic laminate formed by stacking inner electrodes and piezoelectric ceramics alternately and a pair of outer electrodes connected to the inner electrode alternately.

The stacked piezoelectric device is used in severe environmental conditions over a long duration, especially when employed in fuel injectors. Therefore, in order to improve the electric insulation of the side surfaces, a ceramic laminate having inner electrode-unformed areas where a portion of an end of an inner electrode layer is recessed inwardly is adapted widely.

However, the formation of the inner electrode-unformed areas in order to improve the insulation may cause portions which are susceptible and insusceptible to deformation to appear in the ceramic laminate upon application of voltage thereto, resulting in concentration of stress at interfaces therebetween and cracks in the device.

In order to avoid the cracks arising from the concentration of stress, stacked piezoelectric devices are being developed which have grooves (stress absorbing portions) formed at a given interval away from each other in a laminating direction in the side surface of the ceramic laminate (see patent document 1).

However, even when the stress absorbing portions are formed, the application of the voltage to the stress absorbing portions also may result in cracks extending from the top end of the stress absorbing portions. In order to avoid this, it is necessary to increase the depth of the stress absorbing portion in a direction perpendicular to the laminating direction more than the distance of the inner electrode-unformed areas. Such a structure, however, causes great electric discharge to occur at the stress absorbing portions (grooves) upon application of great voltage thereto, so that they may be short-circuited. This gives rise to the problem of insufficient electric insulation, which results in a decrease in service life of the stacked piezoelectric devices.

Stacked piezoelectric devices are being developed in which the inner electrodes interleaving the stress absorbing portion therebetween are made to have the same polarity in order to avoid the formation of cracks (see patent document 2)

In such conventional stacked piezoelectric devices, it is possible to make the inner electrodes interleaving the stress absorbing portion therebetween to have the same polarity to make the piezoelectric ceramic layer interleaved between them as voltage inactive layers, thereby concentrating the stress at the voltage inactive layers when the stacked piezoelectric device expands. This causes cracks to occur in the stress absorbing portions selectively or preferentially, thereby avoiding the crack in voltage active layers of the laminate to improve the durability.

However, in fact, even when no cracks occur in the stress absorbing portions, it is still difficult to ensure sufficient electric insulation, which gives rise to the problem of a drop in electric insulation, thus resulting in formation of cracks. Additionally, electric field is not applied to the ceramic layers including the stress absorbing portions interleaved between the inner electrodes having the same polarity, so that they are hardly deformed. This results in the problem of a decreased amount of stroke of the stacked piezoelectric devices.

DISCLOSURE OF THE INVENTION

Problems to be Solved by the Invention

As described above, the conventional stacked piezoelectric device are designed to have the piezoelectric ceramic layers including the stress absorbing portions as drive layers in order to improve the amount of stroke thereof, but cannot ensure the desired service life.

Patent Document 1: Japanese patent first publication No. 62-271478

Patent Document 2: Japanese patent first publication No. 2006-216850

The present invention was made in view of the above problem and is to provide a stacked piezoelectric device designed to avoid a drop in insulation resistance surely without sacrificing the ability of displacement thereof to have an excellent durability Means for Solving Problem The first invention is in a stacked piezoelectric device including a ceramic laminate formed by laminating a plurality of piezoelectric ceramic layers and a plurality of inner electrode layers alternately and a pair of side electrodes formed on side surfaces extending in a direction perpendicular to a laminating direction of the ceramic laminate, characterized in that said inner electrode layers have a conductive inner electrode-formed area and an inner electrode-unformed area where an outer peripheral edge of said inner electrode-formed area is recessed inwardly from an outer peripheral surface of said ceramic laminate by a given recessed distance and are each connected electrically to one of said side electrodes alternately at the inner electrode-formed areas, said ceramic laminate has slit-like stress absorbing portions recessed inwardly from the side surfaces thereof to have given depths, and said recessed distances of said inner electrode-unformed areas of two of the inner electrode layers which interleave the stress absorbing portion therebetween and lie next thereto are respectively greater than the depths of the stress absorbing portions which are located on the same side surfaces as said inner electrode-unformed areas and lie next to said inner electrode-unformed areas in the laminating direction in a cross section of the stacked piezoelectric device, as taken in the laminating direction (claim 1).

Specifically, the inventors have studied the disadvantages arising from the formation of the stress absorbing portions such as grooves in the stacked piezoelectric device and found that the piezoelectric ceramic layers interleaved between a negative electrode layer next to the stress absorbing portion and a positive electrode layer next to the negative electrode layer will drop in insulation resistance earliest.

First, a drop in insulation resistance of typical stacked piezoelectric devices will be discussed below for explaining the details of the above.

Generally, when high electric field continues to be applied to the stacked piezoelectric device at high temperature, the phenomenon that a lower resistance area spreads from the negative electrode side will appear. For example, the cause is that when the stacked piezoelectric device is made integrally by the firing, conductive metallic ions, as spreading to the piezoelectric ceramic layers during the firing, are metalized by electrons emitted from the negative electrode. The above phenomenon results in a variation in distribution of electric field intensity oriented in the laminating direction between the positive electrode layer and the negative electrode layer. In other words, the electric field intensity drops in the low resistance area, thereby resulting in a rise in electric field intensity in areas other than the low resistance area. The rise in electric field intensity accelerates the deterioration of the insulation resistance. The spreading of the low resistance area is usually accelerated by the existence of water.

Specifically, the phenomenon occurs that $Ag^+$ ions, as spreading from an inner electrode-formed areas made with an AgPd electrode to piezoelectric ceramic layers made of PZT when the piezoelectric device is being fired as a whole are metalized by electrons emitted from the negative electrode layers during driving of the piezoelectric device, thereby causing the low resistance area to be formed which, in turn, expands to the positive electrode layer ($Ag^+ + e^- \rightarrow Ag$ metal).

Particularly, in the case where the stacked piezoelectric device with the stress absorbing portions, the stress absorbing portions will usually be a path leading to the outside where water exists. The phenomenon that the low resistance area expands in the negative electrode layer closest to the stress absorbing portion, therefore, becomes pronounced.

Accordingly, the piezoelectric ceramic layer interleaved between the negative electrode layer next to the stress absorbing portion and the positive electrode layer next to the negative electrode layer drops in insulation resistance earliest. Particularly, piezoelectric layer driving area ends on which both the electric field intensity and the stress arising from the inverse piezoelectric effect concentrate drop in insulation resistance much earlier. The piezoelectric layer driving area ends 90 referred to herein, as illustrated in FIG. 45, are an electrode end 949 of the negative electrode layer next to the stress absorbing portions 91 and 92 of the stacked piezoelectric device 9 (i.e., the outer peripheral end 949 of the inner electrode-formed area 941 which is located adjacent the stress absorbing portions 91 and 92 and connected electrically to the negative side electrode 9) and a portion 960 where a vertical line extending from an electrode end 939 of the positive electrode layer closest in the laminating direction to the negative electrode layer (i.e., an adjacent negative electrode layer) next to the stress absorbing portions 91 and 92 onto the negative electrode layer (i.e., the adjacent negative electrode layer) in the laminating direction intersects with the negative electrode layer 94 (i.e., the adjacent negative electrode layer), in other words, the portion 960 where the vertical line extending from the outer peripheral end 939 of the inner electrode-formed area 931 connected electrically to the positive side electrode layer 98 closest in the laminating direction to the inner electrode layer 94 with the inner electrode-formed area 941 which is next to the stress absorbing portions 91 and 92 and connected electrically to the negative side electrode layer 94 toward the inner electrode-formed area 941 which is next to the stress absorbing portions 91 and 92 and connected electrically to the negative side electrode 97 intersects with the inner electrode-formed area 941. Further, when a great voltage is applied to the stress absorbing portion, it will cause discharge to occur at the stress absorbing portion, thus resulting in a great decrease in insulation resistance.

The inventors have found out a mechanism which contributes to the above described drop in insulation resistance in the stacked piezoelectric device with the stress absorbing portions.

Specifically, in the stacked piezoelectric device of the first invention, said recessed distances of said inner electrode-unformed areas of two of the inner electrode layers which interleave the stress absorbing portion therebetween and lie next thereto are respectively greater than the depths of the stress absorbing portions which are located on the same side surfaces as said inner electrode-unformed areas and the next to said inner electrode-unformed areas in the laminating direction in a cross section of the stacked piezoelectric device, as taken in the laminating direction. In other words, in the cross section of the stacked piezoelectric device, as taken in the laminating direction, the recessed distance of the inner electrode-unformed area of one of two of the inner electrode layers interleaving the stress absorbing portion which lies on the same side surface as the stress absorbing portion is greater than the depth of the stress absorbing portion.

Consequently, the piezoelectric ceramic layers including the stress absorbing portion are used as driving layers, but application of an excessive electric field to the stress absorbing portions is controlled or avoided. It is, therefore, possible to avoid the drop in insulation resistance without almost sacrificing the amount of displacement.

The positive electrode layers and the negative electrode layers, as referred to above, are the inner electrode layers connected electrically to the positive and negative sides of the side electrodes, respectively.

The second invention is in a stacked piezoelectric device including a ceramic laminate fox wed by laminating a plurality of piezoelectric ceramic layers and a plurality of inner electrode layers alternately and a pair of side electrodes formed on side surfaces extending in a direction perpendicular to a laminating direction of the ceramic laminate, characterized in that said inner electrode layers have a conductive inner electrode-formed area and an inner electrode-unformed area where an outer peripheral edge of said inner electrode-formed area is recessed inwardly from an outer peripheral surface of said ceramic laminate by a given recessed distance and are each connected electrically to one of said side electrodes alternately at the inner electrode-formed areas, said ceramic laminate has slit-like stress absorbing portions recessed inwardly from the side surfaces thereof to have given depths, if, in a cross section of the stacked piezoelectric device, as taken in the laminating direction, the stress absorbing portions connected to a negative side of the side electrodes are defined as negative electrode side absorbing portions, and one of two of the inner electrode layers interleaving the negative electrode side absorbing portion which is connected to the negative side of the side electrodes is defined as a reference electrode layer, the recessed distance of the inner electrode-unformed area of each of the inner electrode layers which is located next to the reference electrode layer, interleaves the reference electrode layer between itself and the negative electrode side absorbing portion in the laminating direction, and is connected to a positive side of the side electrodes is greater than the depths of the negative electrode side absorbing portions, and if, in the cross section of the stacked piezoelectric device in the laminating direction, the stress absorbing portions connected to a positive side of the side electrodes are defined as positive electrode side absorbing portions, of two of the inner electrode layers which are located next to and interleave the positive electrode side absorbing portion therebetween, the recessed distance of the inner electrode-unformed area of one connected to the negative side of the side electrodes is greater than the depths of the positive electrode side absorbing portions (claim 7).

In the stacked piezoelectric device of the second invention, in the cross section of the stacked piezoelectric device in the laminating direction, the recessed distance of the inner electrode-unformed area of each of the inner electrode layers which is located next to the reference electrode layer, interleaves the reference electrode layer between itself and the negative electrode side absorbing portion in the laminating direction, and is connected to a positive side of the side electrodes is greater than the depths of the negative electrode side absorbing portions. Further, of two of the inner electrode layers which are located next to and interleave the positive electrode side absorbing portion therebetween, the recessed distance of the inner electrode-unformed area of one connected to the negative side of the side electrodes is greater than the depths of the positive electrode side absorbing portions.

The piezoelectric ceramic layers between the reference electrode layer and the inner electrode layer which interleaves the reference electrode layer between itself and the negative electrode side absorbing portion and is connected to the positive side of the side electrodes are the above described piezoelectric ceramic layers which drop in insulation resistance earliest, that is, the piezoelectric ceramic layers interleaved between the negative electrode layer next to the stress absorbing portion and the positive electrode layers next to the negative electrode layer.

In the above second invention, there is no portion which most accelerates the drop in insulation resistance, that is, a portion where the stress absorbing portion to which a great voltage is to be applied overlaps the above described piezoelectric layer driving area end in the laminating direction. This enables the piezoelectric ceramic layer including the stress absorbing portion to be used as a drive source and also reduces the electric field to be applied to the portion susceptible to the drop in insulation resistance, thus avoiding the drop in insulation resistance and providing the stacked piezoelectric device which is excellent in durability.

The third invention is in a stacked piezoelectric device including a ceramic laminate formed by laminating a plurality of piezoelectric ceramic layers and a plurality of inner electrode layers alternately and a pair of side electrodes formed on side surfaces extending in a direction perpendicular to a laminating direction of the ceramic laminate, characterized in that said inner electrode layers have a conductive inner electrode-formed area and an inner electrode-unformed area where an outer peripheral edge of said inner electrode-formed area is recessed inwardly from an outer peripheral surface of said ceramic laminate by a given recessed distance and are each connected electrically to one of said side electrodes alternately at the inner electrode-formed areas, said ceramic laminate has slit-like stress absorbing portions recessed inwardly from the side surfaces thereof to have given depths, if two of the inner electrode layers interleaving said stress absorbing portion therebetween are defined as adjacent electrode layers, in a cross section of the stacked piezoelectric device, as taken in the laminating direction, separation portions are provided which are each defined by an interval in a direction perpendicular to the laminating direction between said outer peripheral edge of the inner electrode-formed area of the adjacent layer and a top end of the stress absorbing portion located on the same side surface as the inner electrode-unformed portion of said adjacent layer (claim 12).

In the stacked piezoelectric device of the third invention, the separation portions are provided which are each defined by the interval in the direction perpendicular to the laminating direction between said outer peripheral edge of the inner electrode-formed area of the adjacent layer and the top end of the stress absorbing portion located on the same side surface as the inner electrode-unformed portion of said adjacent layer.

Therefore, the piezoelectric ceramic layer including the stress absorbing portion is used as a drive source, but application of an excessive electric field to the stress absorbing portions is controlled or avoided. It is, therefore, possible to avoid the drop in insulation resistance without almost sacrificing the amount of displacement.

BRIEF DESCRIPTION OF THE DRAWINGS

FIG. 47($b$) is an E-E sectional view in FIG. 46 which shows neighbors of stress absorbing portions; and FIG. 47($c$) is an F-F sectional view in FIG. 46 which shows neighbors of stress absorbing portions.

| DESCRIPTION OF REFERENCE NUMBERS | |
|---|---|
| 1 | stacked piezoelectric device |
| 10 | piezoelectric ceramic layer |
| 11 | stress absorbing portion |
| 12 | stress absorbing portion |
| 13 | inner electrode layer |
| 131 | inner electrode portion |
| 132 | recessed portion |
| 14 | inner electrode layer |
| 141 | inner electrode portion |
| 142 | recessed portion |

-continued

DESCRIPTION OF
REFERENCE NUMBERS

| 15 | ceramic laminate |
| 17 | side electrode |
| 18 | side electrode |

BEST MODES OF THE INVENTION

Next, preferred embodiments of the invention will be described.

In this specification, the above described inner electrode-formed area will also be referred to as an inner electrode portion. An inner electrode-unformed area where an outer peripheral edge of the inner electrode-formed area is retreated inwardly from an outer peripheral surface of the ceramic laminate by a given retreated distance will also be referred to as a recessed portion recessed inwardly from the outer peripheral surface of the ceramic laminate by a given recessed distance.

The inner electrode-unformed area (i.e., the receded portion) is an area which lies substantially flush with the inner electrode-formed area (i.e., an inner electrode portion) and in which no inner electrode is formed. Specifically, the inner electrode-unformed area (i.e., the recessed portion) is formed by a piezoelectric ceramic lying flush with the inner electrode-formed portion.

The retreated distance (i.e., the recessed distance) is a minimum distance across the inner electrode-unformed area between the end of the inner electrode-formed area and the side surface of the ceramic laminate.

The stacked piezoelectric device of the invention is equipped with the ceramic laminate and a pair of side electrodes formed on the side surfaces of the ceramic laminate.

The inner electrode layers have the conductive inner electrode portion and the recessed portion defined by recessing the outer peripheral end of the inner electrode portion inwardly from the outer peripheral surface of the ceramic laminate by the given recessed distance. The formation of the recessed portion realizes complete insulation of the inner electrode layer at one of the side surfaces of the ceramic laminate (i.e., the side surface of the recessed portion).

The ceramic laminate is made by stacking the piezoelectric ceramic layers and the inner electric layers alternately. The ceramic laminate has the slit-like stress absorbing portions recessed inwardly from the side surfaces of the ceramic laminate by a given depth. Specifically, the stress absorbing portions are defined by slit-like grooves.

Figure 29:
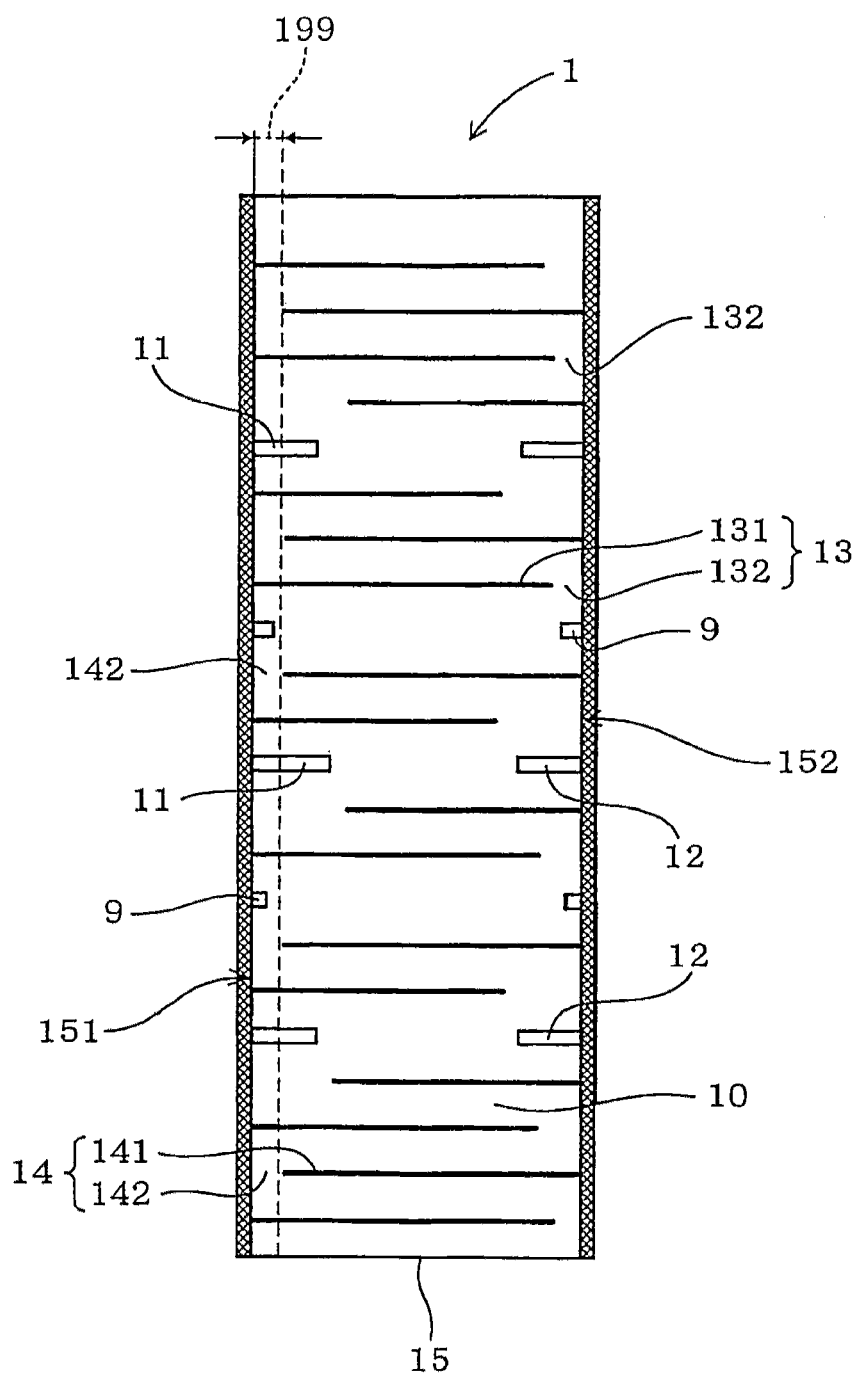
FIG. 29 is an explanatory view which shows a sectional structure of a stacked piezoelectric device in which a slit-like groove other than a stress absorbing portion.

In this invention, the stress absorbing portions 11 and 12 are what are formed to have a depth greater than a minimum value 199 of the recessed distance of the recessed portions 132 and 142 of the inner electrode layers 13 and 14 in a sectional area of the stacked piezoelectric device 1 in a laminating direction (see FIG. 29). Therefore, slit-like grooves 9 which are formed to have a depth smaller than the minimum value 199 of the recessed distance do not correspond to the stress absorbing portions of the invention (see FIG. 29).

The stress absorbing portions are portions of the ceramic laminate where crystalline particles making up the piezoelectric ceramic are separated in the laminating direction and which are easier to deform in shape than the piezoelectric ceramic layers.

The stress absorbing portions are arrayed at a constant interval in the laminating direction of the ceramic laminate and work to absorb the stress accumulated in the laminating direction of the ceramic laminate. When the stacked number is small, the absolute value of the accumulated stress, as appearing upon application of voltage, so that cracks do not almost occur. It is, therefore, almost unnecessary to form the slits in the ceramic laminate. An decrease in electrode area arising from the formation of the recessed portions may result in a drop in deformation ability. For these reasons, it is advisable that the ceramic laminate have the ten or more inner electrode layers. For the same reasons, the interval between the stress absorbing portions in the laminating direction is preferably greater than the ten or more inner electrode layers. When the interval between the stress absorbing portions is less than the ten inner electrode layers, the drop in electrode area arising from the formation of the recessed portions may result in a decrease in the deformation ability. Further, the interval between the stress absorbing portions in the laminating direction is preferably less than or equal to the fifty inner electrode layers. When the stress absorbing portions are formed at an interval greater than the fifty inner electrode layers, it may result in lack in effect of absorbing the stress through the stress absorbing portions.

When seen therethrough in the laminating direction, it is preferable that the ceramic laminate has overlapping portions that are areas where all the inner electrode portions overlap each other and non-overlapping portions that are areas where the inner electrode portions at least partially overlap each other or do not overlap at all and that the stress absorbing portions are formed in the non-overlapping portions.

In this case, the stress absorbing portions work to produce beneficial effects of the stress absorption.

Specifically, the non-overlapping portions are portions which do not produce a piezoelectric stroke and is not driven. Therefore, the stress (distortion) occurs locally at the non-overlapping portions as a result of the piezoelectric stroke. As described above, such stress may be reduced by forming the stress absorbing portions in the non-overlapping portions.

Next, the recessed distance of the recessed portions of the inner electrode layers and the depth of the stress absorbing portions will be described below.

Figure 2:
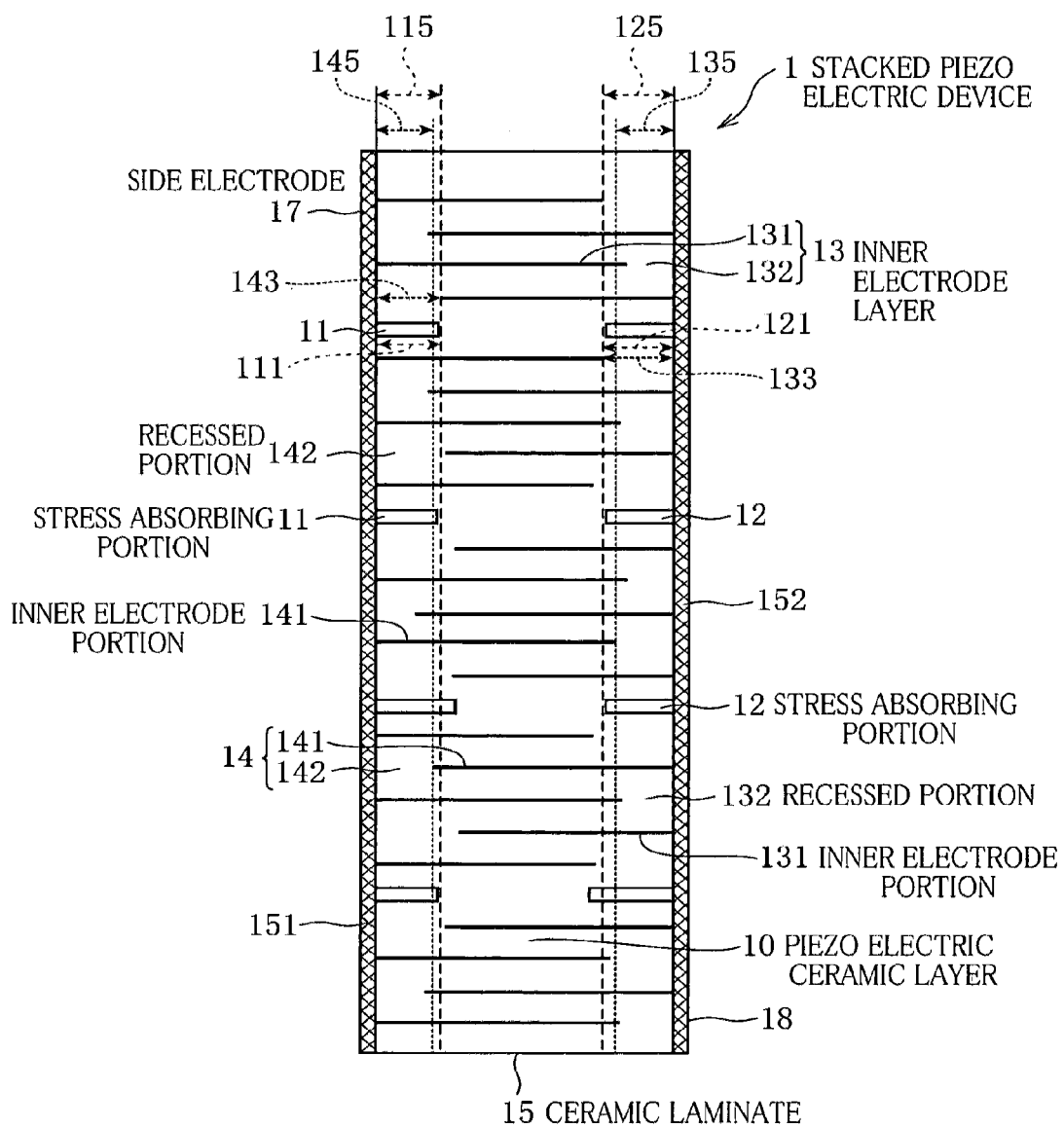
FIG. 2 is a cross sectional view of a stacked piezoelectric device according to the embodiment 1.
Figure 19:
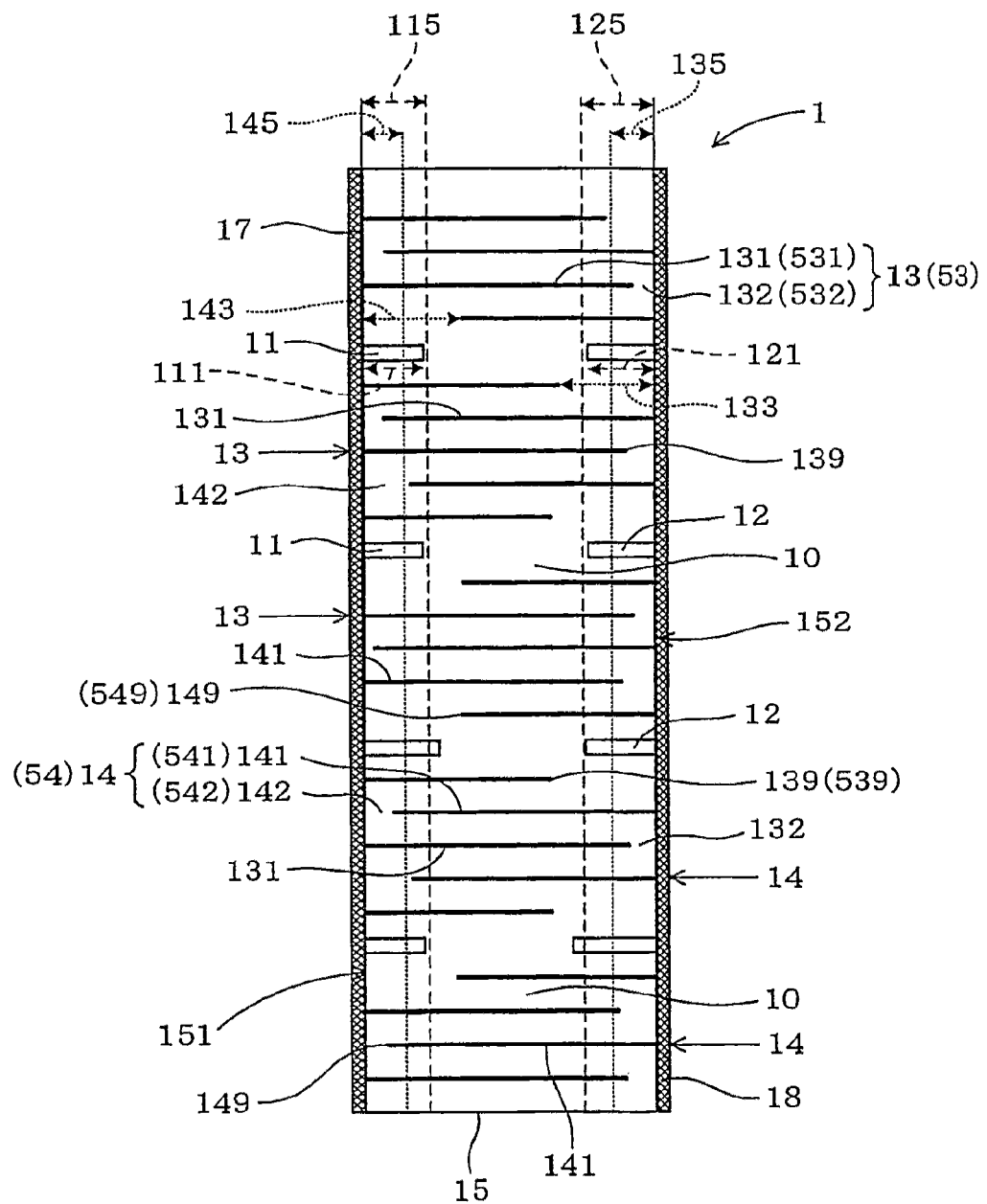
FIG. 19 is an explanatory view which shows a sectional structure of a stacked piezoelectric device according to the embodiment 2.

FIGS. 2 and 19 illustrate sectional views of the stacked piezoelectric device 1. FIGS. 2 and 19 and other sectional views of the stacked piezoelectric device (FIGS. 3, 11, 14-17, 20, 28, 19, 30, and 31) illustrate sectional areas of the ceramic laminate and the pair of side electrodes located across the ceramic laminate, as taken in the laminating direction, that is, cross-sections of the side surfaces on which the side electrodes are formed.

As illustrated in FIGS. 2 and 19, the ceramic laminate 15 of the stacked piezoelectric device 1 is made by stacking the piezoelectric ceramic layers 10 and the inner electrode layers 13 and 14 alternately. The inner electrode layers 13 and 14 have the Conductive inner electrode portions 131 and 141 and the recessed portions 132 and 142 defined by retreating the outer peripheral ends 139 and 149 of the inner electrode portions 131 and 141 inwardly from the outer peripheral surface of the ceramic laminate 15 by the recessed distance.

The recessed distance of the recessed portions 132 and 142 is the distance of the recessed portions in a direction perpendicular to the laminating direction and may be expressed by a minimum distance between the outer peripheral ends 139 and 149 of the inner electrode portions 131 and 141 and the side surfaces 152 and 151 of the ceramic laminate 15 in the sectional area of the ceramic laminate 15.

Figure 30:
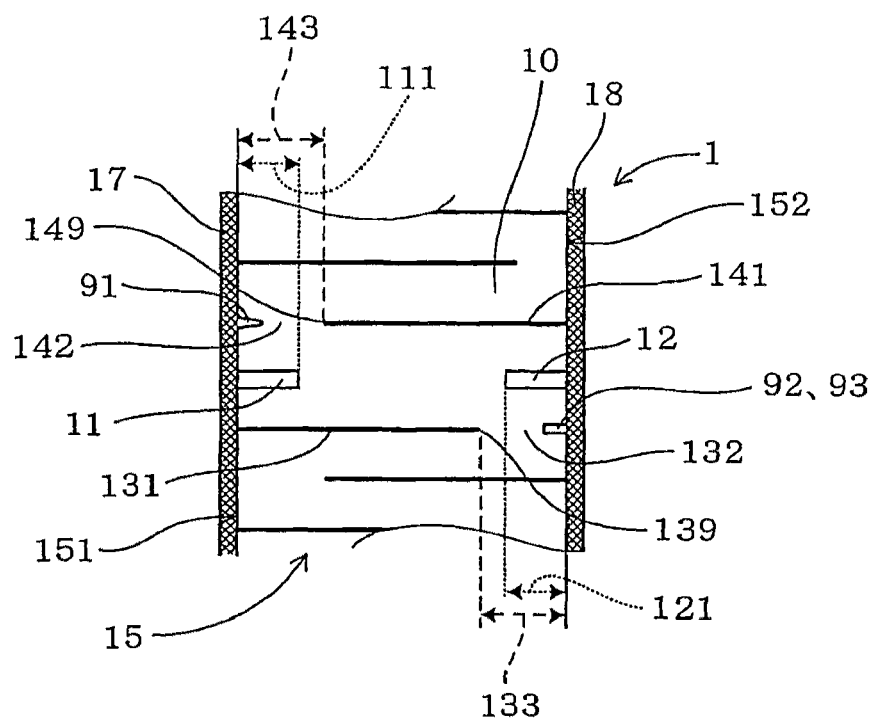
FIG. 30 is an explanatory view which shows a sectional structure near a stress absorbing portion of a piezoelectric device in which undulations, grooves, and recesses are formed.

As illustrated in FIG. 30, in the stacked piezoelectric device 1, the outer periphery of the ceramic laminate 15 may sag partially inwardly to form an undulation 91, a groove 92, and a recess 93. The undulation 91, the groove 92, and the recess 93 are formed in the recessed portions 132 and 142, the recessed distances 133 and 143 of the recessed portions 132 and 142, in other words, the recessed distances 133 and 143 of the recessed portions 132 and 142 recessed inwardly from the outer peripheral surface 151 and 152 of the ceramic laminate 15 by a given distance are distances 143 and 133 of perpendiculars extending from the outer peripheral ends 139 and 149 of the inner electrode portions 131 and 141 to the outer peripheral surface 152 and 151 of the ceramic laminate 15 where the undulation 91, the groove 92, and the recess 93 are not formed in the cross section of the stacked piezoelectric device 1, as taken in the laminating direction, that is, the distances including the depths of the undulation 91, the groove 92, and the recess 93.

As illustrated in FIGS. 2, 3, 19, and 20, the ceramic laminate 15 has the slit-like stress absorbing portions 11 and 13 which are recessed inwardly from the side surfaces 151 and 152 to have a given depth.

Figure 3:
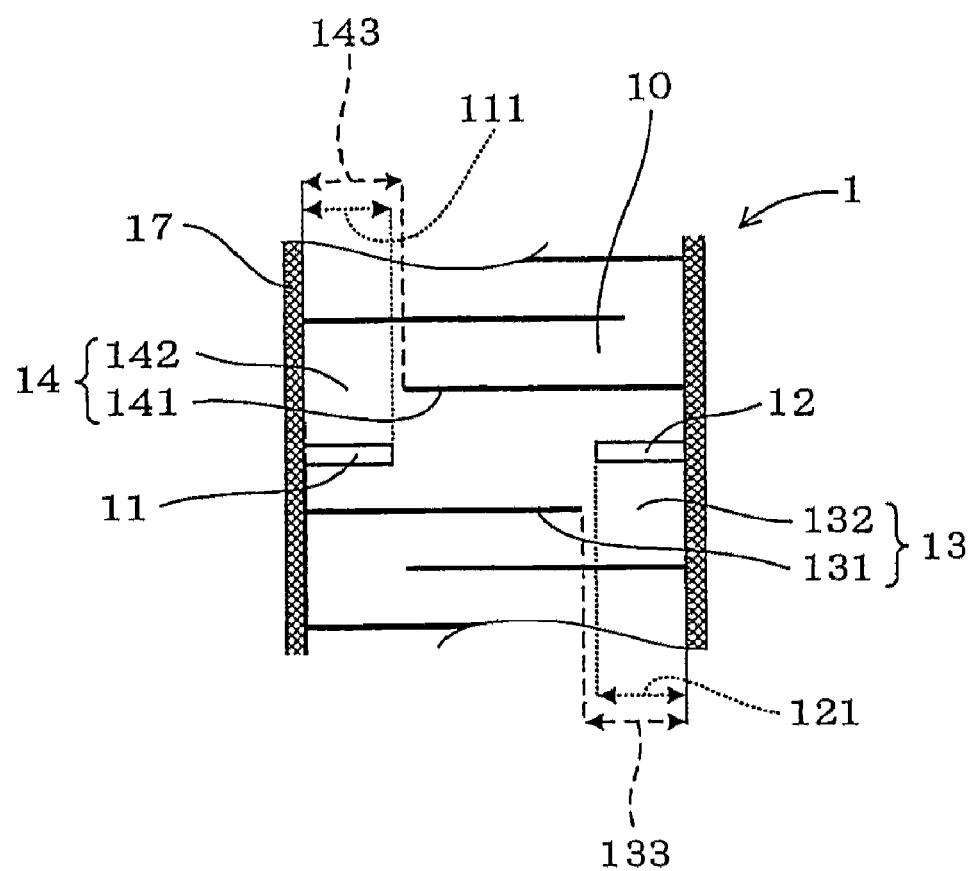
FIG. 3 is an explanatory view which shows a sectional structure of a slit portion of a stacked piezoelectric device according to the embodiment 1.
Figure 20:
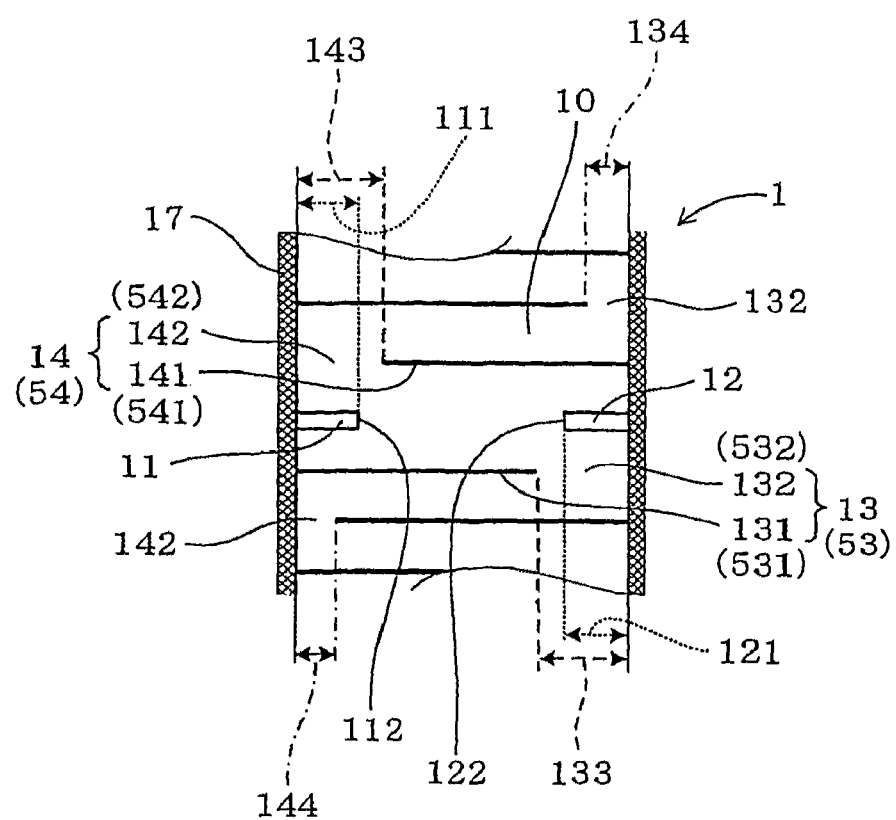
FIG. 20 is an explanatory view which shows a sectional structure near a stress absorbing portion of a stacked piezoelectric device according to the embodiment 2.

As illustrated in FIGS. 3 and 20, the depths of the stress absorbing portions 11 and 12 are the distances 111 and 121 of the stress absorbing portions in a direction perpendicular to the laminating direction which are minimum distances between the side surfaces 151 and 152 of the ceramic laminate 15 and the top ends 112 and 122 of the stress absorbing portions 11 and 12 in the cross section of the ceramic laminate 15.

The inner electrode portions 131 and 141 are generally shaped to have the same size, but may vary in size. This may cause the recessed distances 133 and 143 of the recessed portions 132 and 142 and the depth of the stress absorbing portions 11 and 12 to vary.

As illustrated in FIGS. 2 and 19, an averaged value 115 (125) of the depths of all the stress absorbing portions 11 (12) exposed to the same side surface 151 (152) of the ceramic laminate 15 in the cross section of the stacked piezoelectric device 1, as taken in the laminating direction are preferably greater than an averaged value 145 (135) of the recessed distances of all the recessed portions 142 (132) located on the same side as the stress absorbing portions 11 (12) (claims 3, 9, and 14), In this case, compressive load is exerted on the stress absorbing portions, thereby avoiding the occurrence of cracks. The stacked piezoelectric device exhibits excellent durability. Additionally, the recessed portions in the inner electrode layers may be made small to increase the area of the inner electrode portions. This improves the amount of stroke of the stacked piezoelectric device.

The areas where the inner electrode portions are formed may be increased relatively to decrease a drop in stroke of the stacked piezoelectric device.

The averaged value 115 (125) of the depths of the stress absorbing portions 11 (12) and the averaged value 145 (135) of the recessed distances 143 (133) are averaged values of the depths 111 (121) of all the stress absorbing portions and all the recessed distances 143 (133) located at the side surfaces 151 (152).

When the averaged value of the depths of the stress absorbing portions is smaller than or equal to the averaged value of the recessed distances, it will cause tensile stress to act on the top ends of the stress absorbing portions in the laminating direction, thereby resulting in cracks. This may also result in a decrease in the stroke.

In the first invention, as viewed in the cross section of the stacked piezoelectric device 1, as taken in the laminating direction in FIGS. 2, 3, 19, and 20, of the recessed portions 132 (532) and 142 is (542) of two of the inner electrode layers 13 (53) and 14 (54) located across the stress absorbing portions 11 and 12, the recessed distances 143 and 133 of ones located at the same side as the two of the inner electrode layers 13 (53) and 14 (54) are greater than the depths 111 and 132 of the stress absorbing portions 11 and 12.

When the recessed distances of the recessed portions at above specified location is lower than or equal to the depths of the above specified stress absorbing portions, the top ends of eth above stress absorbing portions are exposed to an excessive electric field, so that the stress absorbing portions are discharged, thus resulting in a decrease in insulation resistance.

As illustrated in FIGS. 2 and 19, as viewed in the cross section of the stacked piezoelectric device 1 in the laminating direction, the averaged values 135 and 145 of the recessed distances of the recessed portions 132 and 142 of the above inner electrode layers 13 and 14 are preferably smaller than the minimum depths of the stress absorbing portions 12 and 11 formed on the same sides as the recessed portions 132 and 142, respectively.

As viewed in the cross section of the stacked piezoelectric device 1 in the laminating direction, maximum values of the recessed distances of the recessed portions 132 and 142 of the inner electrode layers 13 and 14 except two of them which are located next to and across the above described stress absorbing portion are preferably smaller than the averaged values of the depths of the stress absorbing portions 12 and 11 formed on the same sides as the recessed portions 132 and 142, respectively.

As viewed in the cross section of the stacked piezoelectric device 1 in the laminating direction, the maximum values of the recessed distances of the recessed portions 132 and 142 of the inner electrode layers 13 and 14 except two of them which are located next to and across the above described stress absorbing portion are preferably smaller than the minimum depths of the stress absorbing portions 12 and 11 formed on the same sides as the recessed portions 132 and 142, respectively.

As viewed in the cross section of the stacked piezoelectric device 1 in the laminating direction, the maximum values of the recessed distances of the recessed portions 132 and 142 of the inner electrode layers 13 and 14 except two of them which are located next to and across the above described stress absorbing portion are preferably smaller than the minimum depths of the stress absorbing portions 12 and 11 formed on the same sides as the recessed portions 132 and 142 by 0.05 mm or more, respectively.

As viewed in the cross section of the stacked piezoelectric device 1, as taken in the laminating direction in FIGS. 19 and 20, the recessed distance 134 or 144 of the recessed portion 132 or 142 of at least one of the inner electrode layers 13 and 14 placed between two of the stress absorbing portions 11 and 12 and other two of the stress absorbing portions 11 and 12 lying closest to each other in the laminating direction except two of the inner electrode layers 53 and 54 interleaving the stress absorbing portions 11 and 12 therebetween is preferably smaller than the depth of the above described stress absorbing portions 11 and 12 (claim 2).

In other words, in at least one of the inner electrode layers 13 and 14 sandwiched between the stress absorbing portions 11 and 12 and the other stress absorbing portions 11 and 12 which are located closest to each other except the inner electrode layers 53 and 54 located across the stress absorbing portions 11 and 12, the recessed distance 134 or 144 of the recessed portion 132 or 142 is preferably smaller than the depths 121 and 111 of the stress absorbing portions 11 and 12.

In this case, the above recessed portion of the above inner electrode layer except the above inner electrode layers located across the above stress absorbing portions is made smaller. This results in an increased area of the above inner electrode portions, thus improving the amount of stroke of the stacked piezoelectric device.

Figure 14:
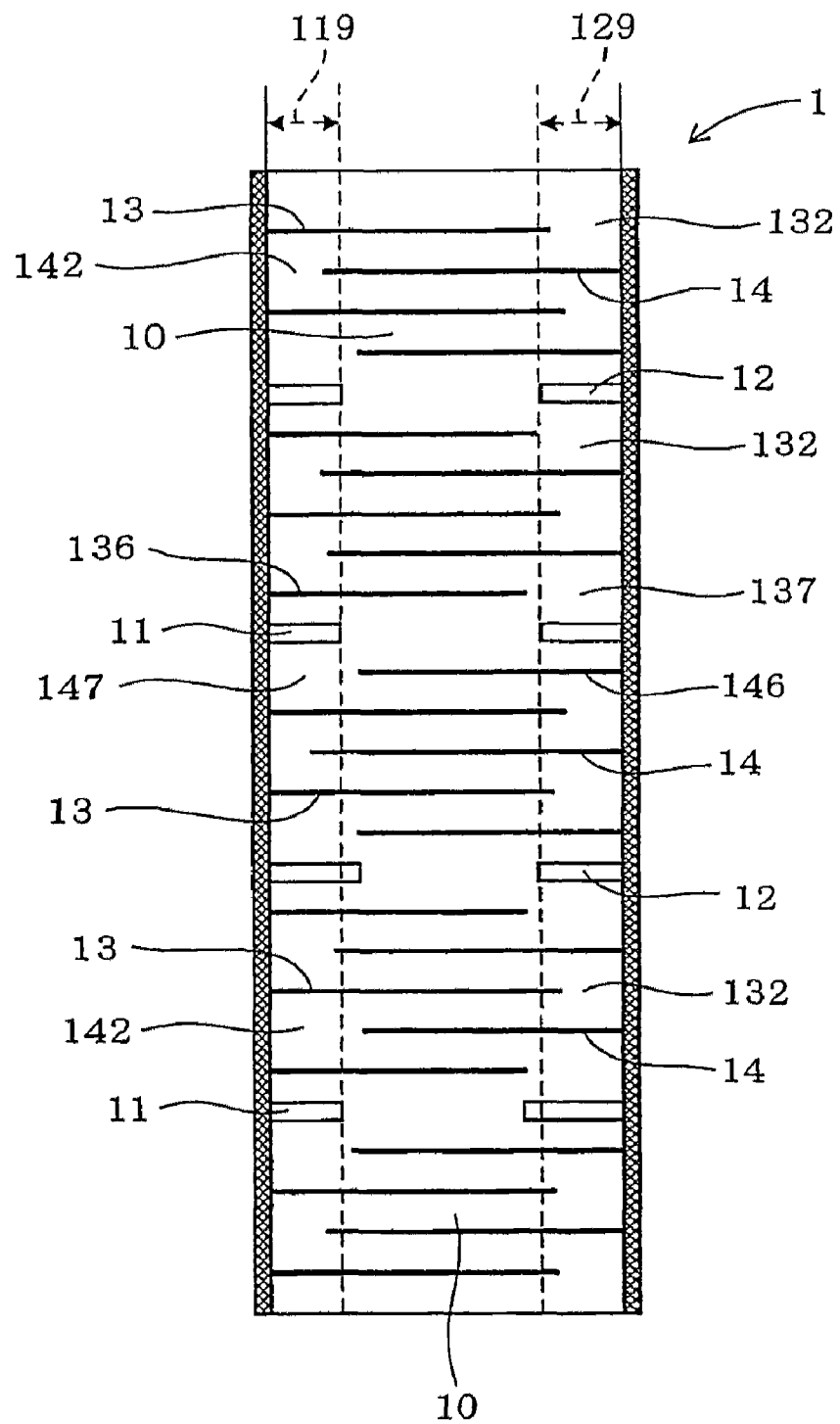
FIG. 14 is an explanatory view which shows a sectional structure of a stacked piezoelectric device designed to have a recessed distance smaller than a minimum depth of a stress absorbing portion.

As viewed in the cross section of the stacked piezoelectric device 1 in the laminating direction in FIG. 14, the recessed distances of the recessed portions 132 and 142 of all the inner electrode layers 13 and 14 except one of two of the inner electrode layers 146 and 136 interleaving the stress absorbing portion 11 (12) therebetween which has the recessed portion 147 or 137 on the same side surface as the stress absorbing portion 11 (12) are preferably smaller than the minimum depths 129 and 119 of the stress absorbing portions 12 and 11 formed on the same side surfaces as the above recessed portions 132 and 142 (claim 4). In other words, as viewed in the cross section of the stacked piezoelectric device 1 in the laminating direction, the recessed distances of the recessed portion 132 and 142 of all the inner electrode layers 13 and 14 except two of the inner electrode layers 136 and 146 interleaving the stress absorbing portions 11 (12) therebetween are preferably smaller than the minimum depths 129 and 119 of the stress absorbing portions 12 and 11 formed on the same side surfaces as the recessed portions 132 and 142, respectively.

In this case, the drop in insulation resistance is avoided more securely.

As viewed in the cross section of the stacked piezoelectric device 1 in the laminating direction in FIGS. 19 and 20, the recessed distances 143 and 133 of the recessed portions 542 and 532 of two of the inner electrode layers 53 and 54 interleaving the stress absorbing portions 11 and 12 therebetween in the laminating direction are preferably greater than the depths of the stress absorbing portions 11 and 12 respectively located on the same side surfaces as the above stress absorbing portions 11 and 12 by 0.04 mm or more (claim 5).

In this case, the drop in insulation resistance is avoided more securely.

When the above recessed distance minus the depth of the above stress absorbing portion is less than 0.04 mm, the insulation resistance may be decreased by, for example, exertion of impact on the stacked piezoelectric device or application of an excessive voltage thereto.

As viewed in the cross section of the stacked piezoelectric device 1 in the laminating direction in FIGS. 19 and 20, the recessed distances 143 and 133 of the recessed portions 542 and 532 of two of the inner electrode layers 53 and 54 interleaving the stress absorbing portions 11 and 12 therebetween are preferably greater than the depths of the stress absorbing portions 11 and 12 respectively located on the same side surfaces as the above recessed portions 542 and 532 by 0.2 mm or more on an average (claim 6).

In this case, the drop in insulation resistance is avoided more securely.

When the above recessed distances minus the depths of the above stress absorbing portion are less than 0.2 mm on average, the insulation resistance may be decreased by, for example, exertion of impact on the stacked piezoelectric device or application of an excessive voltage thereto.

Figure 15:
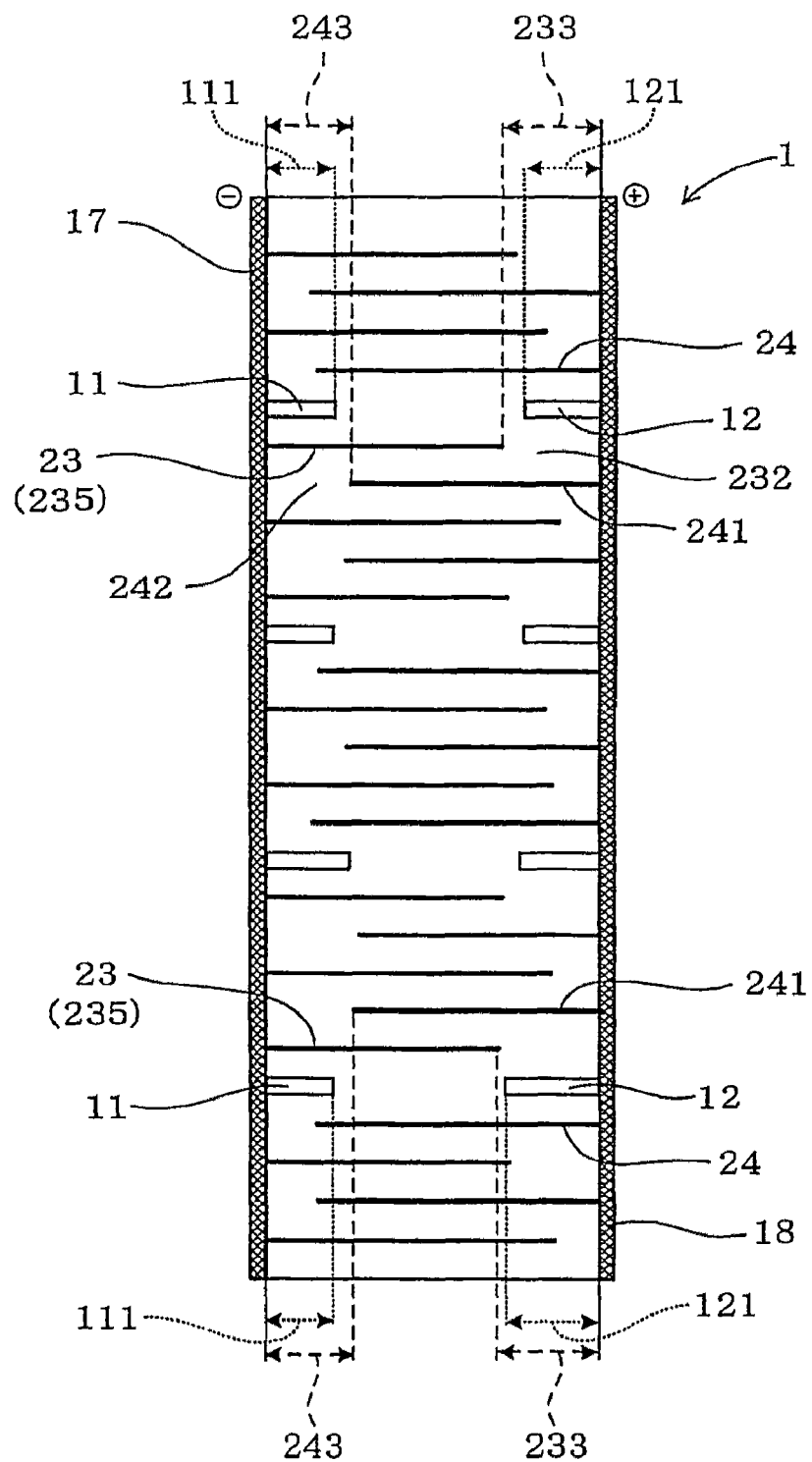
FIG. 15 is an explanatory view which shows a sectional structure of a pattern of a stacked piezoelectric device according to the embodiment 2.

In the second invention, if, as viewed in the cross section of the stacked piezoelectric device 1 in the laminating direction in FIG. 15, the stress absorbing portions formed on the side of the negative side electrode 17 are referred to as negative electrode side absorbing portions 11, and one of adjacent two of the inner electrode layers 23 and 24 interleaving each of the negative electrode side absorbing portion 11 which is connected electrically to the negative side electrode 17 is referred to as a reference electrode layer 235, the recessed distance of the recessed portion 242 of each of the inner electrode layers 241 which is located next to the reference electrode layer 235 and interleaves the reference electrode layer 235 between itself and the negative side absorbing portion 11 in the laminating direction and which is connected to the positive side electrode 18 is greater than the depths of the negative electrode side absorbing portions 11. In other words, the recessed distance 243 of the recessed portion 242 of the inner electrode layer which has the inner electrode portion 241 and is located closest to each of the reference electrode layers 235, that is, the recessed distance 243 of the recessed portion 242 of each of the inner electrode layers 241 which is one of the two inner electrode layers which are located adjacent and interleave the reference electrode layer 235 therebetween, and are connected to the positive side electrode 18, and which lies opposite the negative side stress absorbing portion 11 across the reference electrode layer 235 is greater than the depth 111 of the negative side absorbing portion 11 next to the reference electrode layer 235.

When the recessed distance of each of the above specified recessed portions is smaller than the depth of the above negative side absorbing portion, it may cause a portion whose insulation resistance is easy to drop to be exposed to the electric field, so that the insulation resistance drops.

Additionally, if as viewed in the cross section of the stacked piezoelectric device 1, as taken in the laminating direction in FIG. 15, the stress absorbing portions formed on the side of the positive side electrodes 18 are referred to as positive electrode side absorbing portions 12, of two of the inner electrode layers 23 and 24 which are located adjacent each other and interleave one of the positive electrode side absorbing portions 12 therebetween, the recessed distance 233 of the recessed portion 232 of one which is connected to the negative side electrode 17 is greater than the depth 121 of the positive electrode side absorbing portions 12. In other words, the recessed distance 233 of the recessed portion 232 of one of the inner electrode layers 23 and 24 located adjacent each other across one of the positive electrode side absorbing portions 12 which is connected to the negative side electrode 17 is greater than the depth 121 of the is positive electrode side absorbing portions 12 located adjacent the inner electrode layer 23.

When the recessed distance of each of the above specified recessed portions is smaller than the depth of the above positive side absorbing portion, it may cause a portion whose insulation resistance is easy to drop to be exposed to the electric field, so that the insulation resistance drops.

Figure 16:
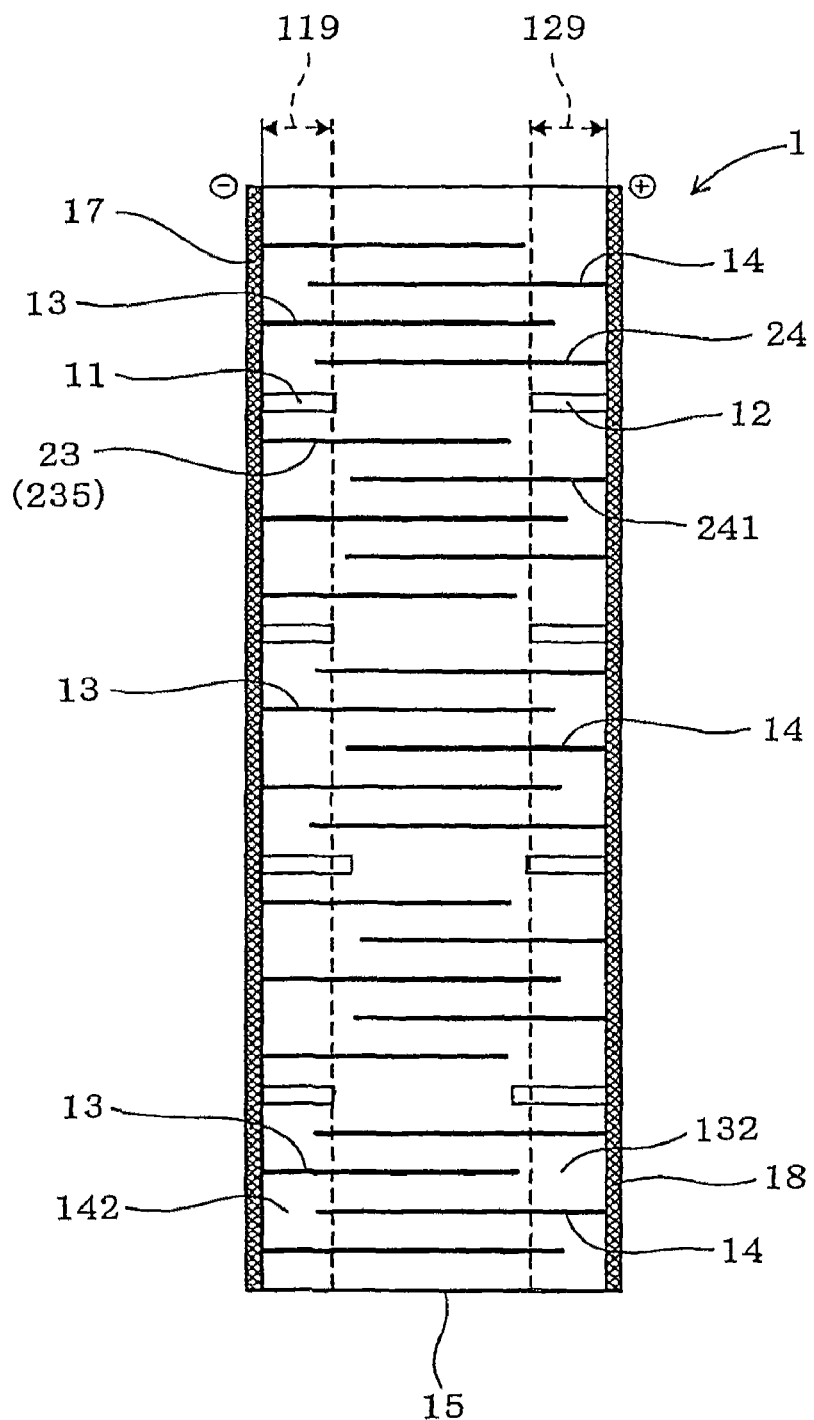
FIG. 16 is an explanatory view which shows a sectional structure of a stacked piezoelectric device designed to have a recessed distance smaller than a minimum depth of a stress absorbing portion.
Figure 17:
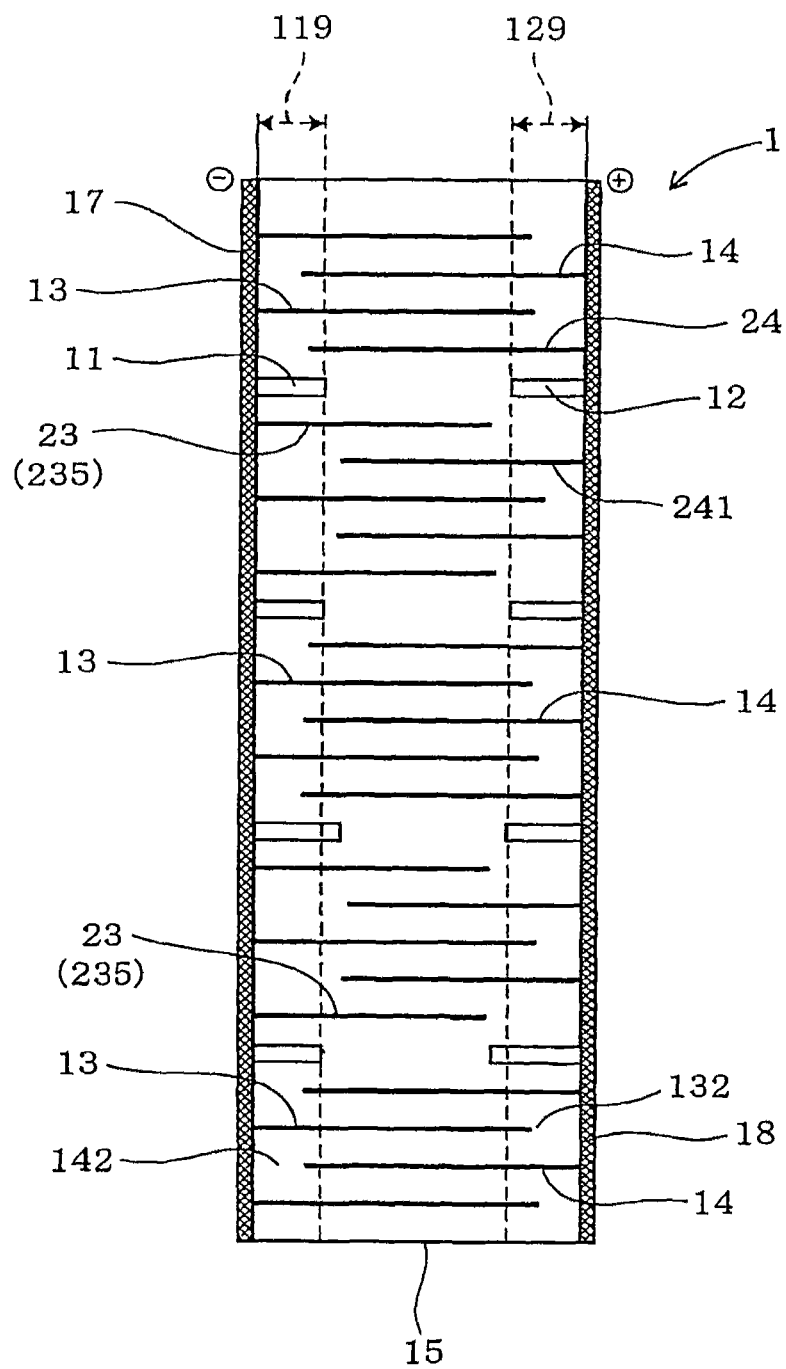
FIG. 17 is an explanatory view which shows a sectional structure of a stacked piezoelectric device designed to have a recessed distance smaller than a minimum depth of a stress absorbing portion.

As viewed in the cross section of the stacked piezoelectric device 1, as taken in the laminating direction in FIGS. 16 and 17, the recessed distances of the recessed portion 132 and 142 of all the inner electrode layers 13 and 14 except each of the inner electrode layers 241 which is situated next to the stress absorbing portion 11 and interleaves the reference electrode layer 235 between itself and the stress absorbing portion 11 and connected to the positive side electrode 18 and one (i.e., the inner electrode layer 23) of two of the inner electrode layers 23 and 24 located across each of the positive electrode side absorbing portions 12 which is connected electrically to the side electrode 17 are preferably smaller than the minimum depths 129 and 119 of the stress absorbing portions 12 and 11 formed on the same side surfaces as the recessed portions 132 and 142, respectively (claim 8). In other words, the recessed distances of the recessed portion 132 and 142 of all the inner electrode layers 13 and 14 except the inner electrode layers 241 having the inner electrode portion which is formed closest to the reference electrode layer 235 and connected electrically to the positive side electrode 18 and of two of the inner electrode layers 23 and 24 located next to and interleaving the positive electrode side absorbing portion 12 therebetween, one which is connected to the negative side electrode 17 are preferably smaller than the minimum depths 129 and 119 of the stress absorbing portions 12 and 11 formed on the same side surfaces as the recessed portions 132 and 142, respectively.

In this case, the drop in insulation resistance is avoided more securely. FIGS. 16 and 17 illustrate the stacked piezoelectric devices 1 of the same structure except for different recessed distances of the recessed portions 132 and 142 of the inner electrode layers 13 and 14.

In the above second invention, as viewed in the cross section of the stacked piezoelectric device 1 in the laminating direction, two of the inner electrode layers which are located next to and interleave the positive side absorbing portion therebetween, the recessed distance of the recessed portion of one which is connected electrically to the negative side electrode is preferably greater than or equal to the depth of the positive electrode side absorbing portions by 0.04 mm or more (claim 10).

Additionally, as viewed in the cross section of the stacked piezoelectric device 1 in the laminating direction, an averaged value of the recessed distances of the recessed portions of the inner electrode layers each of which is one of two of the inner electrode layers, as placed next to and interleaving the positive electrode side absorbing portion, which is connected electrically to the negative side electrode is preferably greater than an averaged value of the depths of the positive electrode side absorbing portions by 0.2 mm or more (claim 11).

In this case, the drop in insulation resistance is further avoided more securely.

When the above recessed distance minus the depth of the above positive side absorbing portion is less than 0.04 mm, and the averaged value of the recessed distances minus the averaged value of the depths of the positive electrode side absorbing portions is less than 0.2 mm, the insulation resistance may be decreased by, for example, exertion of impact on the stacked piezoelectric device or application of an excessive voltage thereto.

Figure 31:
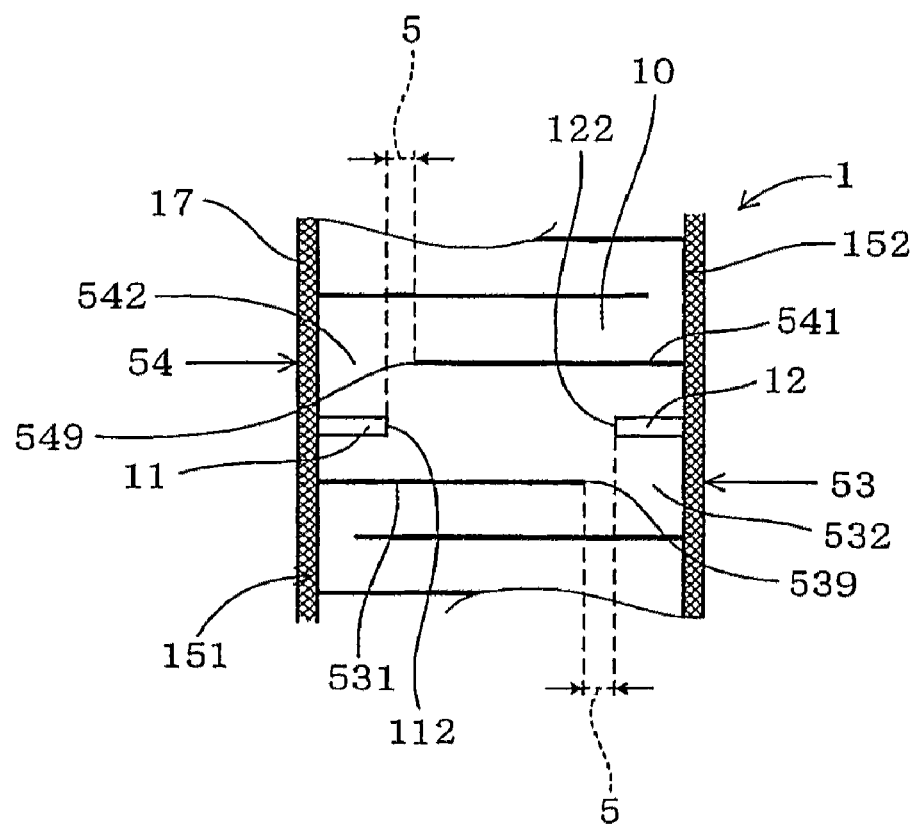
FIG. 31 is an explanatory view which shows a sectional structure near a stress absorbing portion of a stacked piezoelectric device according to the embodiment 2.

In the third invention, if any two of the inner electrode layers located across the stress absorbing portions 11 and 12, as illustrated in FIG. 31, are referred to as adjacent electrode layers 53 and 54, as viewed in the cross section of the stacked piezoelectric device 1 in the laminating direction, separate portions 5 are defined by an interval in a direction perpendicular to the laminating direction of the stacked piezoelectric device 1 between the outer peripheral ends 539 and 549 of the inner electrode portions 531 and 541 of the adjacent electrode layers 53 and 54 and the top ends 122 and 112 of the stress absorbing portions 12 and 11 located on the same side surfaces as the recessed portions 532 and 542 of the adjacent electrode layers 53 and 54, respectively.

Specifically, as viewed in the cross section of the stacked piezoelectric device 1 in the laminating direction, the outer peripheral end 539 of the inner electrode portion 531 of the adjacent electrode layer 53 is separate in a direction perpendicular to the laminating direction of the stacked piezoelectric device 1 from the top end 122 of the stress absorbing portion 12 located on the same side surface 152 as the recessed portion 532 of the adjacent electrode layer 53 to define one of the separate portions 5. Similarly, the outer peripheral end 549 of the inner electrode portion 541 of the adjacent electrode layer 54 is separate in the direction perpendicular to the laminating direction of the stacked piezoelectric device 1 from the top end 112 of the stress absorbing portion 11 located on the same side surface 151 as the recessed portion 542 of the adjacent electrode layer 54 to define another of the separate portions 5.

When the above separate portions do not exist, it will cause an excessive electric filed to be applied to the stress absorbing portions, so that electric discharge occurs on the stress absorbing portions, thus resulting in a decrease in the insulation resistance.

As viewed in the cross section of the stacked piezoelectric device 1 in the laminating direction, except the above adjacent electrode layers, the recessed distance of at least one of the inner electrode layers sandwiched between one of the stress absorbing portions and another of the stress absorbing portions which is formed closes to the one of the stress absorbing portions in the laminating direction is preferably smaller than the depths of the above stress absorbing portions (claim 13).

In this case, the above recessed portions of the above inner electrode layers except two of them which are located across the above stress absorbing portion are made small. This results in an increased area of the above inner electrode portions to improve the amount of stroke of the stacked piezoelectric device.

The separation distance of the separate portions is preferably greater than or equal to 0.04 mm (claim 15).

In the stacked piezoelectric device, the averaged value of the separation distances of all the separate portions is preferably greater than or equal to 0.2 mm (claim 16).

In these cases, like in the first invention, the drop in insulation resistance is avoided more securely.

When the above separation distances are 0.04 mm or less or the averaged value of the separation distances is less than 0.2 mm, it will cause the insulation resistance to drop when the impact is exerted on the stacked piezoelectric device or an excessive voltage is applied thereto.

Specifically, in the above described first to third invention, the stress absorbing portions are, for example, slit-like chambers (grooves) and may be of a structure wherein the slit-like chamber is filed with resin material which is lower in Young's modulus than the piezoelectric ceramic layer, slit-like fragile layers formed by making the same material as the piezoelectric ceramic layer to be porous, slit-like fragile layers made by material such as titanate different from that of the piezoelectric ceramic layer, or crack-like slits made intentionally by the polarization or actuation. Such stress absorbing portions are easier to deform in shape than the piezoelectric ceramic Layer, thus absorbing the stress concentrated in the stacked piezoelectric device.

The stress absorbing portions are preferably implemented by slit-like grooves recessed inwardly from the side surface of the ceramic laminate.

In this case, it is possible to form the stress absorbing portions easily which work to absorb the stress sufficiently.

The stress absorbing portions may be made of burning-out material which will be burned out during the firing thereof.

This permits the stress absorbing portions to be made easy.

As the burning-out material, powder-like carbon particles, resinous particles, or carbonized organic particles made by carbonizing organic powders may be used.

Particularly, when the carbon particles are used as the burning-out material, the stress absorbing portions are shaped accurately because the carbon particles are insusceptible to thermal deformation.

When the carbonized organic particles are used as burning-out material, it will result in a decrease in production cost of the stress absorbing portions.

As the organic particles, there are particles made by grinding soya beans, Indian corns, resinous material.

The carbonized organic particles, as referred to herein, are fine or minute particles made by removing water contained in organic particles partially to carbonize them to the extent that the flowability and dispersibility are good.

The stress absorbing portions may also be made of material which will result in cracks in the above slit-like areas when the stacked piezoelectric device is polarized or actuated.

The piezoelectric ceramic layers are preferably made to have a main component of zirconate titanate. The inner electrode portions are preferably made to have a main component of AgPd alloy (claim 17).

In this case, the stacked piezoelectric device is made which is great in amount of stroke thereof.

The stacked piezoelectric device is preferably used in a fuel injector.

In this case, the stability of operation of the stacked piezoelectric device in heavy environmental conditions is ensured for an increased time.

The stress absorbing portions may be formed in the piezoelectric ceramic layers between the inner electrode layers.

The stress absorbing portions may be formed in the substantially same layers as the inner electrode layers.
Embodiments
(Embodiment 1)

Next, the stacked piezoelectric device according to embodiments of the invention will be described below using FIGS. 1 to 10.

Figure 1:
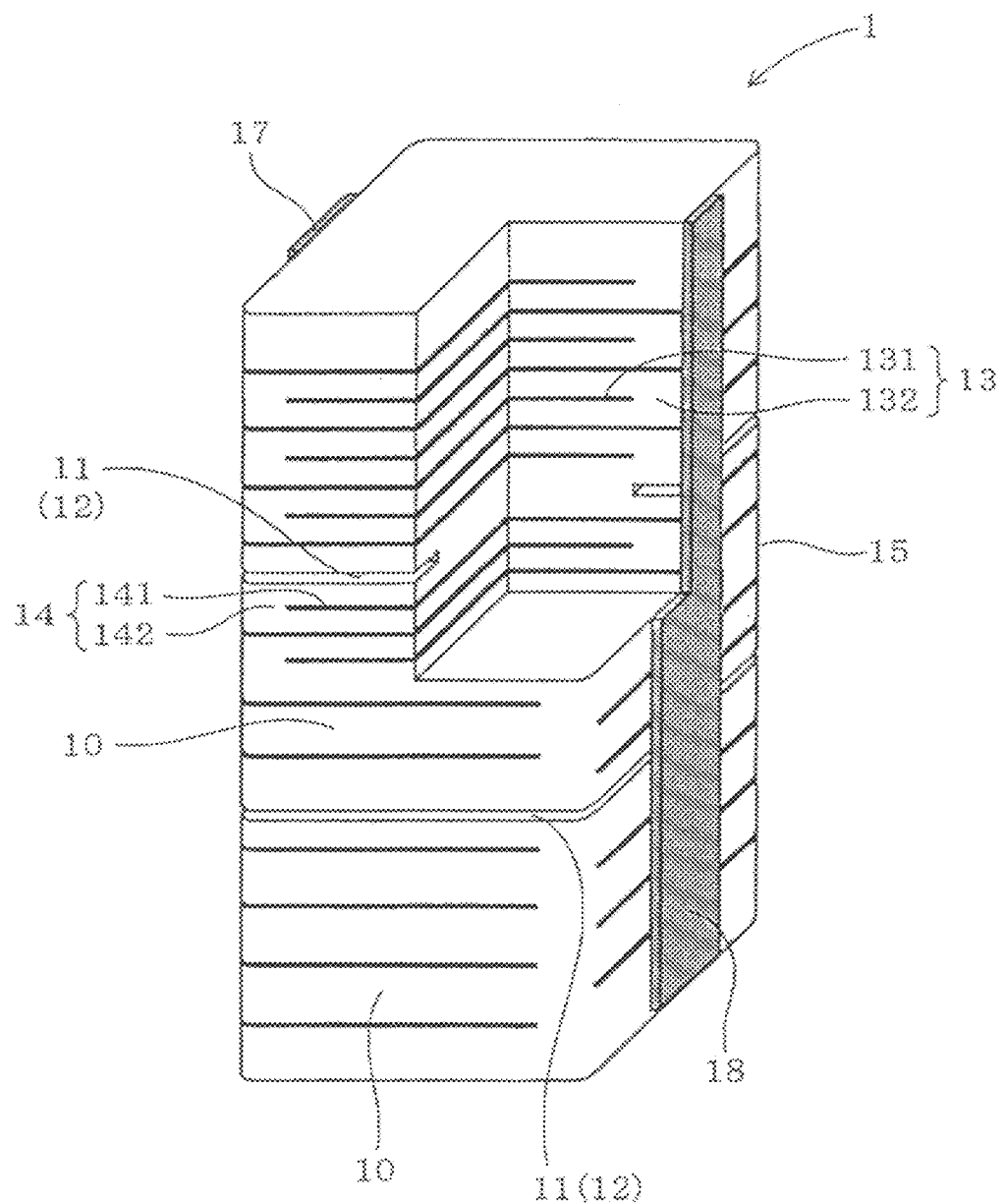
FIG. 1 is an explanatory view which shows the structure of a stacked piezoelectric device according to the embodiment 1.

As illustrated in FIGS. 1 to 3, the stacked piezoelectric device 1 of this embodiment has a ceramic laminate 15 made by stacking the plurality of piezoelectric layers 10 and the plurality of inner electrode layers 13 and 14 alternately and the pair of side electrodes 17 and 18 fanned on side surfaces of the ceramic laminate 15. The inner electrode layers 13 and 14 include the conductive inner electrode portions 131 and 141 and the recessed portions 132 and 142 defined by retreating outer peripheral ends of the inner electrode portions 131 and 141 inwardly from the outer peripheral surface of the ceramic laminate 15. The inner electrode layers 13 and 14 are connected electrically to side electrodes 17 and 18, respectively, which are different from each other. Specifically, the inner electrode layers 13 and 14 are equipped with the inner electrode portions 131 and 141 that are inner electrode-formed areas and the recessed portions 132 and 142 that are inner electrode-unformed areas.

The ceramic laminate 15 has the stress absorbing portions 11 and 12 which are easier to deform in shape than the piezoelectric ceramic layers 10 in slit-like areas recessed inwardly from the side surfaces of the ceramic laminate 15.

The stress absorbing portions 12 of this embodiment are a slit-like groove (chamber) recessed inwardly from the side surface of the ceramic laminate 15. The stress absorbing portions 12 extend in the whole of the outer peripheral surface of the ceramic laminate 15 in a circumferential direction. The stress absorbing portions 12 are formed in the piezoelectric layers 10 between the inner electrode layers 13 and 14 and located away from the inner electrode portions 131 and 141 or the recessed portions 132 and 142.

As viewed in the cross section of the stacked piezoelectric device 1 in FIG. 2, the average 115 (125) of depths of all the stress absorbing portions 11 (12) exposed to the same side surface 151 (152) of the ceramic laminate 15 is greater than the average 145 (135) of the recessed distances of all the recessed portions 142 (132) formed in the same side surface as the stress absorbing portions 11 (12).

As viewed in the cross section of the stacked piezoelectric device 1 in FIGS. 2 and 3, of the recessed portions 132 and 142 of two of the inner electrode layers 13 and 14 located across the stress absorbing portion 11 (12), the recessed distance 142 (132) of ones located at the same side as the stress absorbing portion 11 (12) is greater than the depths 111 (121) of the stress absorbing portions 11 (12).

Next, a production method of the stacked piezoelectric device of this embodiment will be described below using FIGS. 1 to 10.

In this embodiment, the stacked piezoelectric device is made by a green sheet making process, an electrode printing process, a burn-off slit printing process, a pressure bonding process, a stack cutting process, and a firing process.

Next, each process of the production method will be described below.
<Green Sheet Making Process>

First, we prepared ceramic raw material powder such as lead zirconate titanate (PZT) which is a piezoelectric material. Specifically, we prepared $Pb_3O_4$, $SrCO_3$, $ZrO_2$, $TiO_2$, $Y_2O_3$, and $Nb_2O_5$ as starting raw materials, weighted them at a stoichiometric proportion which was selected to produce a target composition $PbZrO_3$—$PbTiO_3$—$Pb(Y1/2Nb1/2)O_3$, wet-blended, and calcined them at 850° C. for 5 hours. Next, we wet-ground the calcined powders using a pearl mill. We dried the calcined ground powders (Grain Size (D50): 0.7±0.05 μm) and blended with solvent, binder, plasticizer, and dispersing agent in a ball mill to make slurry. We agitated, vacuum-degassed, and adjusted the slurry in viscosity.

We applied the slurry on a carrier film using the doctor blade method to make elongated green sheet having a thickness of 80 μm. We cut the green sheet into a desired size to make wide green sheet 110, as illustrated in FIGS. 4 to 6.

The formation of the green sheet may alternatively be achieved by the extrusion molding or any other manners as well as the doctor blade method.
<Electrode Printing Process>

Figure 4:
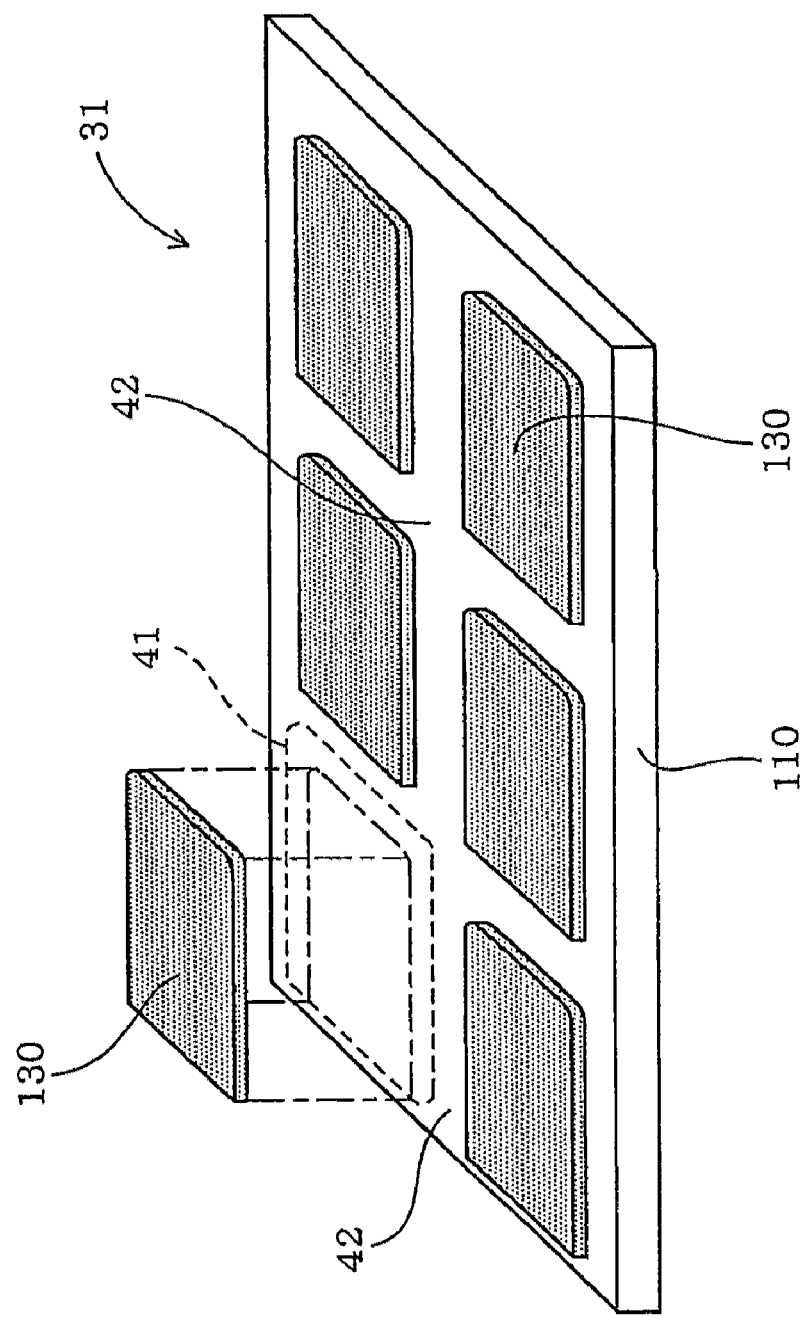
FIG. 4 is an explanatory view which shows a process of forming a first electrode-printed sheet according to the embodiment 1.
Figure 5:
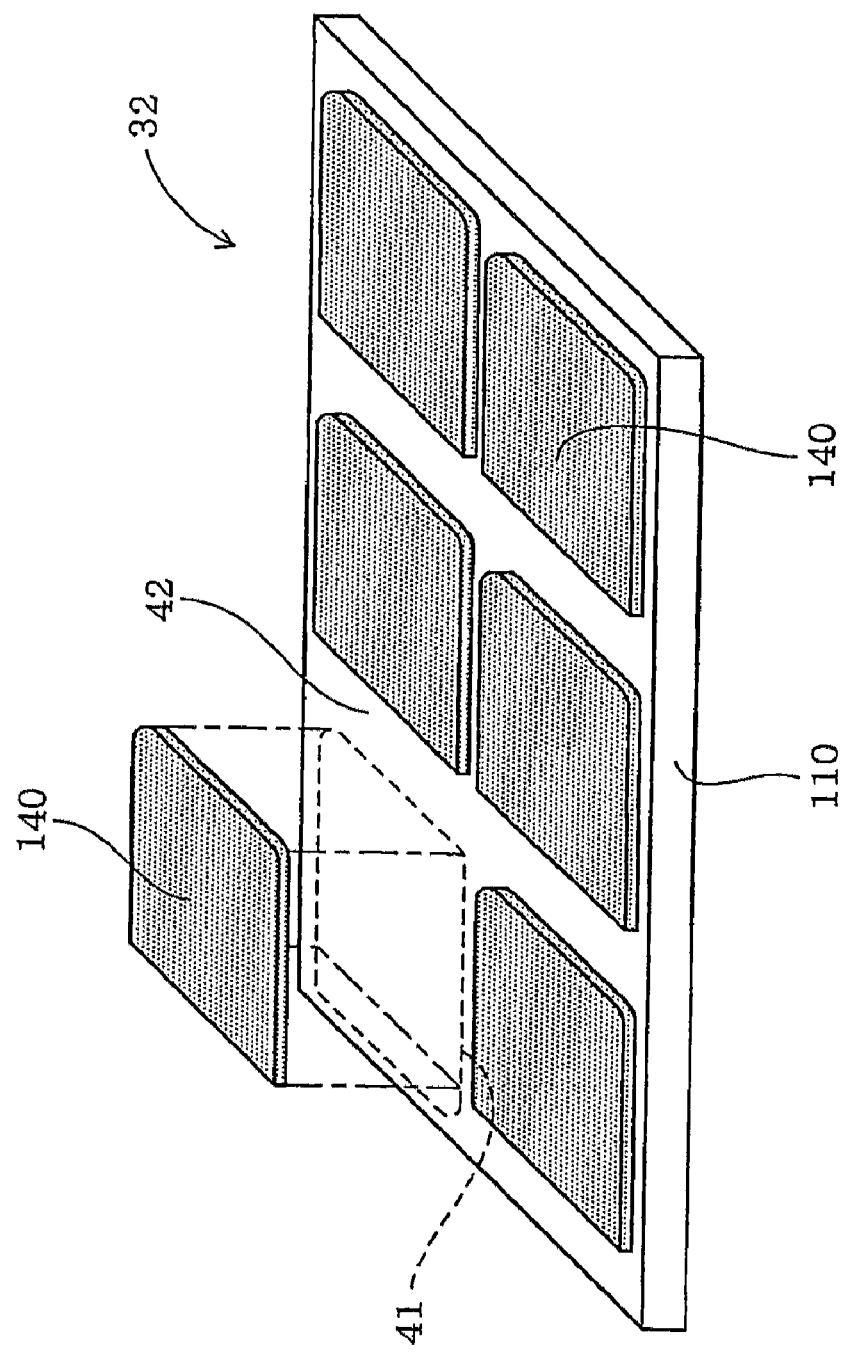
FIG. 5 is an explanatory view which shows a process of forming a second electrode-printed sheet according to the embodiment 1.
Figure 6:
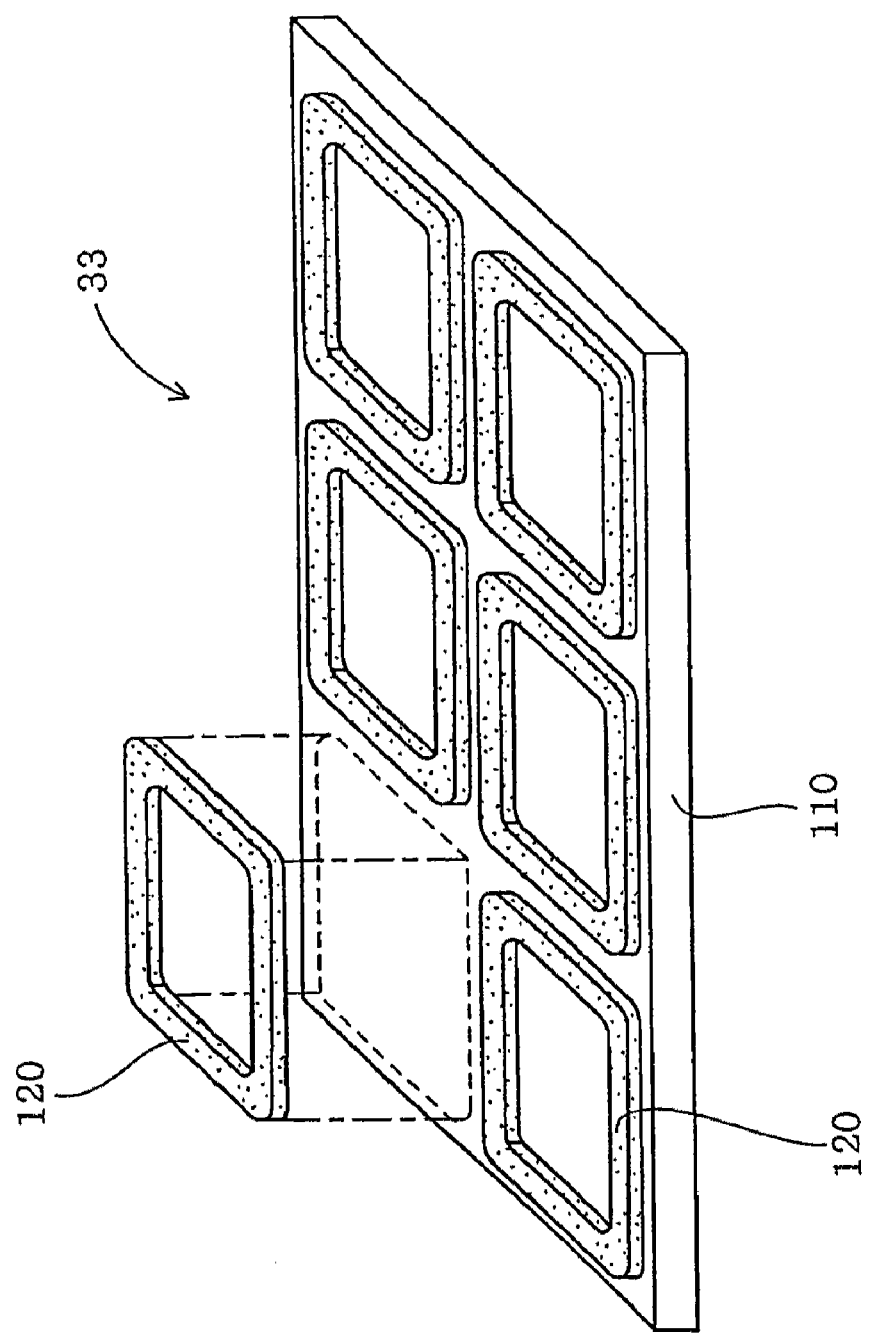
FIG. 6 is an explanatory view which shows a process of forming a burn-off slit-printed sheet according to the embodiment 1.

Next, as illustrated in FIGS. 4 and 5, electrode materials 130 and 140 which will be the inner electrode layers were printed on the green sheet 110. We formed two types of sheet: first electrode-printed sheet 31 and second electrode-printed sheet 32.

The formation of the electrode-printed sheets 31 and 32 will be described below more in detail.

The first electrode-printed sheet 31 was formed, as illustrated in FIG. 3, by printing the electrode material 130 on a section of each of printing areas 41 of the green sheet 110 which will finally be the inner electrode layer 13.

The second electrode-printed sheet 41 was formed, as illustrated in FIG. 4, by printing the electrode material 140 on a section of each of printing areas 41 of the green sheet 110 which will finally be the inner electrode layer 14.

In the first and second electrode-printed sheets 31 and 32, the electrode materials 130 and 140 formed on the green sheets 110 are exposed to side surfaces different from each other.

In this embodiment, Ag/Pd alloy paste was used as the electrode materials 130 and 140. Ag, Pd, Cu, Ni, or Cu/Ni alloy may alternatively be used.
<Burn-Off Slit Printing Process>

In this embodiment, slits 11 and 12 (see FIGS. 1 to 3) were formed in the side surfaces of the ceramic laminate 15 of the stacked piezoelectric device 1 to be manufactured. The burn-off slit printing process, as illustrated in FIG. 6, was made to form the burn-off slit-printed sheet 33

As illustrated in FIG. 6, the burn-off slit layer 120 was formed by a burn-off material which is to be burnt off in the firing process, so that it will be burnt out, on each printing area 41 of the green sheet 110, thereby forming the burn-off slit-printed sheet 33.

In this embodiment, carbon powder material which is small in thermal deformation and will keep the shape of grooves to be formed by the firing process precisely was used as the burn-off material to make the burn-off slit layer 120. Carbonized organic particles may alternatively be used. The carbonized organic particles may be made by carbonizing powder-like organic particles or grinding carbonized organic substance. As the organic substance, cereal grains such as cones, soya beans, or flour may be used to save the production costs.

In the electrode printing and burn-off slit printing processes, the electrode material and the burn-off material were printed to meet the above described relation between the recessed distance and the depth of the stress absorbing portion. Additionally, in the electrode printing and burn-off slit printing processes, as illustrated in FIGS. 4 to 6, the electrode material 130 and 140 and the burn-off slit layers 120 are printed so that they are located away from each other through air gaps 42 where portions of the green sheet 110 are to be cut in the following unit cutting process. Specifically, the printing is made to have the air gaps 42 between the adjacent printing areas 41 on the green sheet 110.

<Pressure Bonding Process>

Figure 7:
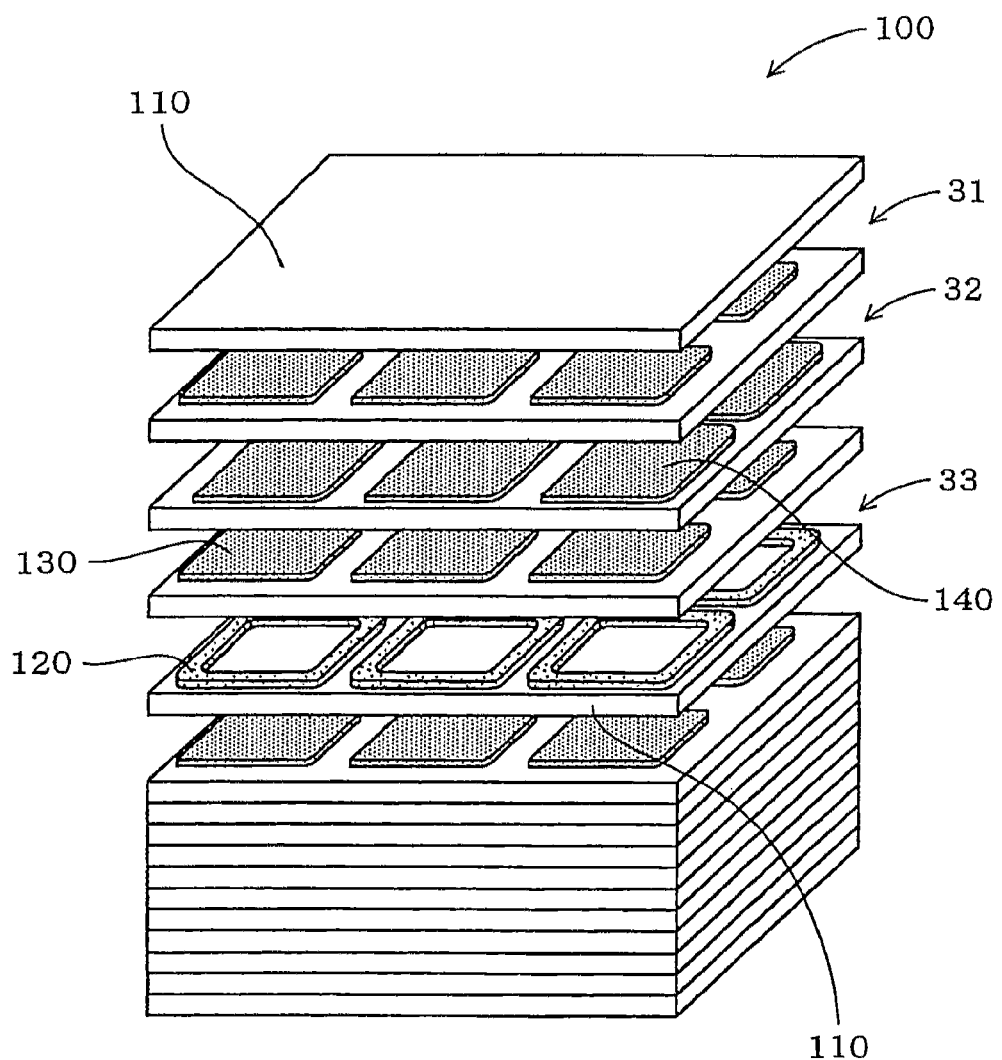
FIG. 7 is an explanatory view which shows a process of stacking electrode-printed sheets and burn-off slit-printed sheets according to the embodiment 1.

Next, the first electrode-printed sheet 31 and the second electrode-printed sheet 32, and the burn-off slit-printed sheets 33 were, as illustrated in FIG. 7, stacked in a given order so as to align the printing areas 41 in the laminating direction. Specifically, the first electrode-printed sheets 31 and the second electrode-printed sheets 32 were stacked alternately. Each of the burn-off slit-printed sheets 33 was inserted into the location where the above described slits are desired to be formed.

Specifically, in this embodiment, the burn-off slit-printed sheet 33 was stacked on every stack of eleven layers made up of the first electrode-printed sheets 31 and the second electrode-printed sheets 32. The first electrode-printed sheets 31 and the second electrode-printed sheets 32 were stacked until a total number of them is 59. Green sheets on which the electrode material and the burn-off layers were not printed were disposed on both ends of the stack. The first electrode-printed sheets 31 and the second electrode-printed sheets 32 were stacked so that the electrode material 130 and the electrode material 140 were exposed alternately to the end surface which the printing areas face. The sheets stacked in this manner was heated at 100° C. and pressed at 50 MPa in the laminating direction to make a pre-stack 100. For the sake of convenience, FIG. 7 illustrates the pre-stack 100 which is smaller in number of stacked layers than actual.

<Stack Cutting Process>

Figure 8:
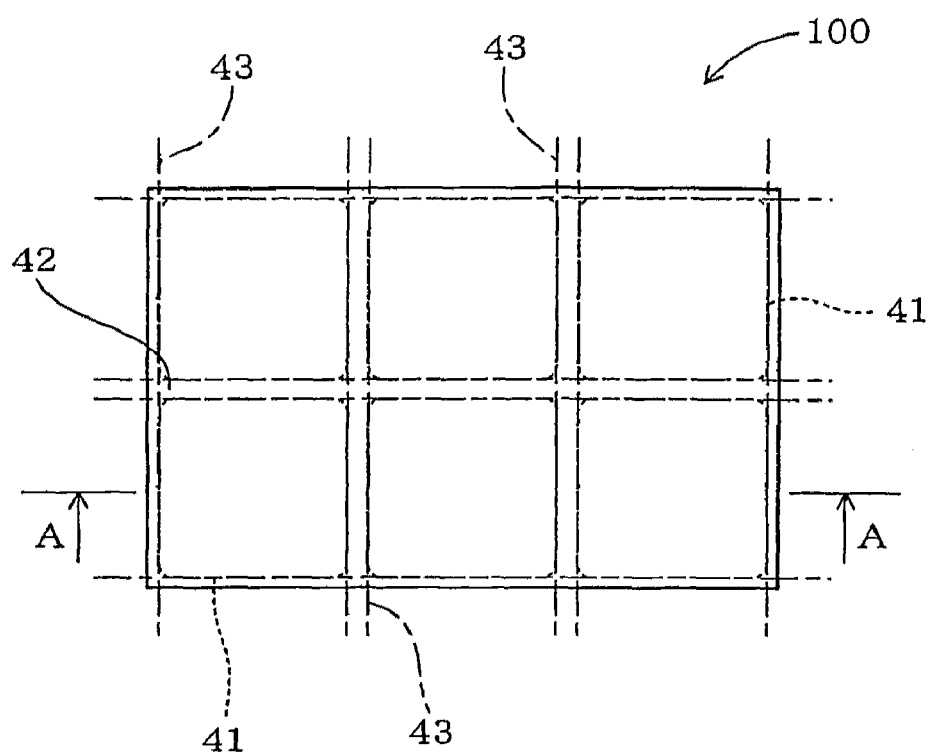
FIG. 8 is a top surface view of a pre-laminate according to the embodiment 1.
Figure 9:
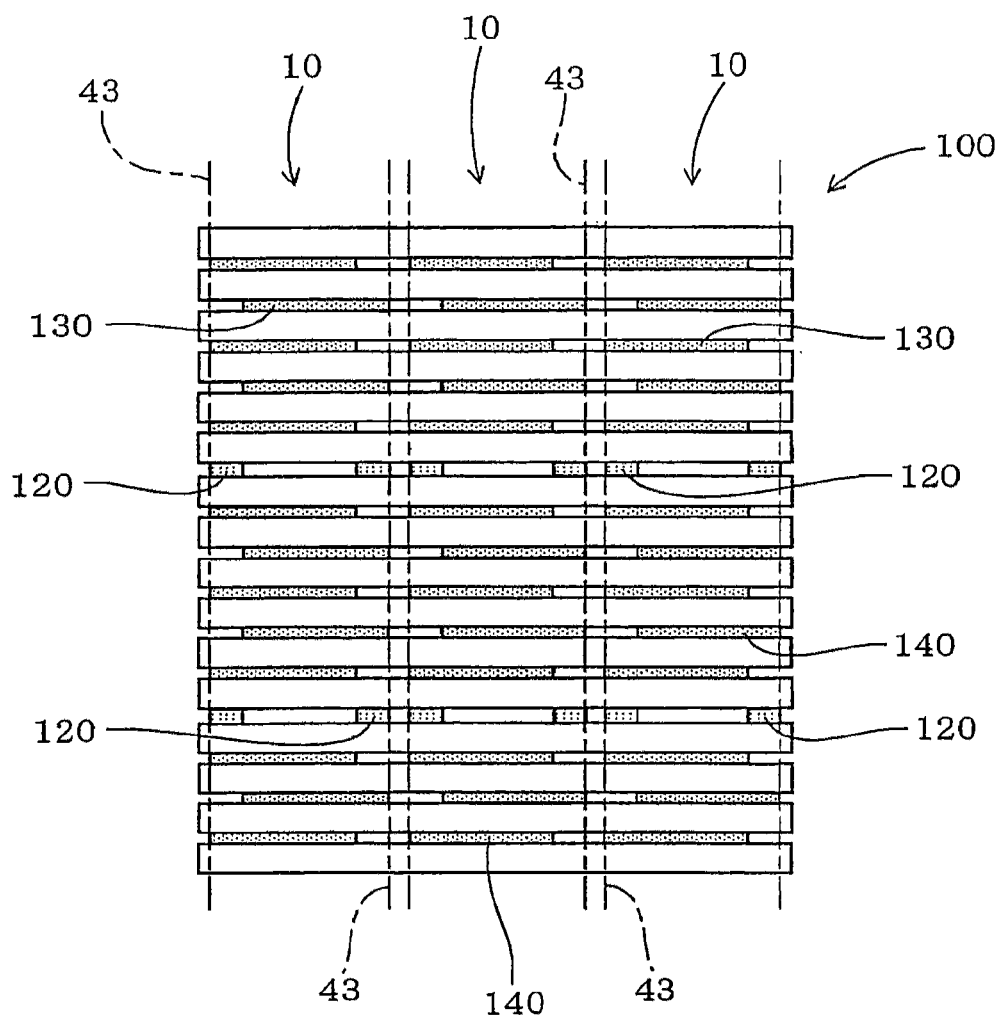
FIG. 9 is a cross sectional view showing an A-A sectional area in FIG. 5.
Figure 10:
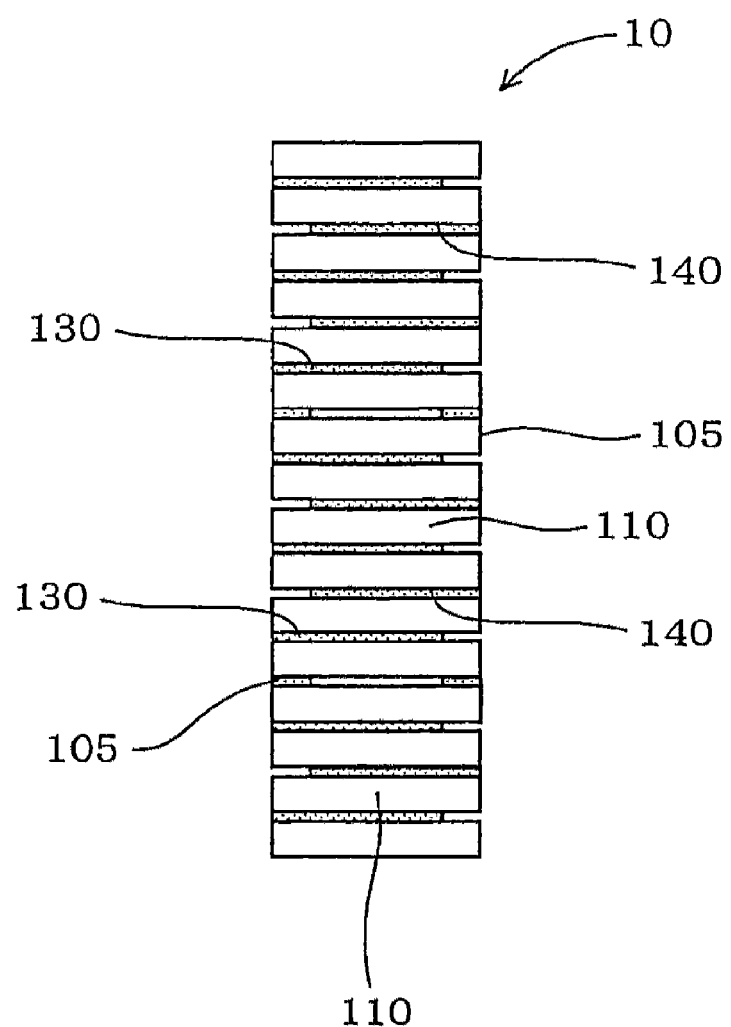
FIG. 10 is an explanatory view which shows a sectional structure of an intermediate laminate according to the embodiment 1.

Next, as illustrated in FIGS. 8 to 10, the pre-stack 100 were cut at the cutting positions 43 in the laminating direction to form the intermediate stacks 10.

The pre-stack 100 may be cut in the unit of the intermediate stacks 10 or in the unit of two or more of them. In this embodiment, the pre-stack 100 was cut in the unit of each of the intermediate stacks 10 so that each of the electrode materials 130 and 140 and the burn-off slit layers 120 were exposed to the side surfaces of the intermediate stack 10.

For the sake of convenience, FIGS. 9 and 10 illustrate the pre-stack 100 and the intermediate stacks 10 which are smaller in number of stacked layers than actual.

<Firing Process>

Next, binder resin contained in the green sheet 110 of the intermediate stacks 10 was removed thermally (degreased).

This was achieved by heating the binder resin gradually up to 500° C. for eighty hours and keeping it for five hours.

Next, the degreased intermediate stacks 10 were fired. The firing was achieved by heating the intermediate stacks 10 gradually up to 1050° C. for twelve hours, keeping them for two hours, and then cooling them gradually.

In this manner, the ceramic laminate 15 is, as illustrated in FIGS. 1 to 3, made which has the stress absorbing portions 11 and 12 formed by the burning off of the burn-off slit layers 120. The stress absorbing portions 11 and 12 are defined by slit-like chambers formed in the entire circumferential surface of the ceramic laminate 15. As illustrated in FIGS. 1 to 3, the ceramic laminate 15 is made of the piezoelectric ceramic layers 10 formed by the sintered green sheets 110 and the inner electrode layers 13 and 14 formed by the electrode materials 130 and 140 which are stacked alternately.

After fired, the entire surface of the ceramic laminate 15 was polished to be 6 mm×6 mm square and 4.4 mm high. The side electrodes 17 and 18 were printed on the both side surfaces of the ceramic laminate 15. The inner electrodes 13 and 14 are connected electrically alternately to the side electrodes 17 and 18 respectively.

In the above manner, the stacked piezoelectric device 1, as illustrated in FIGS. 1 to 3, was made.

For the sake of convenience, FIGS. 1 and 2 illustrate the stacked piezoelectric device 1 which is smaller in number of stacked layers than actual.

In this embodiment, we made five kinds of stacked piezoelectric devices (samples E1 to E3, and samples C1 and C2) which were different in the recessed distance 143 (133) of the recessed portion 142 (132) that is one of the recessed portions 132 and 142 of the two inner electrode layers 13 and 14 located across the stress absorbing portion 11 (12) which is located on the same side surface as the stress absorbing portion 11 (12) and in depth of the above stress absorbing portion 11 (12).

Specifically, the sample E1 is the stacked piezoelectric device in which the above described recessed distance minus depth of the stress absorbing portion is 0.2 mm.

The samples E2 and E3 are the stacked piezoelectric devices in which the above described recessed distance minus depth of the stress absorbing portion is 0.4 mm and 0.6 mm, respectively.

The samples C1 and C2 are the stacked piezoelectric devices in which the above described recessed distance minus depth of the stress absorbing portion is 0 mm and −0.2 mm, respectively.

We measured the recessed distances of all the recessed portions of the inner electrode layers connected to the positive side electrode of each of the samples. The averages and ranges (variations) thereof are shown in table 1. Similarly, we measured the recessed distances of all the recessed portions of the inner electrode layers connected to the negative side electrode of each of the samples. The averages and ranges (variations) thereof are also shown in table 1.

We also measured the depth of all the stress absorbing portions exposed to the same side surface (i.e., the side surface with the positive side electrode). The averages and ranges (variations) are shown in table 1. Similarly, we also measured the depth of all the stress absorbing portions exposed to the same side surface (i.e., the side surface with the negative side electrode). The averages and ranges (variations) are shown in table 1.

Next, we measured the durability of these stacked piezoelectric devices.

<Durability Test>

We applied an electric field of 3.1 kV/mm to the stacked piezoelectric device of each sample at 200° C. to drive it. We connected each sample to a resistor R whose resistance value was known in parallel thereto to develop a circuit. We read the voltage (leakage current value) applied to the resistor R through a digital meter while applying the electric field to each sample. We measured the time elapsed until the insulation resistance of the device (sample) drops below 10 MΩ and defines it as the service life of the device. The results are shown in table 1.

thereof and also has the relation in which the recessed distance 143 (133) of the recessed portion 142 (132) of one of the two inner electrode layers 13 and 14 located across the stress absorbing portion 11 (12) which is placed on the same side surface as the stress absorbing portion 11 (12) in a cross section of the stacked piezoelectric device in the laminating direction, it will have portions of corners thereof to which the electric field is to be applied.

Figure 12:
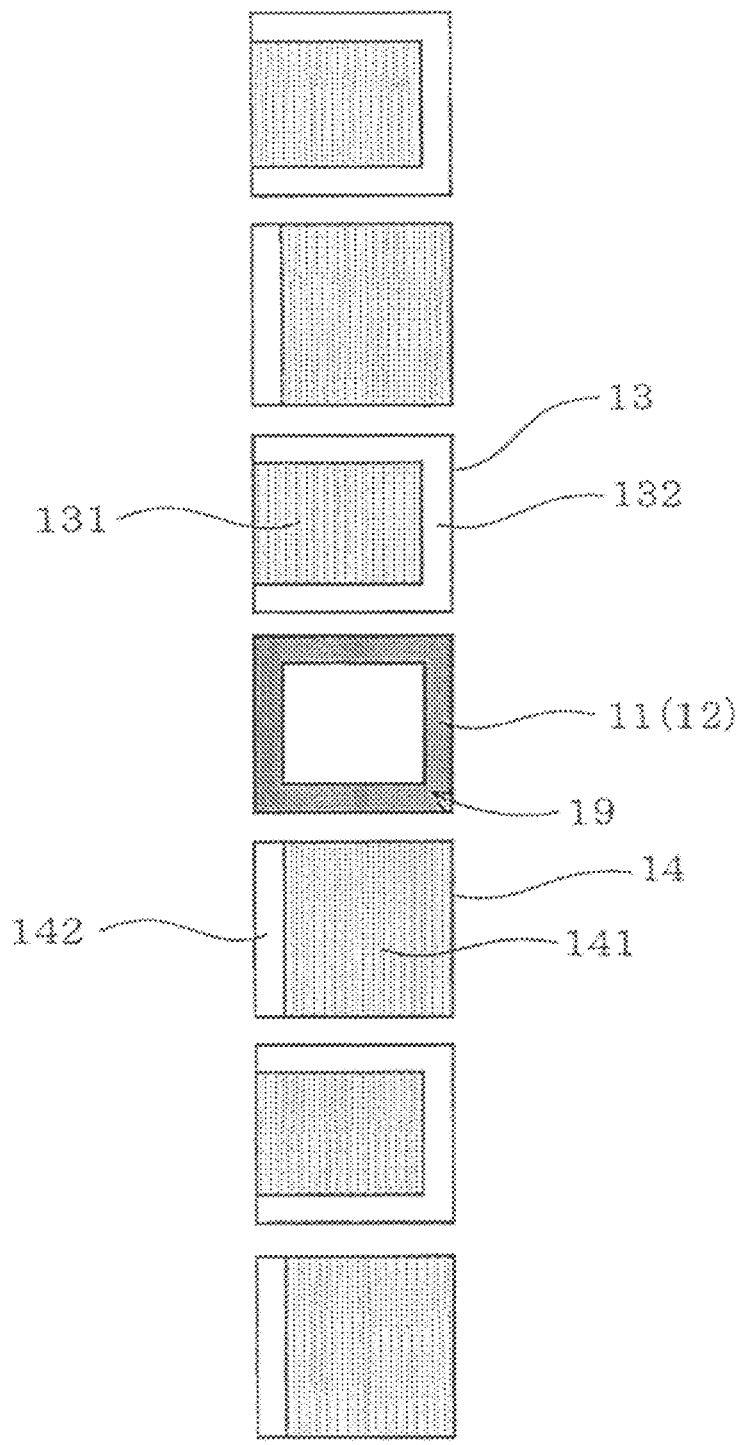
FIG. 12 is a development view of a ceramic laminate which shows a pattern in which inner electrode portions and slit layers are formed according to the embodiment 1.
Figure 46:
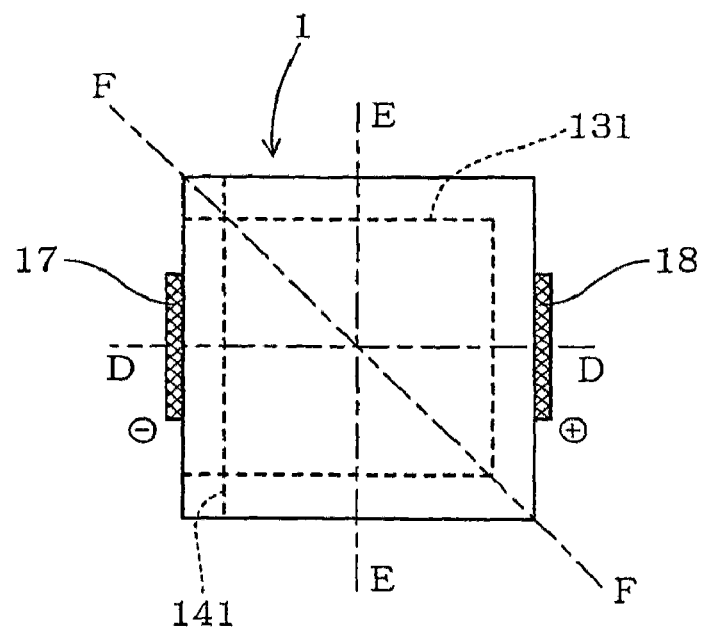
FIG. 46 is an explanatory view which shows a stacked piezoelectric device in which inner electrode layers and stress absorbing portions are formed in a given pattern, as viewed therethrough in a laminating direction.

FIG. 46 illustrates the stacked piezoelectric device 1 equipped with the inner electrode layers 13 and 14 and the stress absorbing portions 11 (12) in the pattern of FIG. 12

TABLE 1

| Sample No. | Recessed distance on the positive side (mm) | | Depth of stress absorbing portion on positive side (mm) | | Recessed distance on negative side (mm) | | Depth of stress absorbing portion on negative side (mm) | | Recessed distance-depth of stress absorbing portion (mm) | Life (h) |
|---|---|---|---|---|---|---|---|---|---|---|
| | Average | Range | Average | Range | Average | Range | Average | Range | | |
| E1 | 0.42 | 0.25-0.75 | 0.56 | 0.48-0.68 | 0.43 | 0.23-0.74 | 0.55 | 0.46-0.67 | 0.2 | >500 |
| E2 | 0.45 | 0.21-0.93 | 0.55 | 0.45-0.66 | 0.44 | 0.23-0.95 | 0.53 | 0.41-0.63 | 0.4 | >500 |
| E3 | 0.48 | 0.22-1.15 | 0.53 | 0.46-0.69 | 0.44 | 0.25-1.16 | 0.56 | 0.43-0.69 | 0.6 | >500 |
| C1 | 0.45 | 0.24-0.59 | 0.53 | 0.42-0.61 | 0.47 | 0.23-0.62 | 0.57 | 0.43-0.70 | 0 | 250 |
| C2 | 0.41 | 0.25-0.46 | 0.56 | 0.43-0.70 | 0.40 | 0.25-0.45 | 0.52 | 0.46-0.67 | −0.2 | 200 |

Table 1 shows that any of the samples E1 to E3 and C1 and C2 meets the relation of the average of all the recessed distances<the average of the depths of all the stress absorbing portions. Table 1 also shows the samples E1 to E3 according to the embodiment of the invention have the service life two times or more longer than that of the samples C1 and C2.

Figure 11:
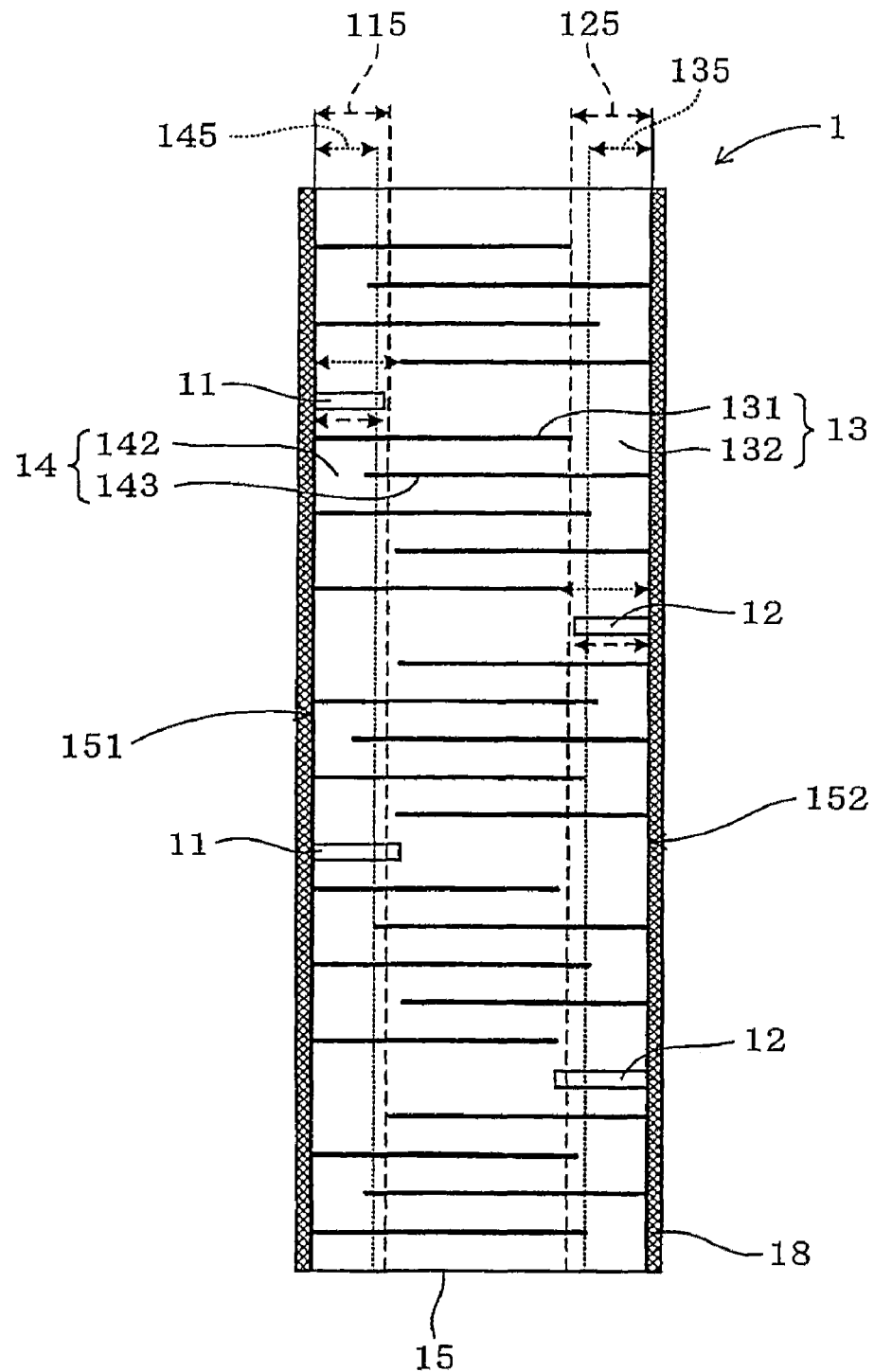
FIG. 11 is an explanatory view which shows a stacked piezoelectric device according to the embodiment 1 in which stress absorbing portions alternately exposed to different side surfaces are formed in different layers.

In this embodiment, the stress absorbing portions are formed in the entire circumferential surface of the ceramic laminate, but however, may be, as illustrated in FIG. 11, formed so as to be exposed to the side surfaces of the ceramic laminate 15 alternately. In this case, the averaged value 115 (125) of depths of all the stress absorbing portions 11 (12) exposed to the same side surface 151 (152) of the ceramic laminate 15 is greater than the averaged value 145 (135) of the recessed distances of all the recessed portions 142 (141) formed on the same side surface 151 (152) of the ceramic laminate 15. Additionally, the recessed distance of one of the two recessed portions 132 and 142 located across the stress absorbing portion 11 (12) which is placed on the same side surface as the stress absorbing portion 11 (12) is greater than the depth of the stress absorbing portion 11 (12), thereby resulting in enhanced durability, like the samples E1 to E3.

In this embodiment, the inner electrode portions 131 and 141 and the slit layers 11 and 12 were formed in a combination pattern, as illustrated in FIG. 12. This invention is not limited to this pattern. When seen therethrough in the laminating direction, the ceramic laminate preferably has overlapping portions that are areas where all the inner electrode portions overlap each other and non-overlapping portions that are areas where the inner electrode portions at least partially overlap each other or do not overlap at all and that the stress absorbing portions are formed in the non-overlapping portions 19.

Figure 13:
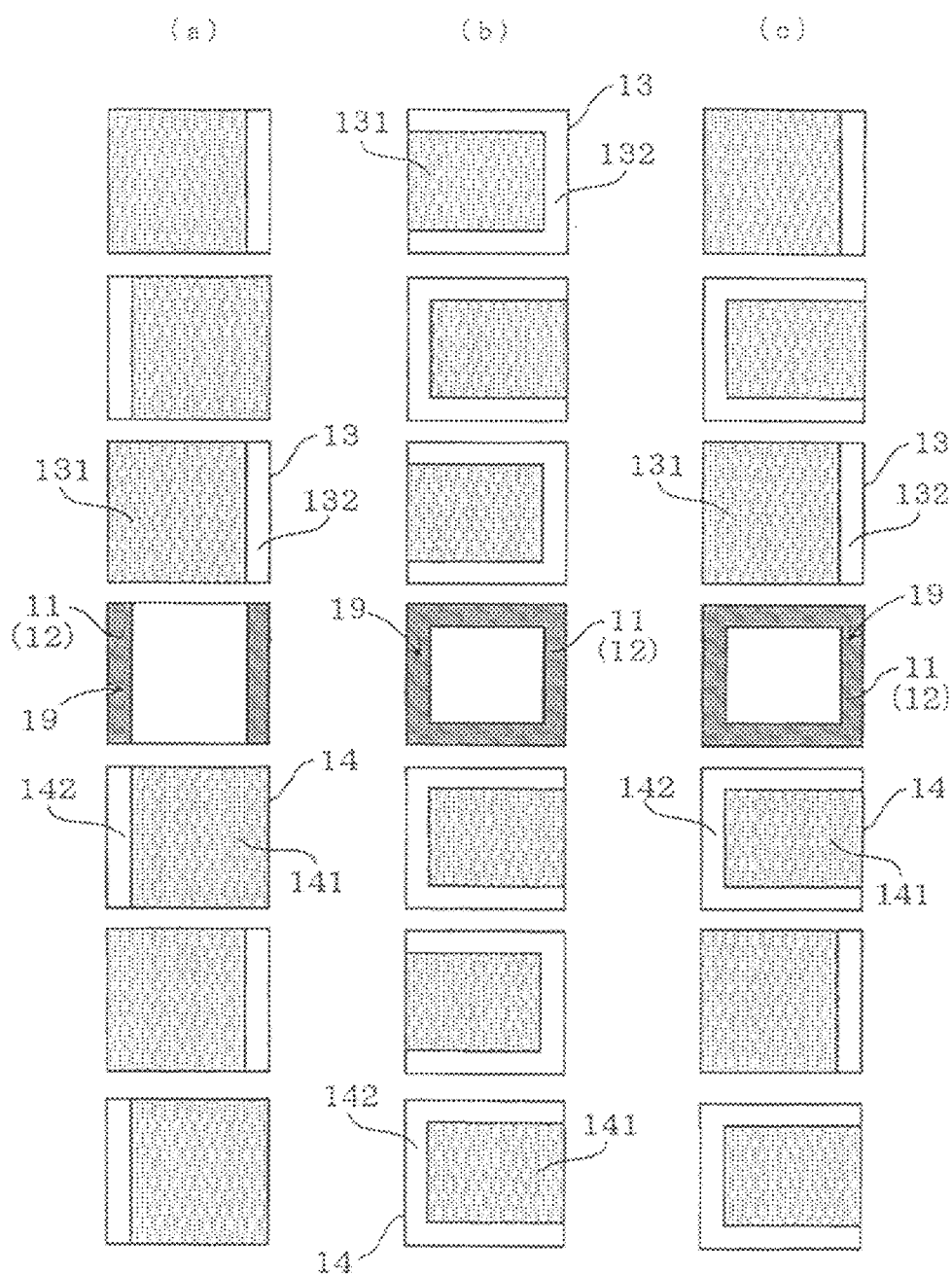
FIG. 13 is an explanatory view which shows variations (a) to (c) of a pattern in which inner electrode portions and slit layers are formed according to the embodiment 1.

Any of combinations of the inner electrodes 131 and 141 and the slit layers 11 and 12, as illustrated in FIGS. 13(a) to 13(c), ensures the beneficial effects of the present invention.

Figure 47A:
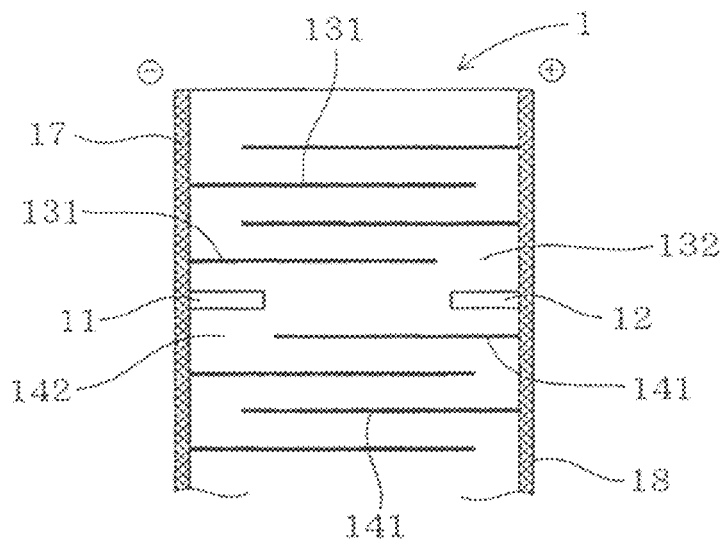
FIG. 47($a$) is a D-D sectional view in FIG. 46 which shows neighbors of stress absorbing portions.
Figure 47B:
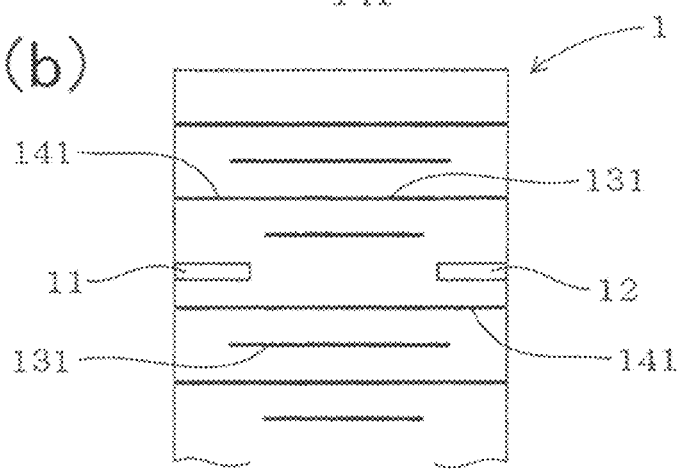
Figure 47C:
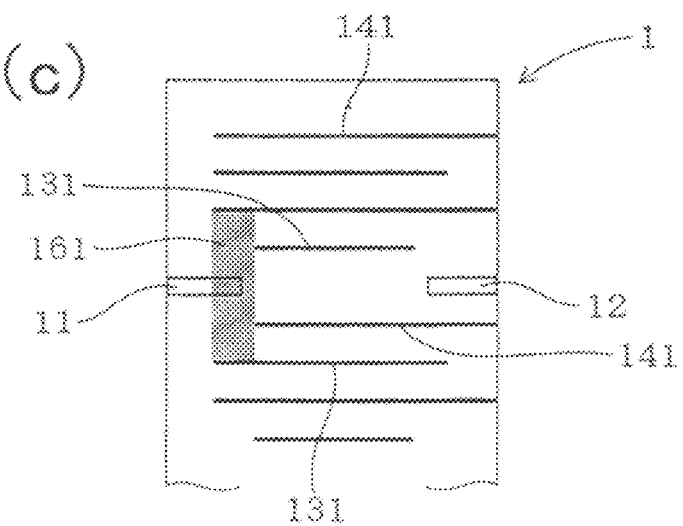

When the combination of the inner electrodes 131 and 141 and the slit layers 11 and 12 is the one illustrated in FIGS. 13(b) and 13(c), that is, when the stacked piezoelectric device has the stress absorbing portions which are formed between the layers and extend over the entire circumferential surface when seen therethrough in the laminating direction. In FIG. 46, outer peripheries of the inner electrode portions 131 and 141 are indicated by broken lines. The locations of the stress absorbing portions are omitted. The D-D cross section, the E-E cross section, and the F-F cross section (see FIG. 46) of the stacked piezoelectric device having the inner electrode layers 13 and 14 and the stress absorbing portions 11 (12) formed in the pattern of FIG. 12 is illustrated in FIG. 47(a), FIGS. 47(b), and 47(c), respectively. FIGS. 47(a) to 47(c) illustrate the cross section around the stress absorbing portions 11 and 12 of the stacked piezoelectric device.

As illustrated in FIGS. 47(a) and 47(b), in the D-D cross section (see FIG. 46) and the E-E cross section (see FIG. 46) of the stacked piezoelectric device having the inner electrode layers 13 and 14 and the stress absorbing portions 11 (12) formed in the pattern of FIG. 12, the electric field is not applied to the stress absorbing portions 11 and 12, while there is a portion 161, as illustrated in FIG. 47(c), to which approximately half of a typical electric field is to be applied in the cross section (the F-F cross section in FIG. 46) through the corners. The portions 161 may be deteriorated. However, the interval between the inner electrode and the slit may be made greater than the one layer to decrease the electric field to be applied to the stress absorbing portions, thus resulting in an increase in durability. The case where some electric field which is lower than in the conventional structure is applied to the slit, as described above, is in the category of this invention.

(Embodiment 2)

Next, another variant of the stacked piezoelectric device of the invention will be described using FIGS. 18 to 27. The stacked piezoelectric device of this embodiment is a device in which the pattern in which the inner electrode portion and the recessed portion of the inner electrode layer is somewhat different from the embodiment 1.

Figure 18:
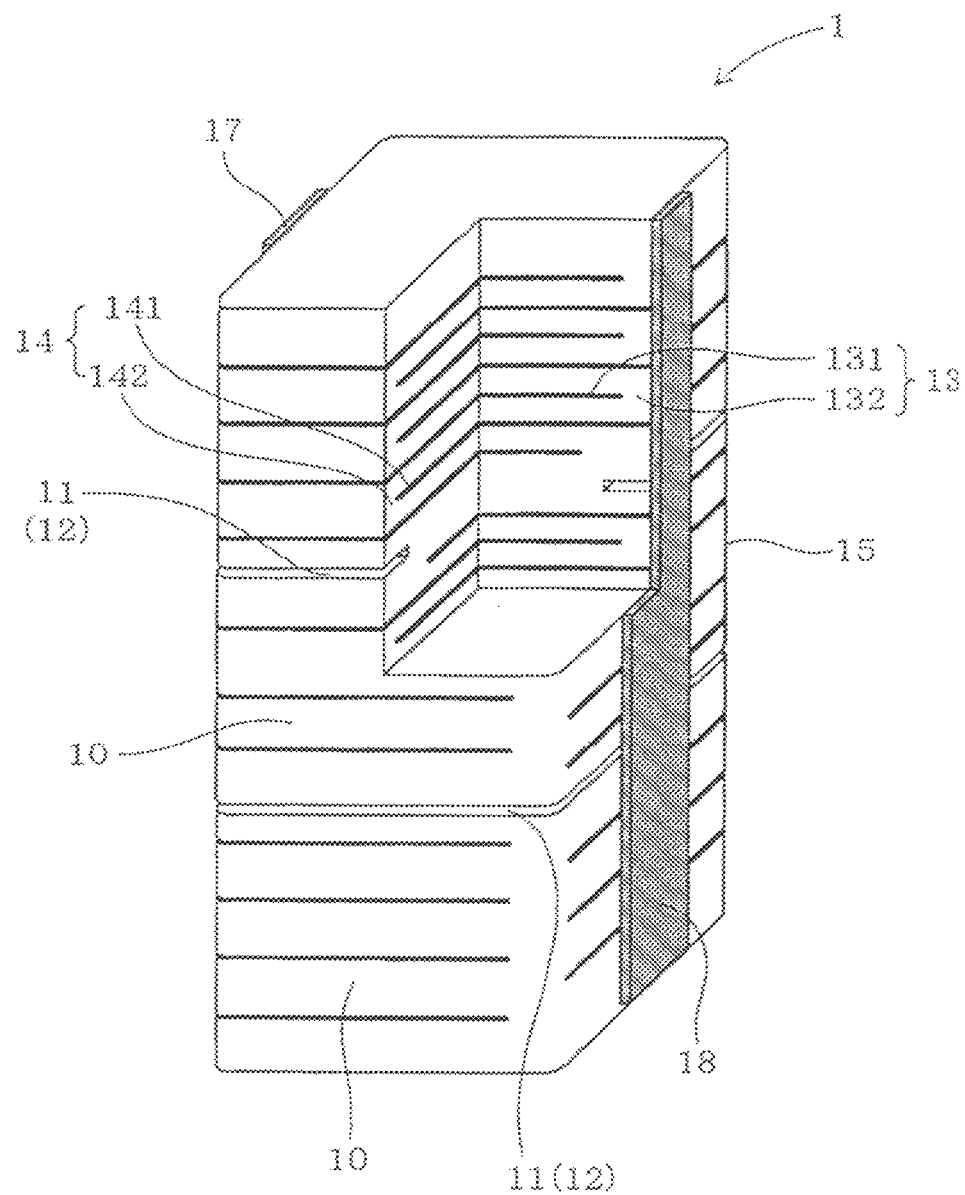
FIG. 18 is an explanatory view which shows the structure of a stacked piezoelectric device according to the embodiment 2.

As illustrated in FIGS. 18 to 20, the stacked piezoelectric device 1 of this embodiment, like in the embodiment 1, has the ceramic laminate 15 made by stacking the plurality of piezoelectric layers 10 and the plurality of inner electrode layers 13 and 14 alternately and the pair of side electrodes 17 and 18 formed on side surfaces of the ceramic laminate 15. The inner electrode layers 13 and 14 include the conductive inner electrode portions 131 and 141 and the recessed portions 132 and 142 defined by retreating outer peripheral ends of the inner electrode portions 131 and 141 inwardly from the outer peripheral surface of the ceramic laminate 15. The inner electrode layers 13 and 14 are connected electrically to side electrodes 17 and 18, respectively, which are different from each other.

The ceramic laminate 15 has the stress absorbing portions 11 and 12 which are easier to deform in shape than the piezoelectric ceramic layers 10 in slit-like areas recessed inwardly from the side surfaces of the ceramic laminate 15.

The stress absorbing portions 12 of this embodiment are a slit-like groove (chamber) recessed inwardly from the side surface of the ceramic laminate 15. The stress absorbing portions 12 extend in the entire outer peripheral surface of the ceramic laminate 15 in the circumferential direction thereof. The stress absorbing portions 12 are formed in the piezoelectric layers 10 between the inner electrode layers 13 and 14 and located away from the inner electrode portions 131 and 141 or the recessed portions 132 and 142. The stress absorbing portions 11 and 12 are located at a given interval away from each other in the laminating direction of the ceramic laminate 15.

As viewed in the cross section of the stacked piezoelectric device 1 in FIG. 19, the average 115 (125) of depths of all the stress absorbing portions 11 (12) exposed to the same side surface 151 (152) of the ceramic laminate 15 is greater than the average 145 (135) of the recessed distances of all the recessed portions 142 (132) formed in the same side surface as the stress absorbing portions 11 (12).

As viewed in the cross section of the stacked piezoelectric device 1 in FIGS. 19 and 20, of the recessed portions 132 (53) and 142 (54) of two of the inner electrode layers 13 and 14 located across the stress absorbing portions 11 and 12, the recessed distance 143 or 133 of ones located at the same side as the stress absorbing portion 11 or 12 is greater than the depth 111 or 121 of the stress absorbing portion 11 or 12.

As illustrated in FIG. 31, if any two of the inner electrode layers located across the stress absorbing portions 11 and 12 are referred to as the adjacent electrode layers 53 and 54, the stacked piezoelectric device 1 has, as viewed in the cross section of the stacked piezoelectric device 1 in the laminating direction, the separate portions 5 defined in a direction perpendicular to the laminating direction of the stacked piezoelectric device 1 between the outer peripheral ends 539 and 549 of the inner electrode portions 531 and 541 of the adjacent electrode layers 53 and 54 and the top ends 122 and 112 of the stress absorbing portions 12 and 11 located on the same side surfaces as the recessed portions 532 and 542 of the adjacent electrode layers 53 and 54, respectively.

As viewed in the cross section of the stacked piezoelectric device 1 in the laminating direction in FIGS. 19 and 20, the recessed distance 134 or 144 of the recessed portion 132 or 142 of at least one of the inner electrode layers 13 and 14 which is located between the stress absorbing portions 11 and 12 closest to each other in the laminating direction except two of the inner electrode layers 53 and 54 located across the stress absorbing portions 11 and 12 is preferably smaller than the depth of the stress absorbing portions 11 and 12.

Next, a production method of the stacked piezoelectric device of this embodiment will be described below using FIGS. 18 to 27.

In this embodiment, the stacked piezoelectric device is, like in the embodiment 1, made by a green sheet making process, an electrode printing process, a burn-off slit printing process, a pressure bonding process, a stack cutting process, and a firing process.

Next, each process of the production method will be described below.

<Green Sheet Making Process>

First, we prepared ceramic raw material powder such as lead zirconate titanate (PZT) which is a piezoelectric material. Specifically, we prepared $Pb_3O_4$, $SrCO_3$, $ZrO_2$, $TiO_2$, $Y_2O_3$, and $Nb_2O_5$ as starting raw materials, weighted them at a stoichiometric proportion which was selected to produce a target composition $PbZrO_3$—$PbTiO_3$—$Pb(Y1/2Nb1/2)O_3$, wet-blended, and calcined them at 850° C. for 5 hours. Next, we wet-ground the calcined powders using a pearl mill. We dried the calcined ground powders (Grain Size (D50): 0.7±0.05 μm) and blended with solvent, binder, plasticizer, and dispersing agent in a ball mill to make slurry. We agitated, vacuum-degassed, and adjusted the slurry in viscosity.

We applied the slurry on a carrier film using the doctor blade method to make elongated green sheet having a thickness of 80 μm. We cut the green sheet into a desired size to make wide green sheet 110, as illustrated in FIGS. 21 to 23.

The formation of the green sheet may alternatively be achieved by the extrusion molding or any other manners as well as the doctor blade method.

<Electrode Printing Process>

Figure 21:
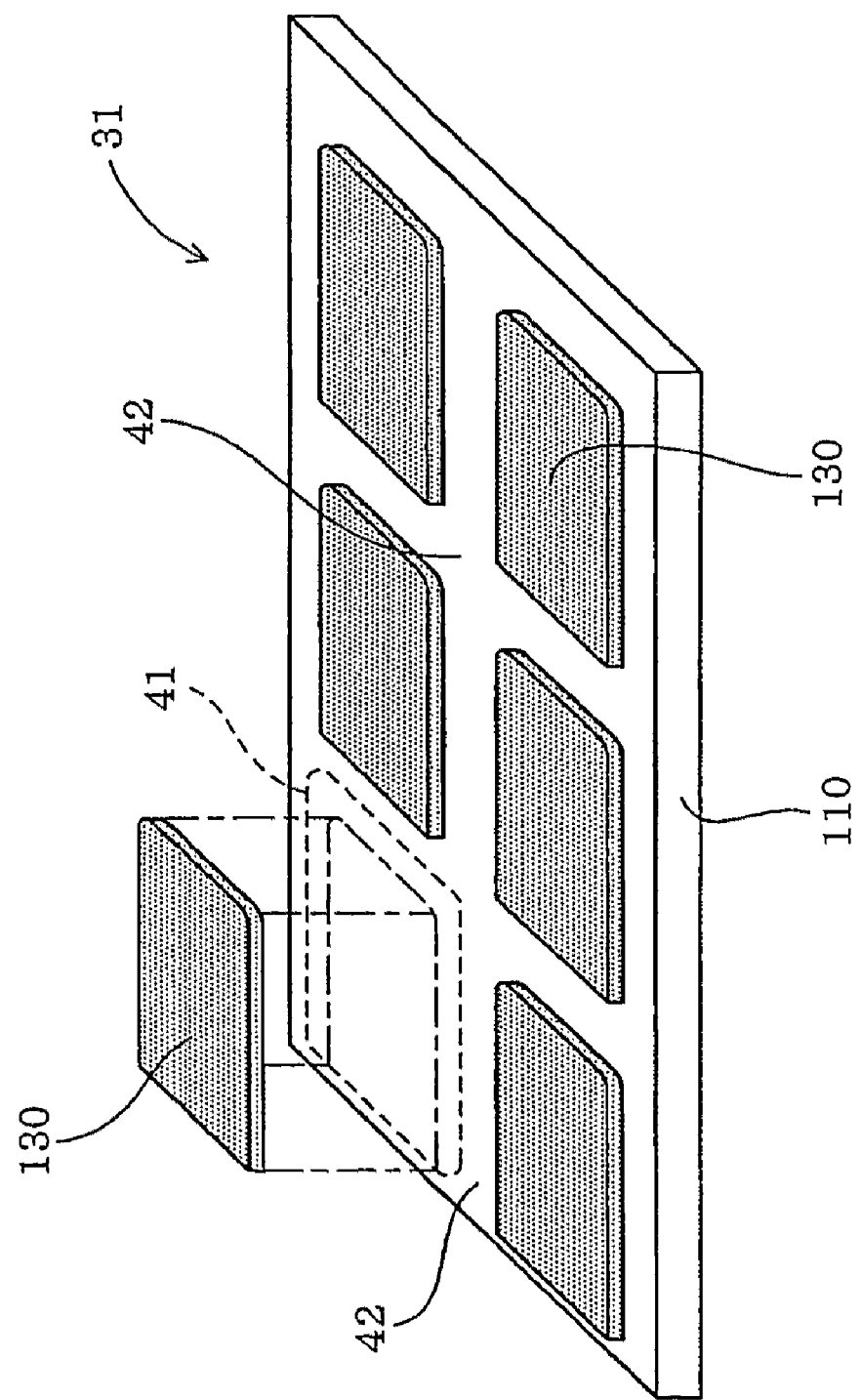
FIG. 21 is an explanatory view which shows a process of forming a first electrode-printed sheet according to the embodiment 2.
Figure 22:
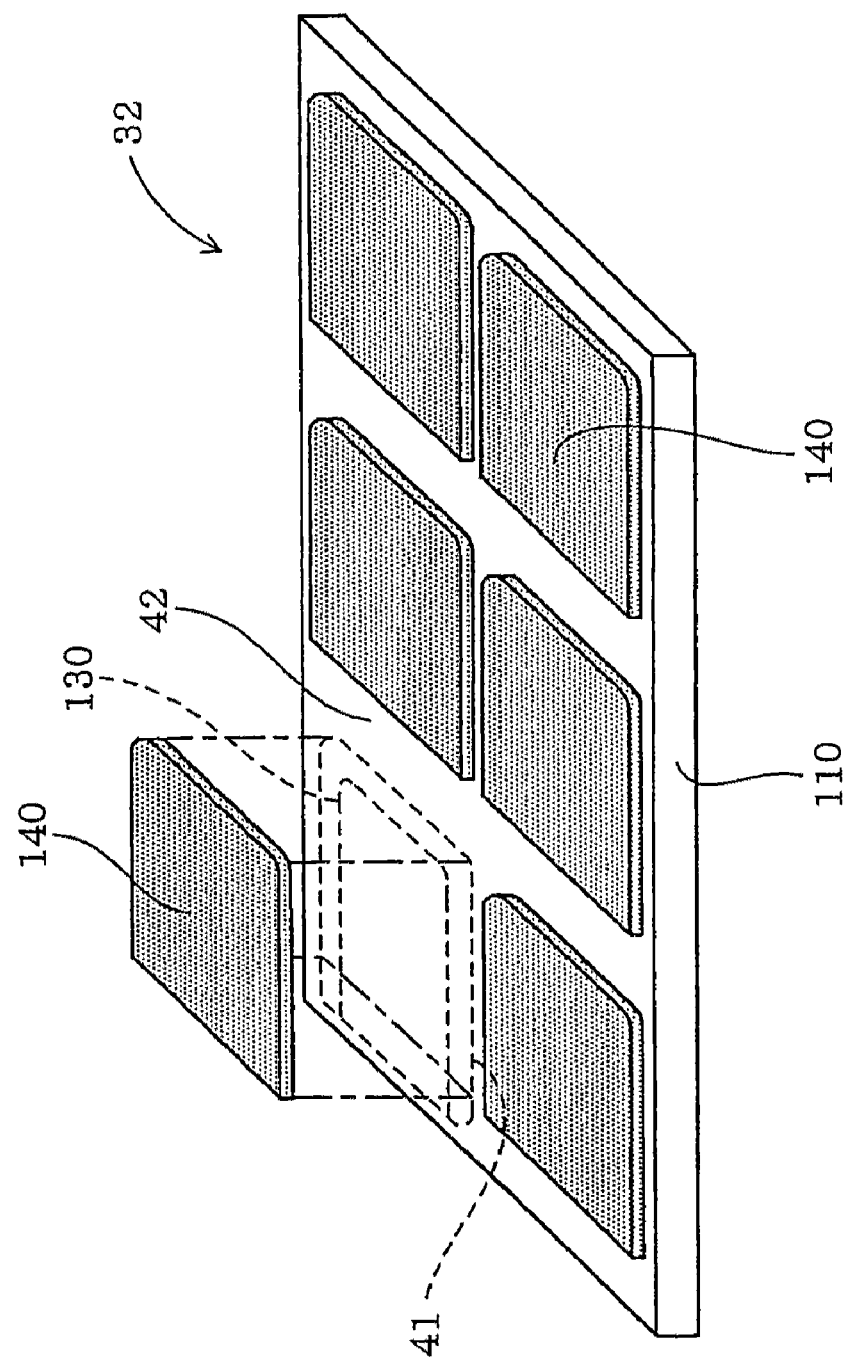
FIG. 22 is an explanatory view which shows a process of forming a second electrode-printed sheet according to the embodiment 2.
Figure 23:
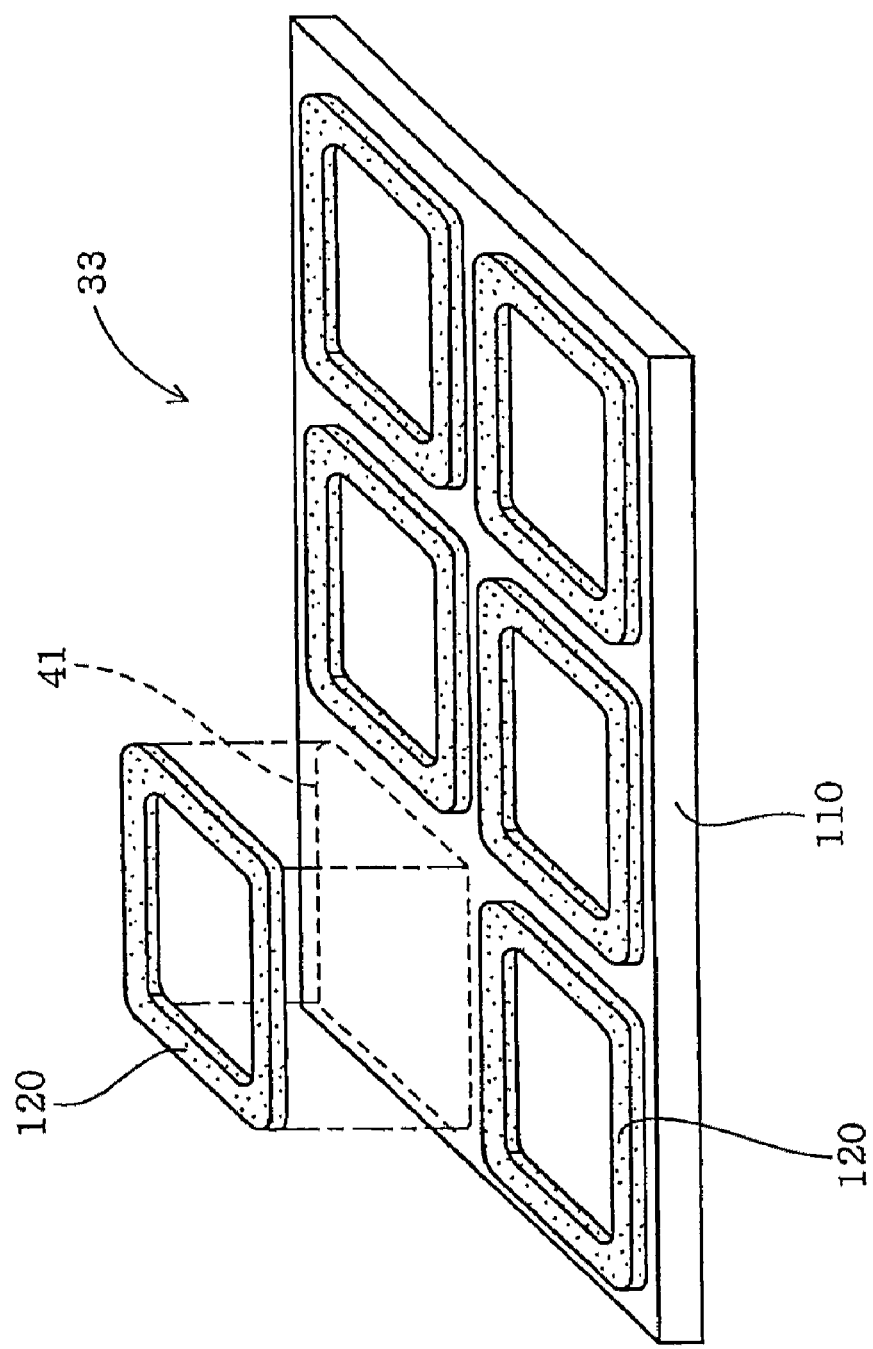
FIG. 23 is an explanatory view which shows a process of forming a burn-off slit-printed sheet according to the embodiment 2.

Next, as illustrated in FIGS. 21 and 22, electrode materials 130 and 140 which will be the inner electrode layers were printed on the green sheet 110. We formed two types of sheet; the first electrode-printed sheet 31 and the second electrode-printed sheet 32.

The formation of the electrode-printed sheets 31 and 32 will be described below more in detail.

The first electrode-printed sheet 31 was formed, as illustrated in FIG. 21, by printing the electrode material 130 on a section of each of the printing areas 41 of the green sheet 110 which will finally be the inner electrode portion 130.

The second electrode-printed sheet 41 was formed, as illustrated in FIG. 22, by printing the electrode material 140 on a section of each of printing areas 41 of the green sheet 110 which will finally be the inner electrode portion 141.

In the first and second electrode-printed sheets 31 and 32, the electrode materials 130 and 140 formed on the green sheets 110 are exposed to side surfaces different from each other.

In this embodiment, Ag/Pd alloy paste was used as the electrode materials 130 and 140. Ag, Pd, Cu, Ni, or Cu/Ni alloy may alternatively be used.

<Burn-Off Slit Printing Process>

In this embodiment, slits 11 and 12 (see FIGS. 18 to 20) were provided in the side surfaces of the ceramic laminate 15 of the stacked piezoelectric device 1 to be manufactured. The burn-off slit printing process, as illustrated in FIG. 23, was made to form the burn-off slit-printed sheet 33.

As illustrated in FIG. 23, the burn-off slit layer 120 was formed by a burn-off material which is to be burnt off in the firing process, so that it will be burnt out, on each printing area 41 of the green sheet 110, thereby forming the burn-off slit-printed sheet 33.

In this embodiment, carbon powder material which is small in thermal deformation and will keep the shape of grooves to be formed by the firing process precisely was used as the burn-off material to make the burn-off slit layer 120, Carbonized organic particles may alternatively be used. The carbonized organic particles may be made by carbonizing powder-like organic particles or grinding carbonized organic substance. As the organic substance, cereal grains such as cones, soya beans, or flour may be used to save the production costs.

In the electrode printing and burn-off slit printing processes, the electrode material and the burn-off material were printed to meet the above described relation between the recessed distance and the depth of the stress absorbing portion. Additionally, in the electrode printing and burn-off slit printing processes, as illustrated in FIGS. 21 to 23, the electrode material 130 and 140 and the burn-off slit layers 120 are printed so that they are located away from each other through air gaps 42 where portions of the green sheet 110 are to be cut in the following unit cutting process. Specifically, the printing is made to have the air gaps 42 between the adjacent printing areas 41 on the green sheet 110.

<Pressure Bonding Process>

Figure 24:
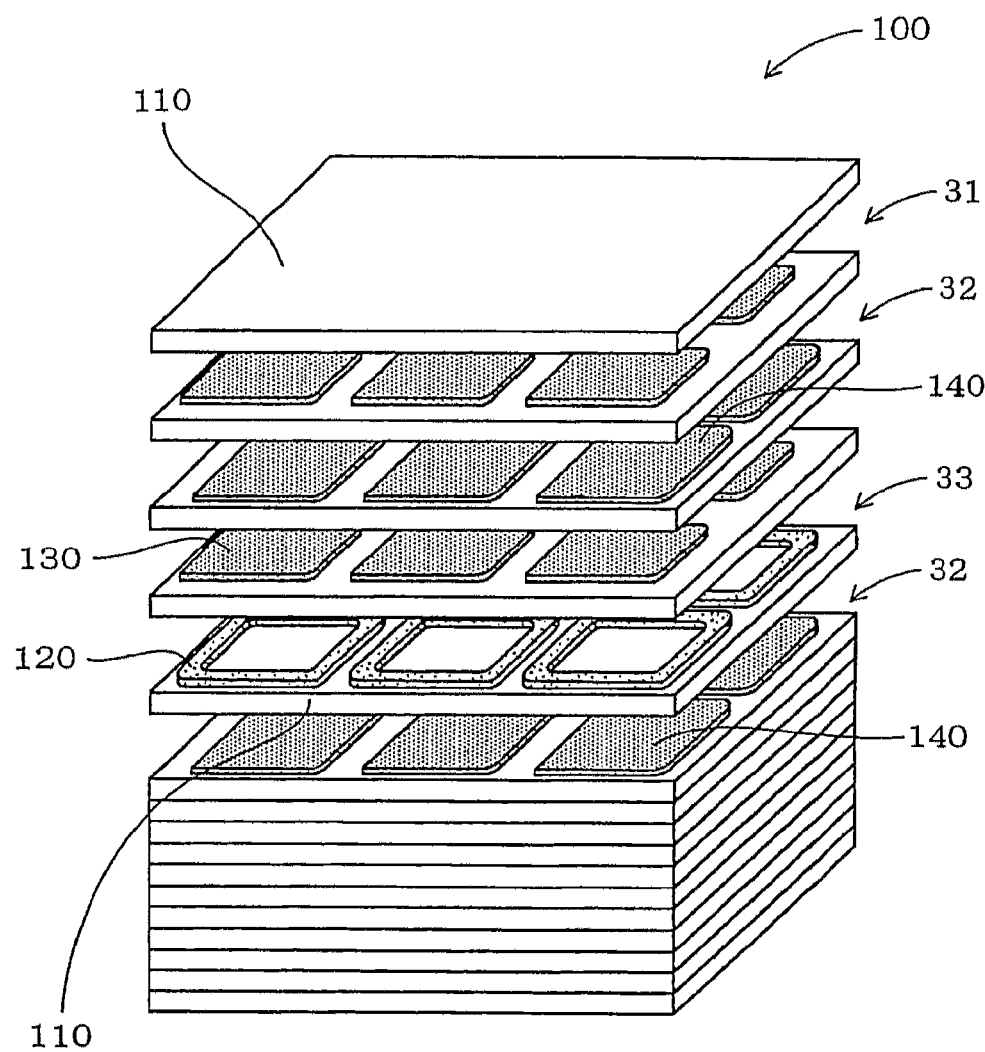
FIG. 24 is an explanatory view which shows a process of stacking electrode-printed sheets and burn-off slit-printed sheets according to the embodiment 2.

Next, the first electrode-printed sheet 31 and the second electrode-printed sheet 32, and the burn-off slit-printed sheets 33 were, as illustrated in FIG. 24, stacked in a given order so as to align the printing areas 41 in the laminating direction. Specifically, the first electrode-printed sheets 31 and the second electrode-printed sheets 32 were stacked alternately. Each of the burn-off slit-printed sheets 33 was inserted into the location where the above described slits are desired to be formed. Specifically, in this embodiment, the burn-off slit-printed sheet 33 was stacked on every stack of eleven layers made up of the first electrode-printed sheets 31 and the second electrode-printed sheets 32. The first electrode-printed sheets 31 and the second electrode-printed sheets 32 were stacked until a total number of them is 59. Green sheets on which the electrode material and the burn-off layers were not printed were disposed on both ends of the stack. The first electrode-printed sheets 31 and the second electrode-printed sheets 32 were stacked so that the electrode material 130 and the electrode material 140 were exposed alternately to the end surface which the printing areas face. The sheets stacked in this manner was heated at 100° C. and pressed at 50 MPa in the laminating direction to make a pre-stack 100. For the sake of convenience, FIG. 7 illustrates the pre-stack 100 which is smaller in number of stacked layers than actual.

<Stack Cutting Process>

Figure 25:
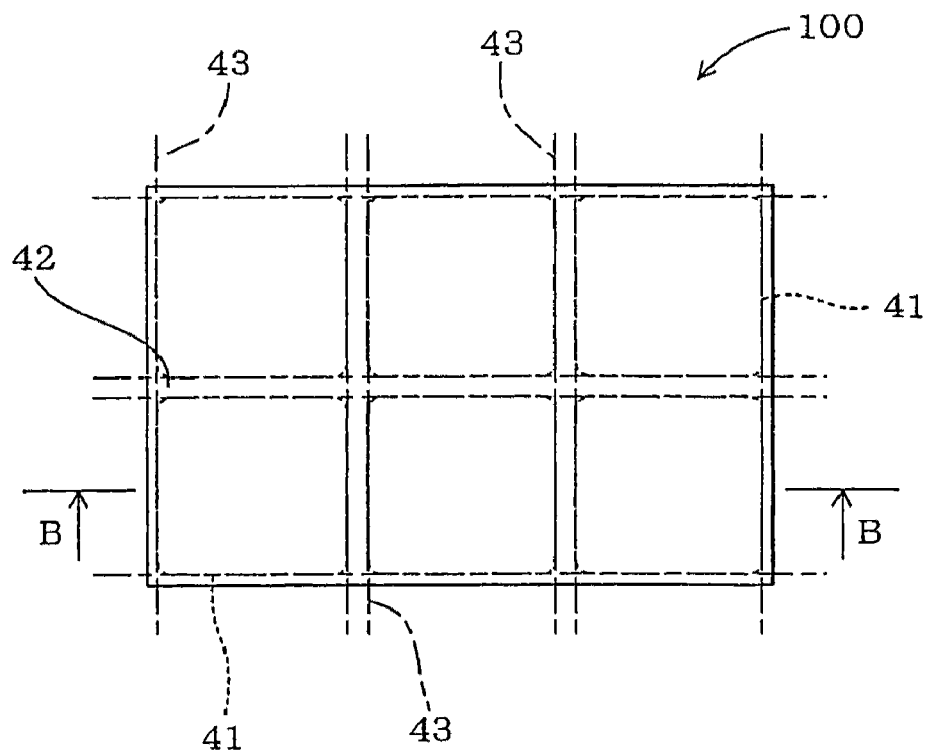
FIG. 25 is a top surface view of a pre-laminate according to the embodiment 2.
Figure 26:
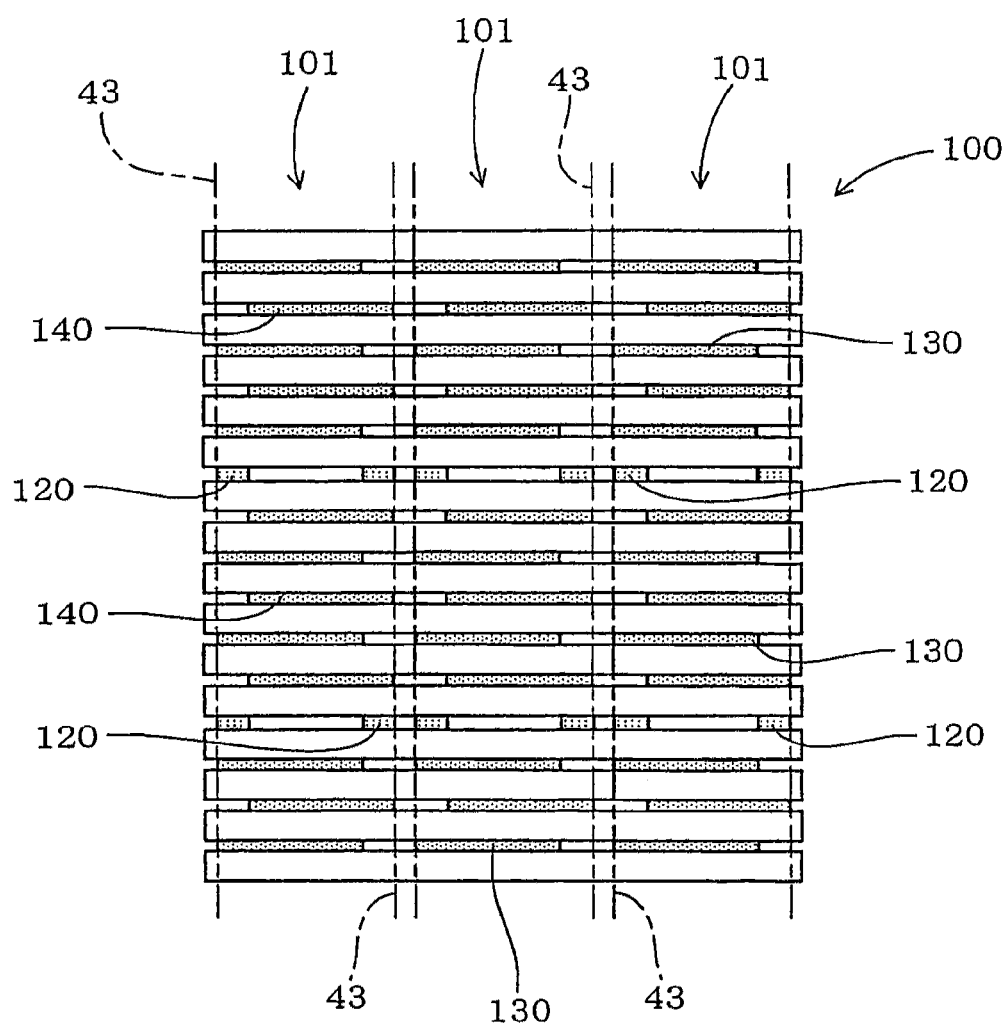
FIG. 26 is a cross sectional view showing a B-B sectional area in FIG. 25.
Figure 27:
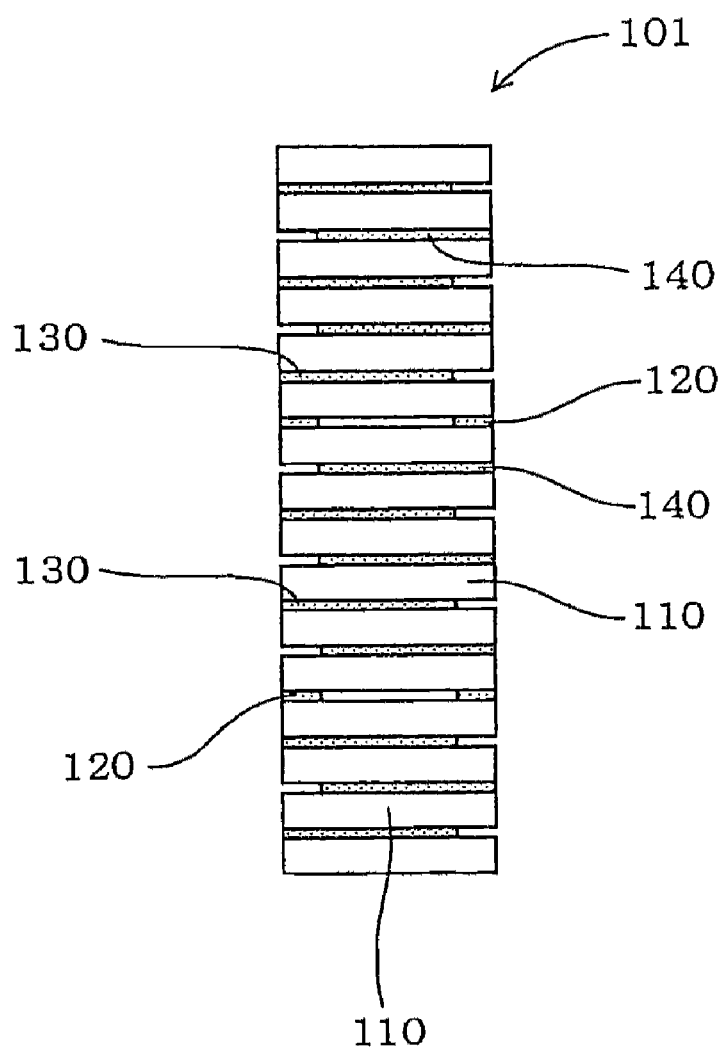
FIG. 27 is an explanatory view which shows a sectional structure of an intermediate laminate according to the embodiment 2.

Next, as illustrated in FIGS. 25 to 27, the pre-stack 100 were cut at the cutting positions 43 in the laminating direction to form the intermediate stacks 101.

The pre-stack 100 may be cut in the unit of the intermediate stacks 101 or in the unit of two or more of them. In this embodiment, the pre-stack 100 was cut in the unit of each of the intermediate stacks 101 so that each of the electrode materials 130 and 140 and the burn-off slit layers 120 were exposed to the side surfaces of the intermediate stack 101.

For the sake of convenience, FIGS. 26 and 27 illustrate the pre-stack 100 and the intermediate stacks 101 which are smaller in number of stacked layers than actual.

<Firing Process>

Next, binder resin contained in the green sheet 110 of the intermediate stacks 101 was removed thermally (degreased). This was achieved by heating the binder resin gradually up to 500° C. for eighty hours and keeping it for five hours.

Next, the degreased intermediate stacks 10 were fired. The firing was achieved by heating the intermediate stacks 10 gradually up to 1050° C. for twelve hours, keeping them for two hours, and then cooling them gradually.

In this manner, the ceramic laminate 15 is, as illustrated in FIGS. 18 to 20, made which has the stress absorbing portions 11 and 12 formed by the burning-off of the burn-off slit layers 120.

The stress absorbing portions 11 and 12 are defined by slit-like chambers formed in the entire circumferential surface of the ceramic laminate 15. As illustrated in FIGS. 18 to 10, the ceramic laminate 15 is made of the piezoelectric ceramic layers 10 formed by the sintered green sheets 110 and the inner electrode layers 13 and 14 formed by the electrode materials 130 and 140 which are stacked alternately.

After fired, the entire surface of the ceramic laminate 15 was polished to be 6 mm×6 mm square and 4.4 mm high. The side electrodes 17 and 18 were printed on the both side surfaces of the ceramic laminate 15. The inner electrodes 13 and 14 are connected electrically alternately to the side electrodes 17 and 18 respectively.

In the above manner, the stacked piezoelectric device 1, as illustrated in FIGS. 18 to 20, was made.

For the sake of convenience, FIGS. 18 and 19 illustrate the stacked piezoelectric device 1 which is smaller in number of stacked layers than actual.

In this embodiment, we made five kinds of stacked piezoelectric devices (samples E4 to E6, and samples C3 and C4) which were different in the recessed distance 143 or 133 of the recessed portion 142 (542) that is one of the recessed portions 132 (532) and 142 (542) of the two inner electrode layers 13 and 14 located across the stress absorbing portion 11 or 12 which is located on the same side surface as the stress absorbing portion 11 or 12 and in depth of the above stress absorbing portion 11 or 12.

Specifically, the sample E4 is, like the sample E1 in the embodiment 1, the stacked piezoelectric device in which the above described recessed distance minus depth of the stress absorbing portion, that is, the recessed distance of the recessed portion of the adjacent layer minus the depth of the stress absorbing portion which is located on the same side surface as that stress absorbing portion and placed located closest to that stress absorbing portion in the laminating direction is 0.2 mm on an average We measured a minimum value of the above recessed distance minus the depth of the stress absorbing portion in the sample E1 and found that it is 0.04 mm. Therefore, in the sample E1, the recessed distance 133 or 143 of the recessed portions 532 or 542 of the adjacent electrode layer 53 or 54 which is located on the same side surface of the stress absorbing portion 12 or 11 is greater than the depth of the stress absorbing portion 12 or 11 by at least 0.04 mm or more.

The samples E5 and E6 are the stacked piezoelectric devices in which averaged values of the above described recessed distance minus depth of the stress absorbing portion are 0.4 mm and 0.6 mm, and minimum values thereof are 0.25 mm and 0.52 mm, respectively.

The samples C3 and C4 are the stacked piezoelectric devices in which averaged values of the above described recessed distance minus depth of the stress absorbing portion is 0.03 mm and −0.22 mm, and minimum values thereof are −0.05 mm and −0.33 mm, respectively.

We measured the recessed distances of all the recessed portions of the inner electrode layers connected to the positive side electrode of each of the samples. The averages and ranges (variations) thereof are shown in table 2. Similarly, we measured the recessed distances of all the recessed portions of the inner electrode layers connected to the negative side electrode of each of the samples. The averages and ranges (variations) thereof are also shown in table 2.

We also measured the depth of all the stress absorbing portions exposed to the same side surface (i.e., the side surface with the positive side electrode). The averages and ranges (variations) are shown in table 2. Similarly, we also measured the depth of all the stress absorbing portions exposed to the same side surface (i.e., the side surface with the negative side electrode). The averages and ranges (variations) are shown in table 2.

Next, we measured the durability of these stacked piezoelectric devices (i.e., the samples E4 to E6 and samples C3 and C4) in the same manner as in the embodiment 1.

portion. The samples C3 and C4 are found from table 2 to have a service life much shorter than that of the samples E4 to E6.

TABLE 2

| Sample No. | Recessed distance on the positive side (mm) | | Depth of stress absorbing portion on positive side (mm) | | Recessed distance on negative side (mm) | | Depth of stress absorbing portion on negative side (mm) | | Recessed distance-depth of stress absorbing portion (mm) | | Life (h) |
|---|---|---|---|---|---|---|---|---|---|---|---|
| | Average | Range | Average | Range | Average | Range | Average | Range | Average | Minimum | |
| E4 | 0.42 | 0.25-0.75 | 0.56 | 0.48-0.68 | 0.43 | 0.23-0.74 | 0.55 | 0.46-0.67 | 0.2 | 0.04 | >500 |
| E5 | 0.45 | 0.21-0.93 | 0.55 | 0.45-0.66 | 0.44 | 0.23-0.95 | 0.53 | 0.41-0.63 | 0.41 | 0.25 | >500 |
| E6 | 0.48 | 0.22-1.15 | 0.53 | 0.46-0.69 | 0.44 | 0.25-1.16 | 0.56 | 0.43-0.69 | 0.62 | 0.52 | >500 |
| C3 | 0.45 | 0.24-0.59 | 0.53 | 0.42-0.61 | 0.47 | 0.23-0.62 | 0.57 | 0.43-0.70 | 0.03 | −0.05 | 250 |
| C4 | 0.41 | 0.25-0.46 | 0.56 | 0.43-0.70 | 0.40 | 0.25-0.45 | 0.52 | 0.46-0.67 | −0.22 | −0.33 | 200 |

Table 2 shows that any of the samples E4 to E6 and C3 and C4 meets the relation of the average of all the recessed distances<the average of the depths of all the stress absorbing portions.

Comparing between the depths of the stress absorbing portions 11 and 12 lying at any locations and the recessed distances 133 and 143 of the recessed portions 132 (532) and 142 (542) of the inner electrode layers 13 (53) and 14 (54) located adjacent each other across the stress absorbing portions 11 and 12 between the samples E4 to E6, as viewed in the cross-section of the stacked piezoelectric device in the laminating direction, it is found from table 2 that averaged values of the recessed distances 143 and 133 of the recessed portions 142 (542) and 132 (532) of the inner electrode layers 13 (53) and 14 (54) located across the stress absorbing portions 11 and 12 are greater than the depths 111 and 121 of the stress absorbing portions 11 and 12 lying on the same side surfaces as the recessed portions 142 (542) and 132 (532) by 0.2 mm or more, respectively, and minimum values thereof are greater than them by 0.04 mm ore more, respectively. Additionally, the samples E4 to E6 each have the separate portions 5 which are defined by an interval in a direction perpendicular to the laminating direction between the outer peripheral ends 539 and 549 of the inner electrode portions 531 and 541 of the adjacent electrode layers 53 and 54 and the top ends 122 and 112 of the stress absorbing portions 12 and 11 located on the same side surfaces as the recessed portions 532 and 542 of the adjacent electrode layers 53 and 54, respectively (see FIG. 31). Therefore, the samples E4 to E6 according to this embodiment in which the piezoelectric ceramic layers 10 equipped with the stress absorbing portions 11 and 12 serve as drive layers reduce or avoid the application of excessive electric field to the stress absorbing portions 11 and 12 and found from table 2 to have a service life two times longer than that of comparative examples (i.e., the samples C3 and C4).

Table 2 also shows that in the sample C3, the averaged value of the recessed distances of the recessed portions of the adjacent electrode layers is greater than the depths of the stress absorbing portions by 0.03 mm, but the sample C3 has a portion where the recessed distance is smaller than the depth of the stress absorbing portion by 0.05 mm.

Table 2 also shows that in the sample C5, the averaged value of the recessed distances of the adjacent electrode layers and a minimum value thereof are smaller than the depth of the stress absorbing portion.

Therefore, in the samples C3 and C4, an excessive electric field may be applied to at least the top of the stress absorbing As apparent from the above, it is possible to provide the stacked piezoelectric device (samples E4 to E6) which avoids the drop in insulation resistance and is excellent in durability without sacrificing the ability of deformation thereof.

Figure 28:
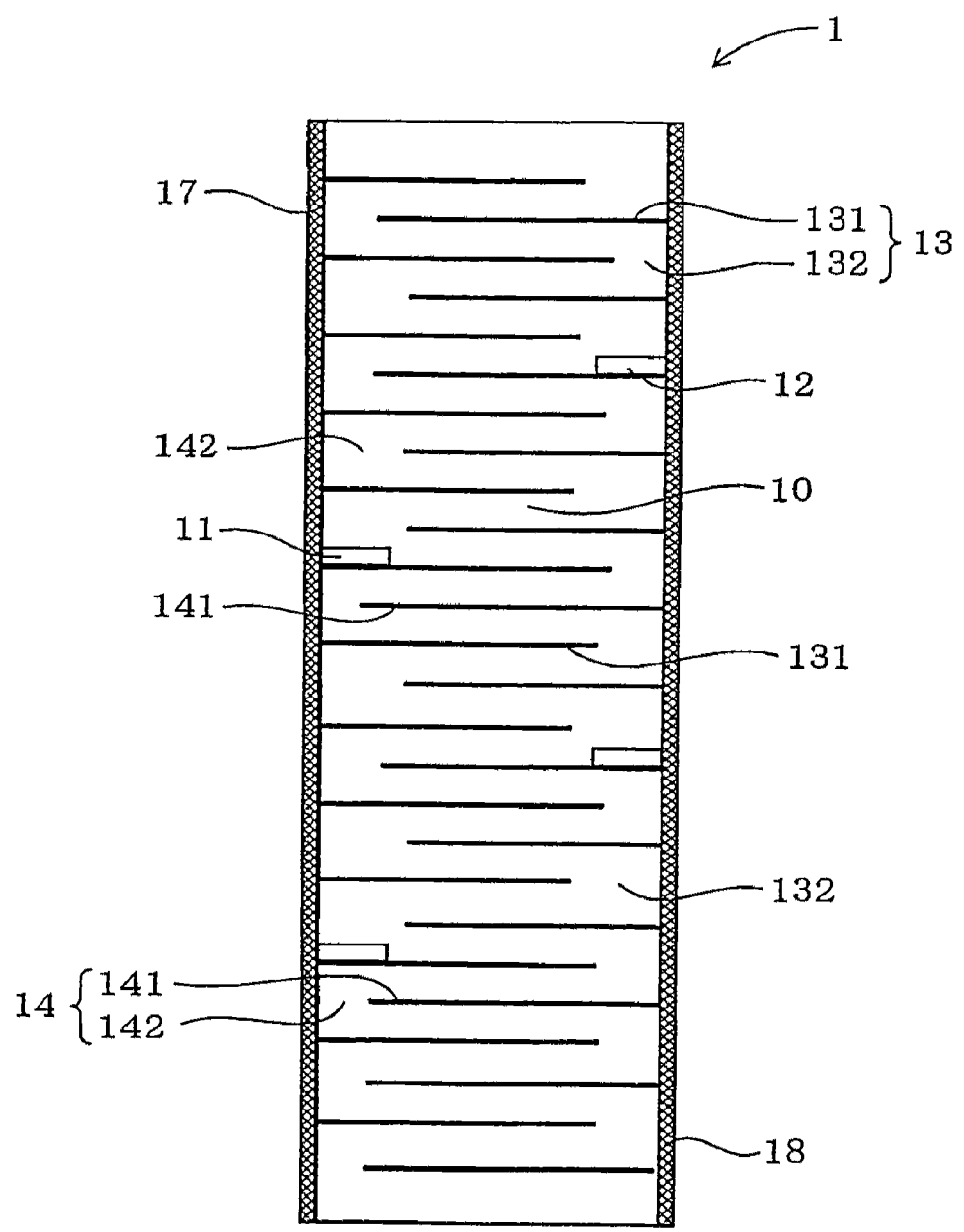
FIG. 28 is an explanatory view which shows a stacked piezoelectric device according to the embodiment 2 in which stress absorbing portions alternately exposed to different side surfaces are formed in substantially the same layers as inner electrode layers.

In this embodiment, the stress absorbing portions 11 and 12 are formed in the piezoelectric ceramic layers 10 between the inner electrode layers 13 and 14 (see FIG. 19), but may alternatively be formed, as illustrated in FIG. 28, in substantially the same layers as the inner electrode layers 13 and 14. In this case, the stress absorbing portions 11 and 12 are not formed in the recessed portions 132 and 142 of the inner electrode layers 13 and 14, but may be formed so as to be exposed to the side surfaces on which the side electrodes 17 and 18 are connected electrically to the inner electrode portions 131 and 141.

(Embodiment 3)

Next, the stacked piezoelectric device according to the embodiment of the invention will be described using FIGS. 32 to 35.

Figure 32:
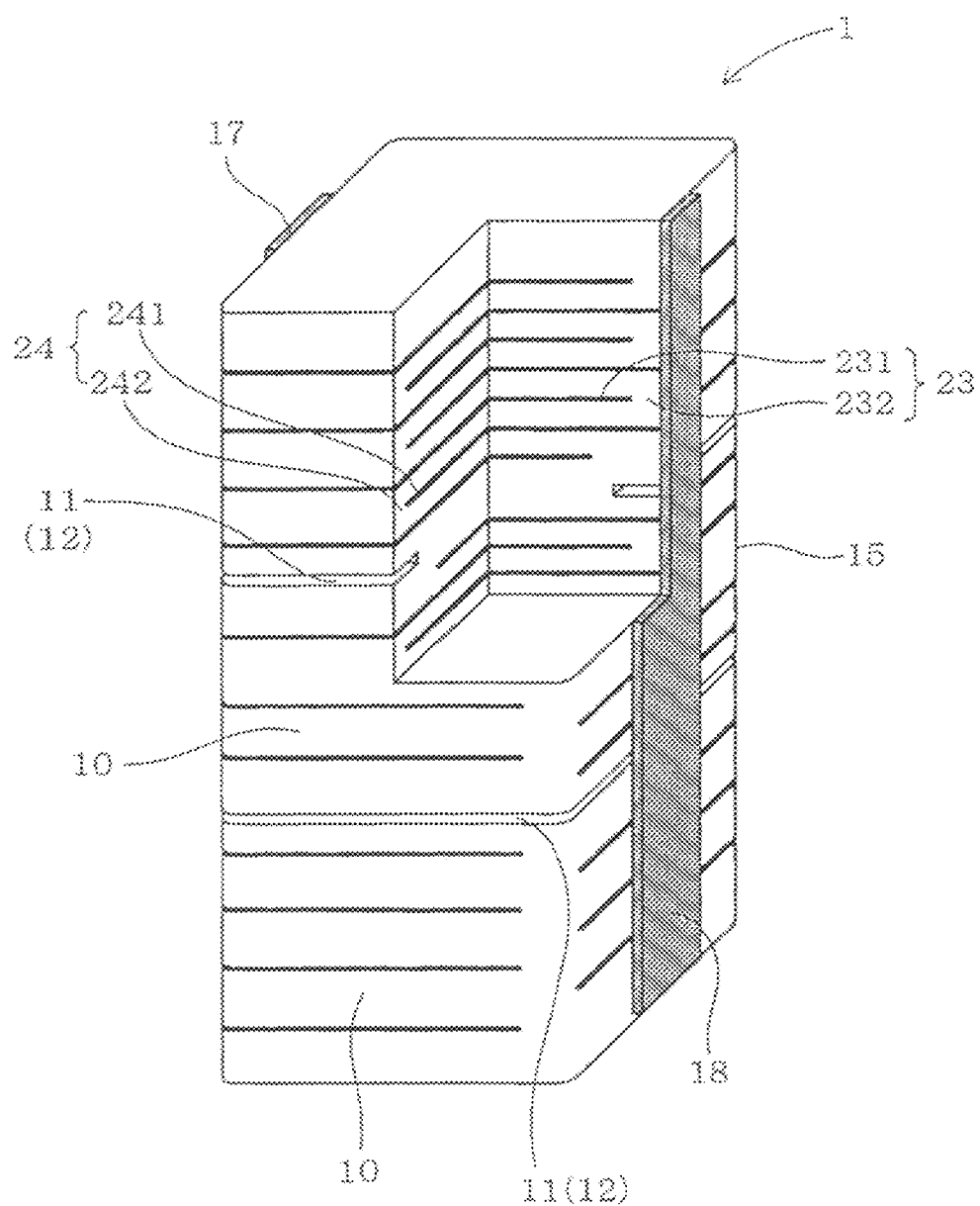
FIG. 32 is an explanatory view which shows the structure of a stacked piezoelectric device according to the embodiment 3.
Figure 33:
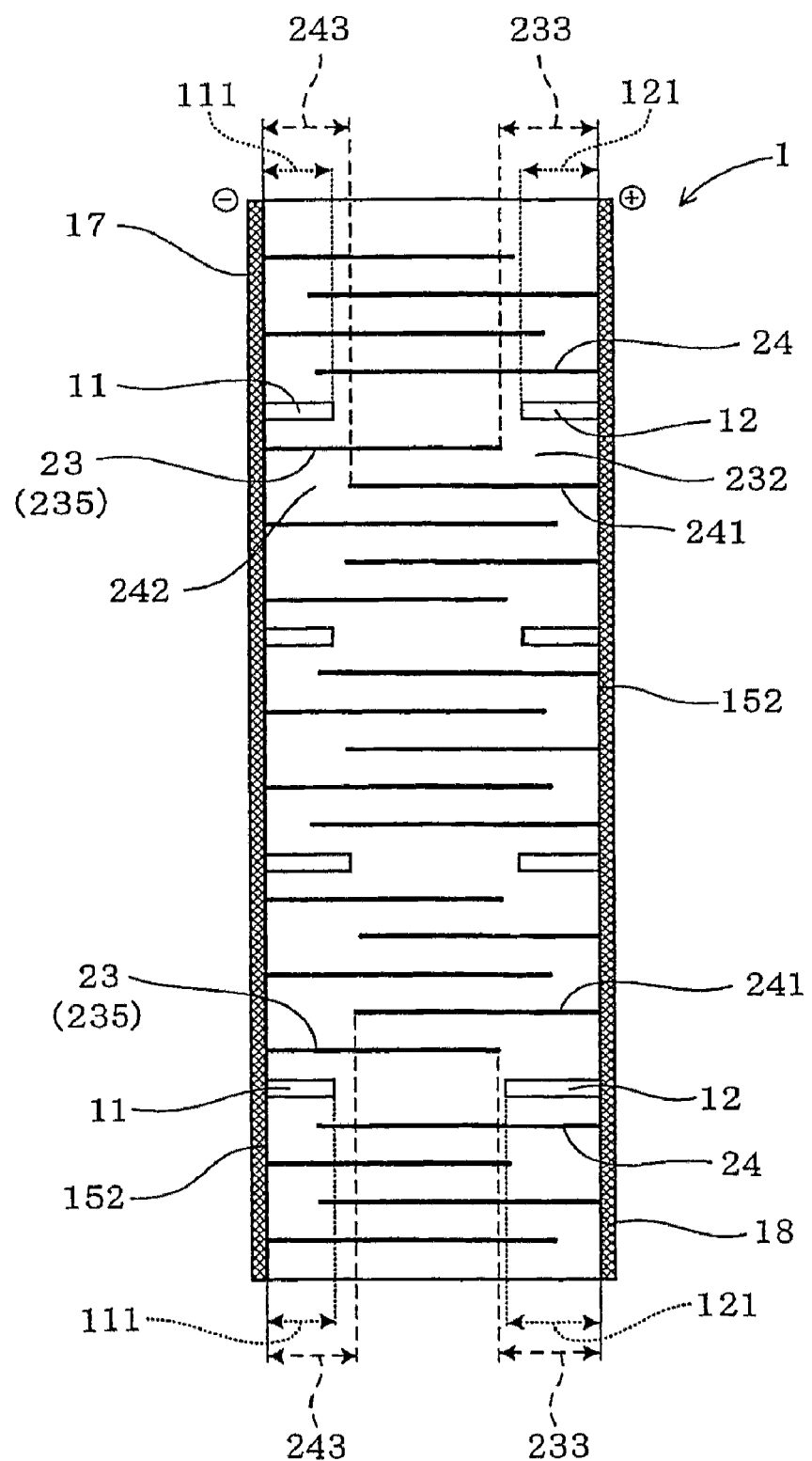
FIG. 33 is an explanatory view which shows a sectional structure of a stacked piezoelectric device according to the embodiment 3 and a relation between the depth of a stress absorbing portion and a recessed distance of an inner electrode layer.
Figure 34:
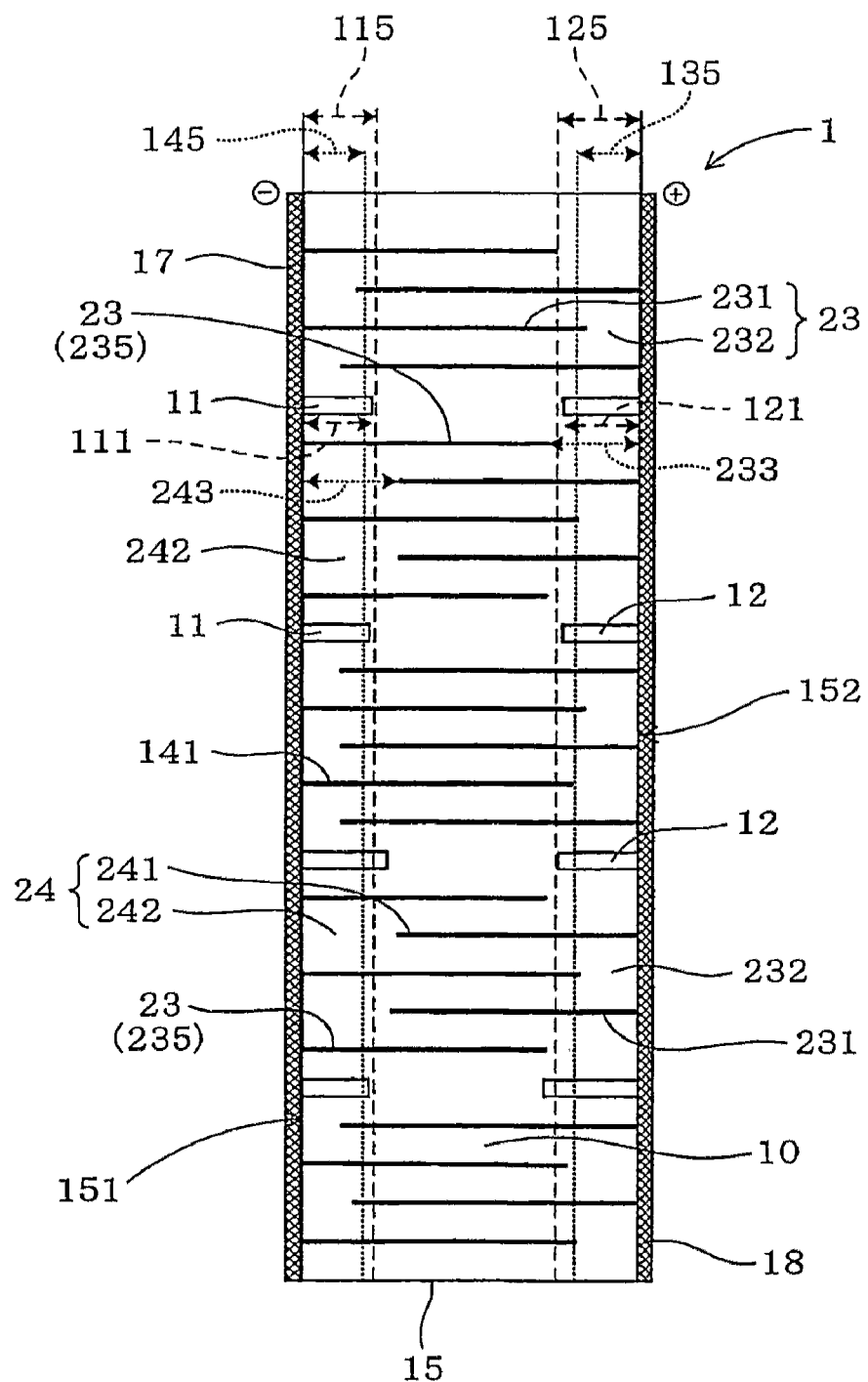
FIG. 34 is an explanatory view which shows a sectional structure of a stacked piezoelectric device according to the embodiment 3 and a relation between an average of depths of stress absorbing portions and an average of recessed distances of inner electrode layers.
Figure 35:
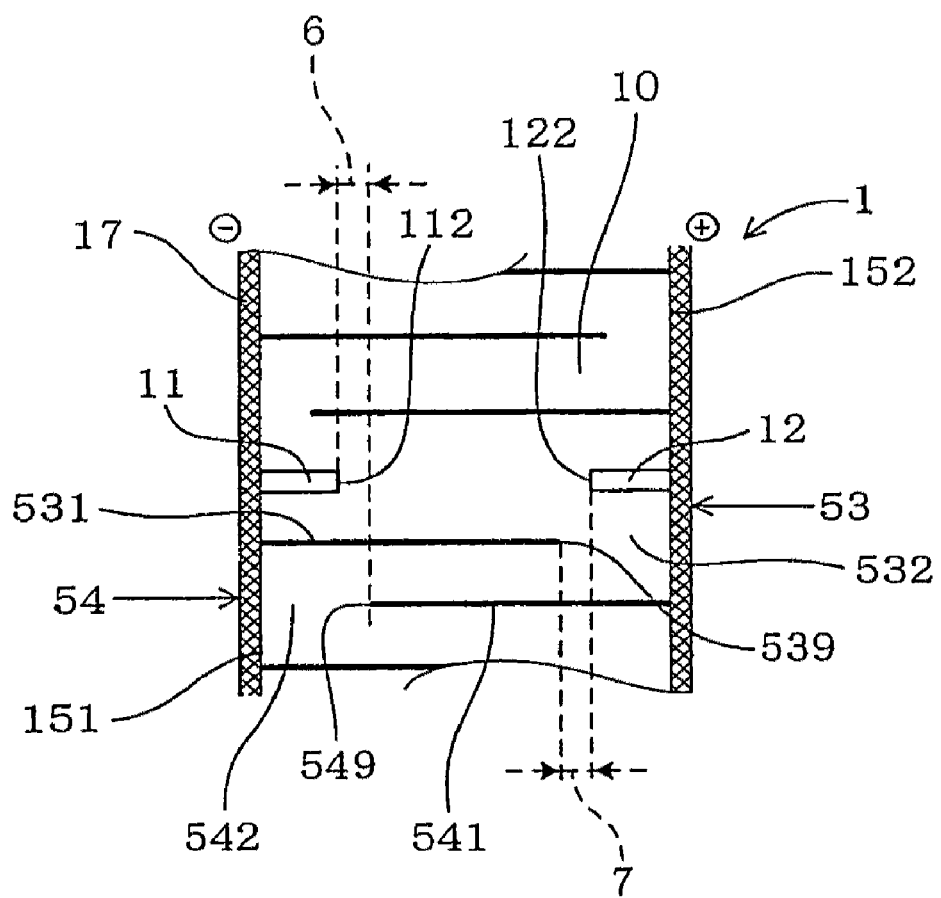
FIG. 35 is an explanatory view which shows a sectional structure near a stress absorbing portion of a stacked piezoelectric device in which separation portion are formed according to the embodiment 3.

As illustrated in FIGS. 32 to 34, the stacked piezoelectric device 1 of this embodiment, like in the embodiment 1, has the ceramic laminate 15 made by stacking the plurality of piezoelectric layers 10 and the plurality of inner electrode layers 23 and 24 alternately and the pair of side electrodes 17 and 18 formed on side surfaces of the ceramic laminate 15. The inner electrode layers 23 and 24 include the conductive inner electrode portions 231 and 241 and the recessed portions 232 and 242 defined by retreating outer peripheral ends of the inner electrode portions 231 and 241 inwardly from the outer peripheral surface of the ceramic laminate 15. The inner electrode layers 23 and 24 are connected electrically to side electrodes 17 and 18 alternately which are different from each other.

The ceramic laminate 15 has the stress absorbing portions 11 and 12 which are easier to deform in shape than the piezoelectric ceramic layers 10 in slit-like areas recessed inwardly from the side surfaces of the ceramic laminate 15.

In this embodiment, the stress absorbing portions 11 (12) are slit-like grooves (chambers) recessed inwardly from the side surface of the ceramic laminate 15. The stress absorbing portions 11 (12) extend in the entire outer peripheral surface of the ceramic laminate 15 in the circumferential direction thereof. The stress absorbing portions 11 (12) are formed in the piezoelectric layers 10 between the inner electrode layers 13 and 14 and located away from the inner electrode portions 231 and 241 or the recessed portions 232 and 242.

As viewed in the cross section of the stacked piezoelectric device 1 in FIG. 34, the average 115 (125) of depths of all the stress absorbing portions 11 (12) exposed to the same side surface 151 (152) of the ceramic laminate 15 is greater than the average 145 (135) of the recessed distances of all the recessed portions 242 (232) formed in the same side surface as the stress absorbing portions 11 (12).

As viewed in the cross section of the stacked piezoelectric device 1 in the laminating direction in FIGS. 33 and 34, if the stress absorbing portions formed on the side of the negative side electrodes 17 are referred to as the negative electrode side absorbing portions 11, and one of adjacent two of the inner electrode layers 23 and 24 located across each of the negative side electrodes 11 which is connected electrically to the negative side electrode 17 is referred to as the reference electrode layer 235, the recessed distance 243 of the recessed portion 242 of each of the inner electrode layers 24 having the inner electrode portions 241 which is located adjacent the negative side absorbing portion 11 across the reference electrode layer 235 in the laminating direction and which is connected to the positive side electrode 18 is greater than the depth of the negative electrode side absorbing portions 11. In other words, the recessed distance 243 of the recessed portion 242 of the inner electrode layer 24 which has the inner electrode portion 241 and is located closest to each of the reference electrode layers 235, that is, the recessed distance 243 of the recessed portion 242 of each of the inner electrode layers 241 which is one of the two inner electrode layers which are located across and adjacent each of the reference electrode layers 235 and connected to the positive side electrode 18 and which is located opposite the negative side stress absorbing portion 11 across the reference electrode layer 235 is greater than the depth 111 of the negative side absorbing portion 11 next to the reference electrode layer 235.

Additionally, if, as viewed in the cross section of the stacked piezoelectric device 1 in the laminating direction in FIG. 15, the stress absorbing portions formed on the side of the positive side electrodes 18 are referred to as the positive electrode side absorbing portions 12, the recessed distance 233 of the recessed portion 232 of one of the inner electrode layers 23 and 24 located adjacent each other across one of the positive electrode side absorbing portions 12 which is connected to the negative side electrode 17 is greater than the depth 121 of the positive electrode side absorbing portions 12. In other words, the recessed distance 233 of the recessed portion 232 of one of the inner electrode layers 23 and 24 located adjacent each other across one of the positive electrode side absorbing portions 12 which is connected to the negative side electrode 17 is greater than the depth 121 of the positive electrode side absorbing portions 12 located adjacent the inner electrode layer 23.

Next, a production method of the stacked piezoelectric device of this embodiment will be described below using FIGS. 36 to 42, in this embodiment, the stacked piezoelectric device is, like in the embodiment 1, made by a green sheet making process, an electrode printing process, a burn-off slit printing process, a pressure bonding process, a stack cutting process, and a firing process.

Next, each process of the production method will be described below.

<Green Sheet Making Process>

First, we prepared ceramic raw material powder such as lead zirconate titanate (PZT) which is a piezoelectric material. Specifically, we prepared $Pb_3O_4$, $SrCO_3$, $ZrO_2$, $TiO_2$, $Y_2O_3$, and $Nb_2O_5$ as starting raw materials, weighted them at a stoichiometric proportion which was selected to produce a target composition $PbZrO_3$—$PbTiO_3$—$Pb(Y1/2Nb1/2)O_3$, wet-blended, and calcined them at 850° C. for 5 hours. Next, we wet-ground the calcined powders using a pearl mill. We dried the calcined ground powders (Grain Size (D50) 0.7±0.05 μm) and blended with solvent, binder, plasticizer, and dispersing agent in a ball mill to make slurry. We agitated, vacuum-degassed, and adjusted the slurry in viscosity.

We applied the slurry on a carrier film using the doctor blade method to make elongated green sheet having a thickness of 80 μm. We cut the green sheet into a desired size to make wide green sheet 110, as illustrated in FIGS. 36 to 38.

The formation of the green sheet may alternatively be achieved by the extrusion molding or any other manners as well as the doctor blade method.

<Electrode Printing Process>

Figure 36:
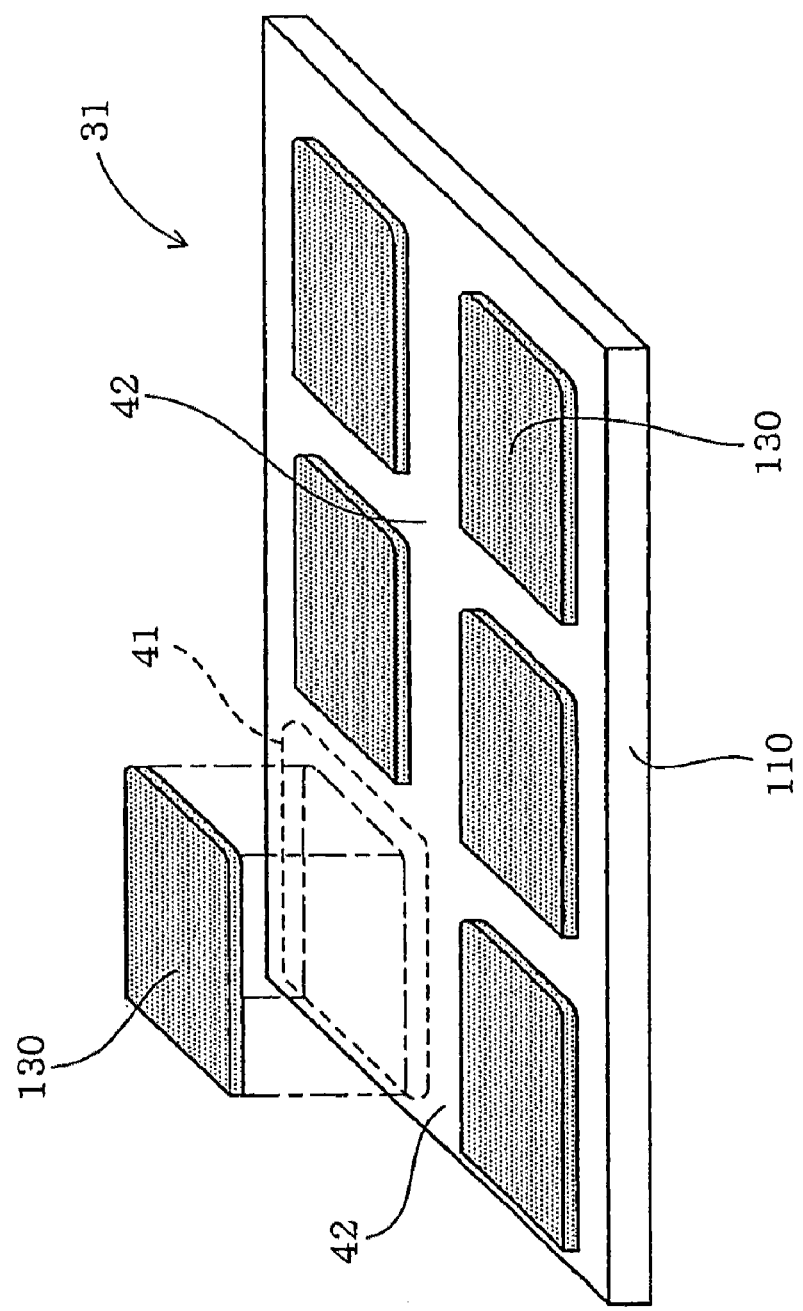
FIG. 36 is an explanatory view which shows a process of forming a first electrode-printed sheet according to the embodiment 3.
Figure 37:
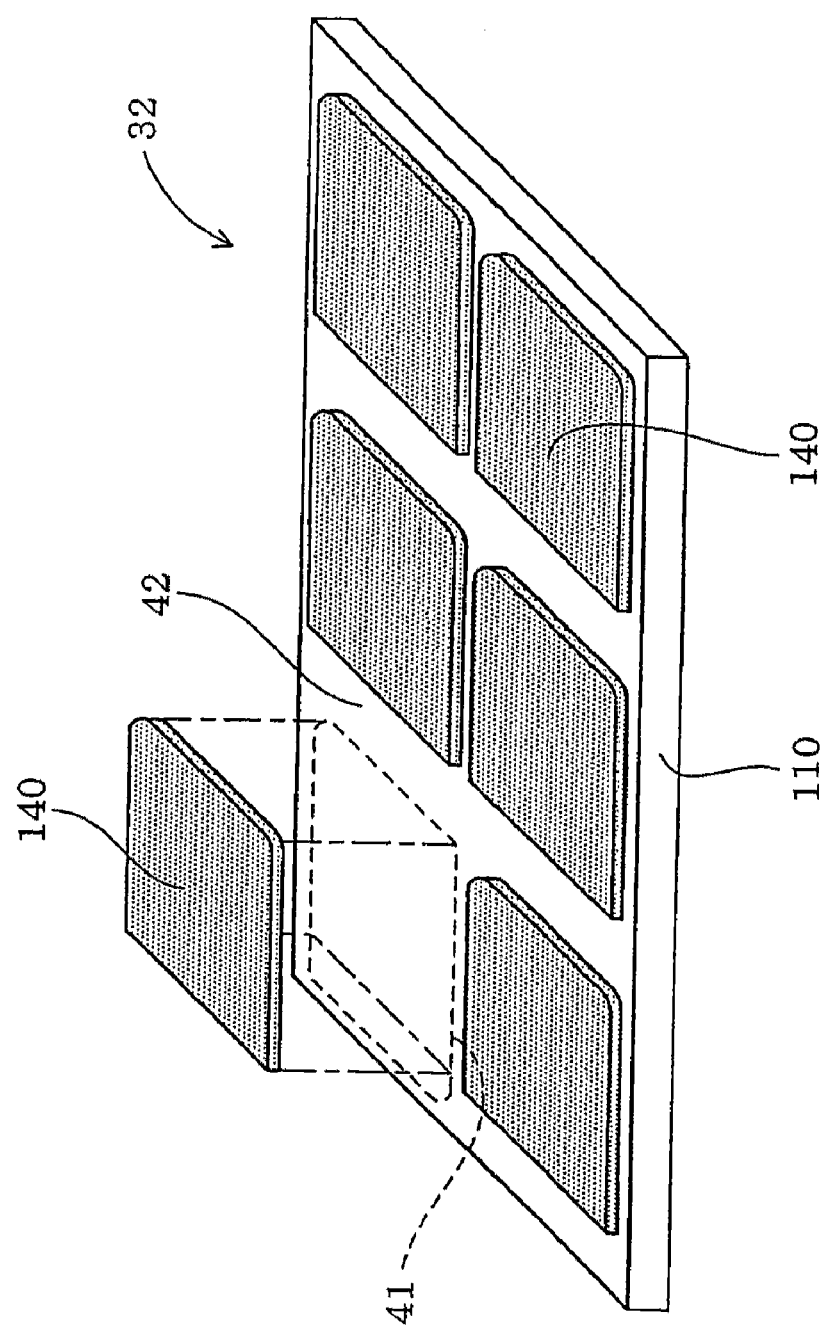
FIG. 37 is an explanatory view which shows a process of forming a second electrode-printed sheet according to the embodiment 3.
Figure 38:
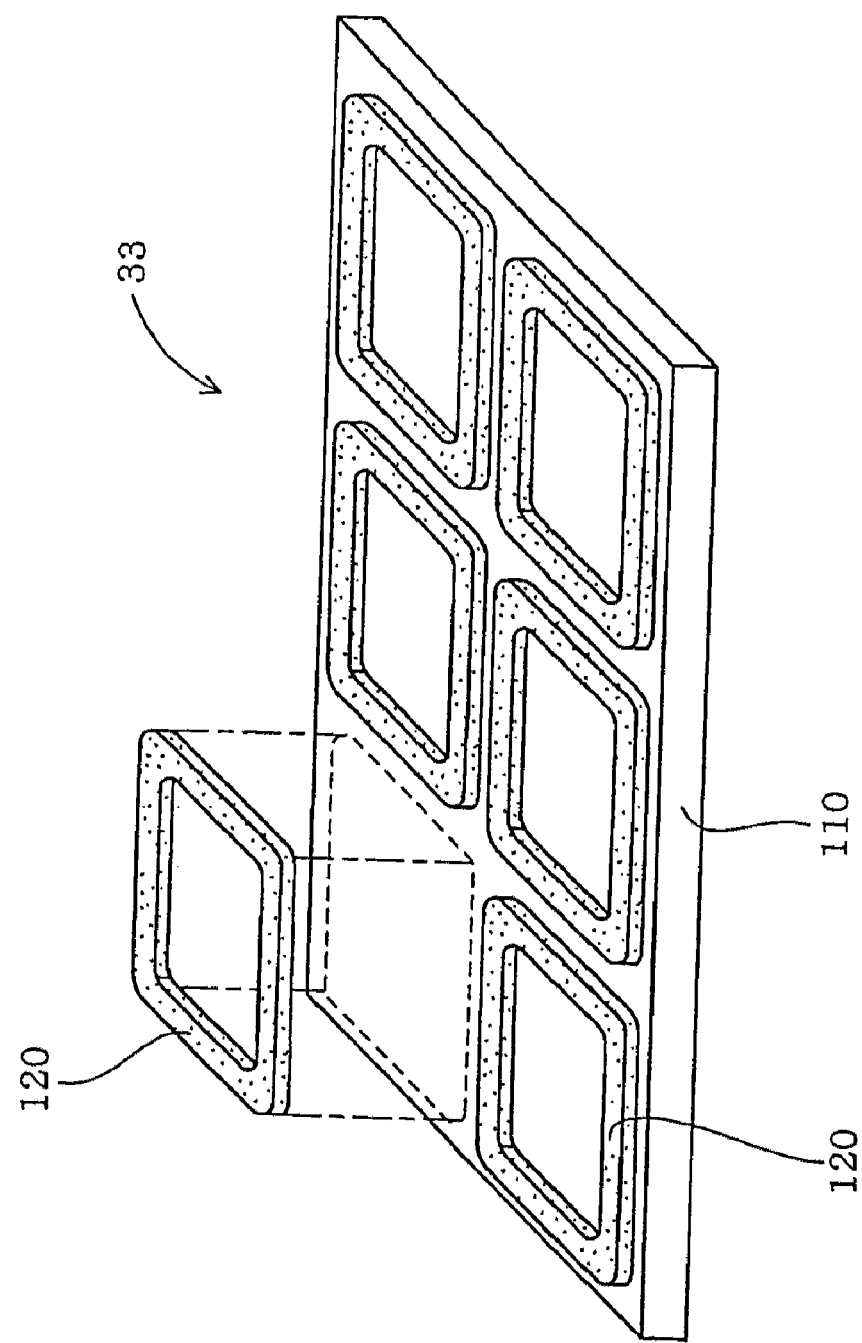
FIG. 38 is an explanatory view which shows a process of forming a burn-off slit-printed sheet according to the embodiment 3.

Next, as illustrated in FIGS. 36 and 37, electrode materials 130 and 140 which will be the inner electrode layers were printed on the green sheet 110. We formed two types of sheet: the first electrode-printed sheet 31 and the second electrode-printed sheet 32.

The formation of the electrode-printed sheets 31 and 32 will be described below more in detail.

The first electrode-printed sheet 31 was Wined, as illustrated in FIG. 37, by printing the electrode material 130 on a section of each of the printing areas 41 of the green sheet 110 which will finally be the inner electrode portion 231.

Like the first electrode-printed sheet, the second electrode-printed sheet 41 was formed, as illustrated in FIG. 36, by printing the electrode material 140 on a section of each of printing areas 41 of the green sheet 110 which will finally be the inner electrode portion 241.

In the first and second electrode-printed sheets 31 and 32, the electrode materials 130 and 140 formed on the green sheets 110 are exposed to side surfaces different from each other.

In this embodiment, Ag/Pd alloy paste was used as the electrode materials 130 and 140. Ag, Pd, Cu, Ni, or Cu/Ni alloy may alternatively be used.

<Burn-Off Slit Printing Process>

In this embodiment, slits 11 and 12 (see FIGS. 32 to 35) were provided in the side surfaces of the ceramic laminate 15 of the stacked piezoelectric device 1 to be manufactured. The burn-off slit printing process, as illustrated in FIG. 38, was made to form the burn-off slit-printed sheet 33.

As illustrated in FIG. 38, the burn-off slit layer 120 was formed by a burn-off material which is to be burnt off in the firing process, so that it will be burnt off, on each printing area 41 of the green sheet 110, thereby forming the burn-off slit-printed sheet 33.

In this embodiment, carbon powder material which is small in thermal deformation and will keep the shape of grooves to be formed by the firing process precisely was used as the burn-off material to make the burn-off slit layer 120. Carbonized organic particles may alternatively be used. The carbonized organic particles may be made by carbonizing powder-like organic particles or grinding carbonized organic substance. As the organic substance, cereal grains such as cones, soya beans, or flour may be used to save the production costs.

In the electrode printing and burn-off slit, printing processes, the electrode material and the burn-off material were printed to meet the above described relation between the recessed distance and the depth of the stress absorbing portion. Additionally, in the electrode printing and burn-off slit printing processes, as illustrated in FIGS. 36 to 38, the electrode material 130 and 140 and the burn-off slit layers 120 are printed so that they are located away from each other through air gaps 42 where portions of the green sheet 110 are to be cut in the following unit cutting process. Specifically, the printing is made to have the air gaps 42 between the adjacent printing areas 41 on the green sheet 110.

<Pressure Bonding Process>

Figure 39:
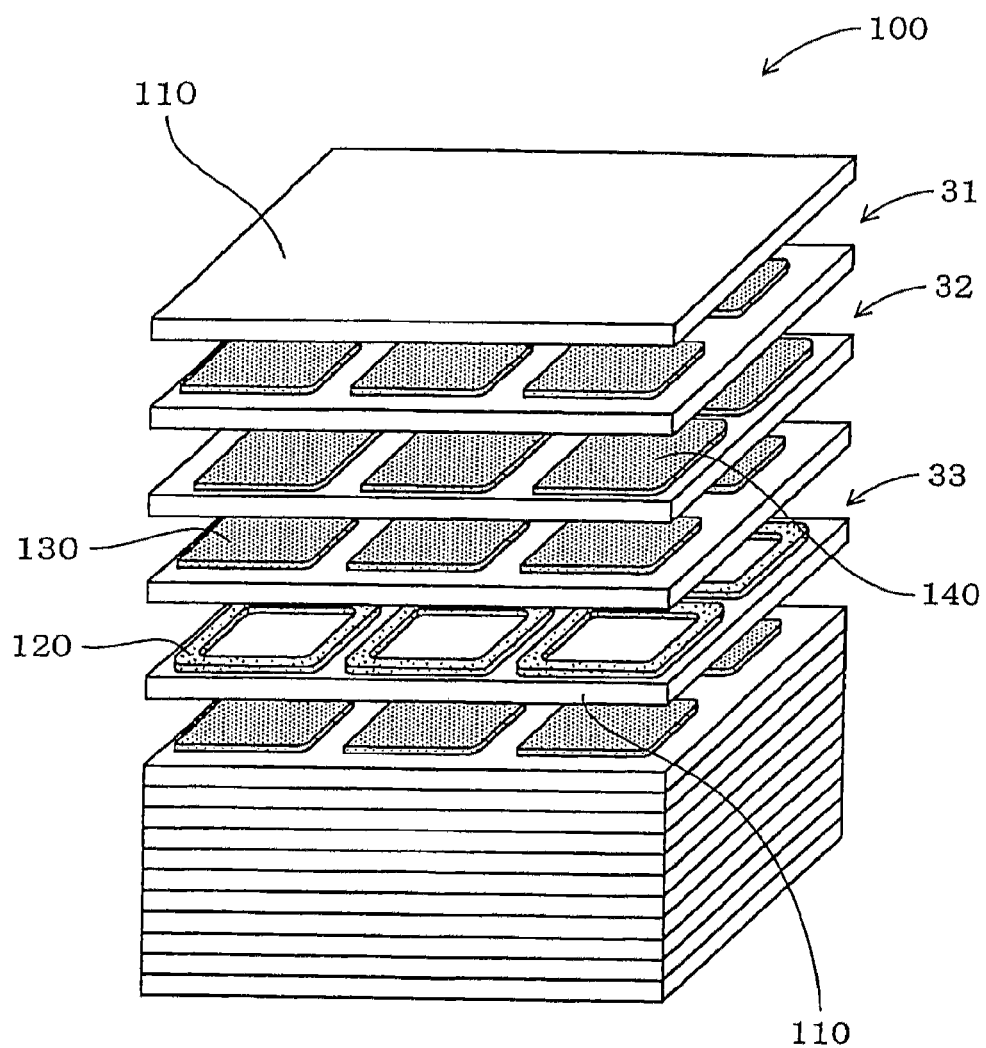
FIG. 39 is an explanatory view which shows a process of stacking electrode-printed sheets and burn-off slit-printed sheets according to the embodiment 3.
Figure 40:
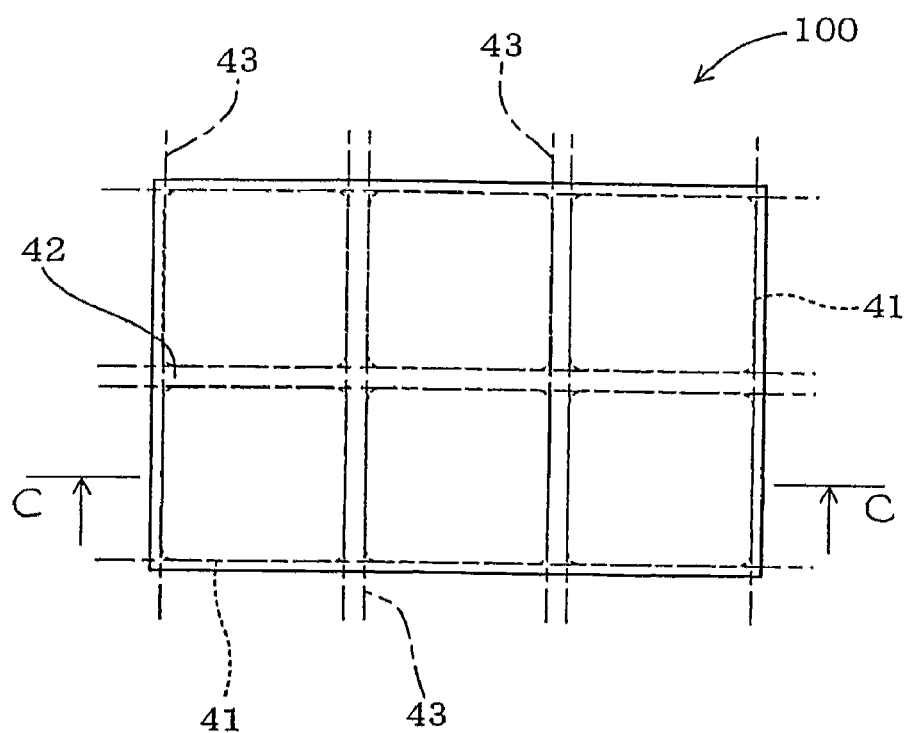
FIG. 40 is a top surface view of a pre-laminate according to the embodiment 3.

Next, the first electrode-printed sheet 31 and the second electrode-printed sheet 32, and the burn-off slit-printed sheets 33 were, as illustrated in FIG. 39, stacked in a given order so as to align the printing areas 41 in the laminating direction. Specifically, the first electrode-printed sheets 31 and the second electrode-printed sheets 32 were stacked alternately. Each of the burn-off slit-printed sheets 33 was inserted into the location where the above described slits are desired to be formed. Specifically, in this embodiment, the burn-off slit-printed sheet 33 was stacked on every stack of eleven layers made up of the first electrode-printed sheets 31 and the second electrode-printed sheets 32. The first electrode-printed sheets 31 and the second electrode-printed sheets 32 were stacked until a total number of them is 59. Green sheets on which the electrode material and the burn-off layers were not printed were disposed on both ends of the stack. The first electrode-printed sheets 31 and the second electrode-printed sheets 32 were stacked so that the electrode material 130 and the electrode material 140 were exposed alternately to the end surface which the printing areas face. The sheets stacked in this manner was heated at 100° C. and pressed at 50 MPa in the laminating direction to make a pre-stack 100. For the sake of convenience, FIG. 7 illustrates the pre-stack 100 which is smaller in number of stacked layers than actual.

<Stack Cutting Process>

Next, as illustrated in FIGS. 40 to 43, the pre-stack 100 were cut at the cutting positions 43 in the laminating direction to form the intermediate stacks 101.

The pre-stack 100 may be cut in the unit of the intermediate stacks 101 or in the unit of two or more of them. In this embodiment, the pre-stack 100 was cut in the unit of each of the intermediate stacks 101 so that each of the electrode materials 130 and 140 and the burn-off slit layers 120 were exposed to the side surfaces of the intermediate stack 101.

Figure 41:
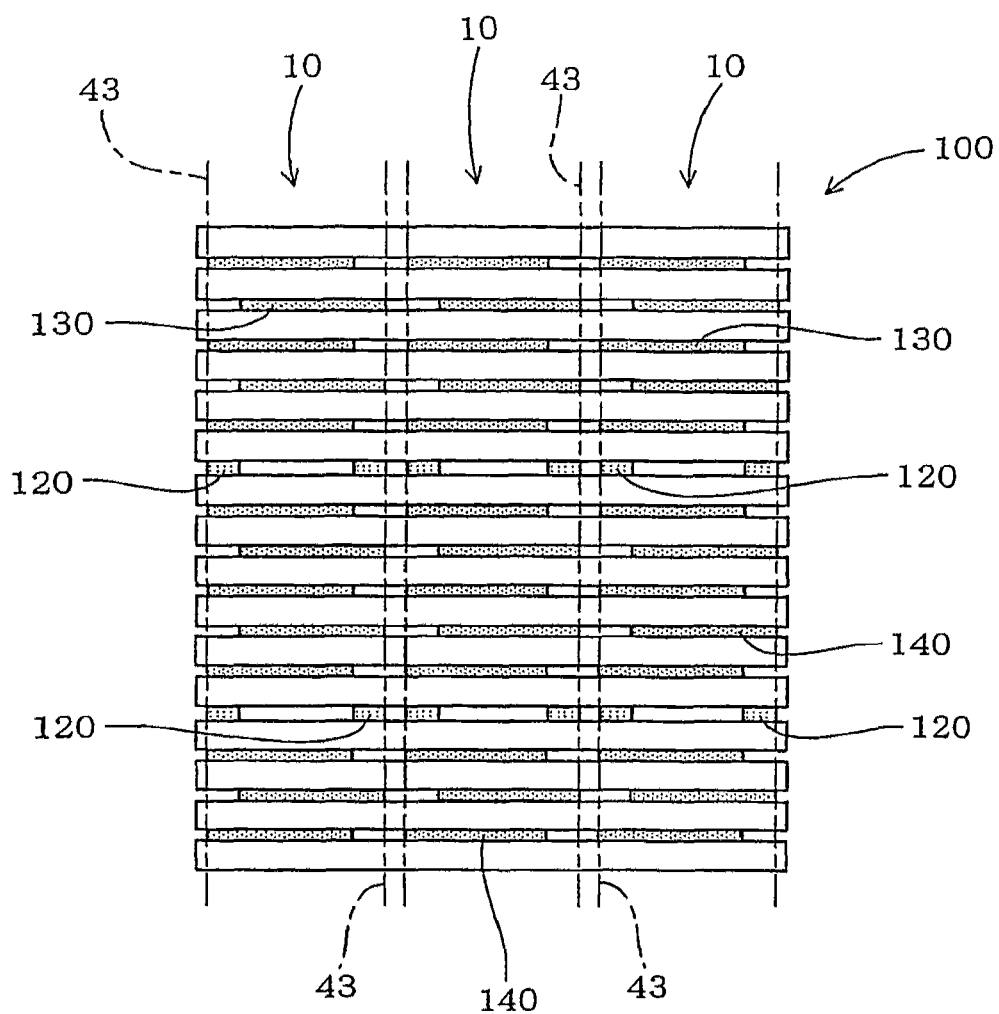
FIG. 41 is a cross sectional view showing a C-C sectional area in FIG. 40.
Figure 42:
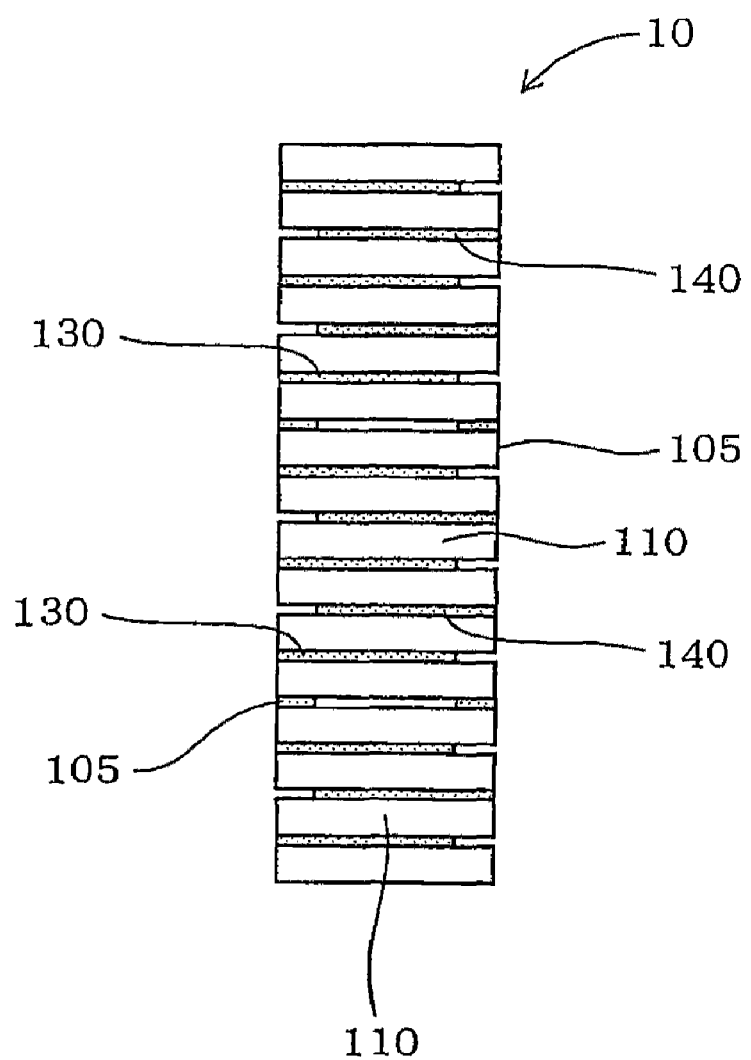
FIG. 42 is an explanatory view which shows a sectional structure of an intermediate laminate according to the embodiment 3.

For the sake of convenience, FIGS. 41 and 42 illustrate the pre-stack 100 and the intermediate stacks 101 which are smaller in number of stacked layers than actual.

<Firing Process>

Next, binder resin contained in the green sheet 110 of the intermediate stacks 101 was removed thermally (degreased). This was achieved by heating the binder resin gradually up to 500° C. for eighty hours and keeping it for five hours.

Next, the degreased intermediate stacks 10 were fired. The firing was achieved by heating the intermediate stacks 10 gradually up to 1050° C. for twelve hours, keeping them for two hours, and then cooling them gradually.

In this manner, the ceramic laminate 15 is, as illustrated in FIGS. 32 to 34, made which has the stress absorbing portions 11 and 12 formed by the burning-off of the burn-off slit layers 120. The stress absorbing portions 11 and 12 are defined by slit-like chambers formed in the entire circumferential surface of the ceramic laminate 15. As illustrated in FIGS. 32 to 34, the ceramic laminate 15 is made of the piezoelectric ceramic layers 10 formed by the sintered green sheets 110 and the inner electrode layers 13 and 14 formed by the electrode materials 130 and 140 which are stacked alternately.

After fired, the entire surface of the ceramic laminate 15 was polished to be 6 mm×6 mm square and 4.4 mm high. The side electrodes 17 and 18 were printed on the both side surfaces of the ceramic laminate 15. The inner electrodes 13 and 14 are connected electrically alternately to the side electrodes 17 and 18 respectively.

In the above manner, the stacked piezoelectric device 1, as illustrated in FIGS. 32 to 34, was made.

For the sake of convenience, FIGS. 32 to 34 illustrate the stacked piezoelectric device 1 which is smaller in number of stacked layers than actual.

In this embodiment, we made five kinds of stacked piezoelectric devices (samples F4 to F6, and samples G1 and G2) which were different between the recessed distance 243 of the recessed portion 242 of the inner electrode layer 241 which is located adjacent the negative electrode side absorbing portion 11 in the laminating direction across the reference electrode layer 235 connected electrically to the negative side electrode 17 next to the negative electrode side absorbing portion 11 and which is connected to the positive side electrode 18 and the depth of the above negative electrode side absorbing portion 11 and between the recessed distance 233 of the recessed portion 232 of the inner electrode layer 23 which is located adjacent the positive electrode side absorbing portion 12 formed on the side of the positive side electrode 18 and connected electrically to the negative side electrode 17 and the depth of the positive electrode side stress absorbing portion 12.

Specifically, the sample F1 is, like the sample E1 in the embodiment 1, the stacked piezoelectric device in which the averaged value of the above described recessed distance minus depth of the stress absorbing portion is 0.2 mm We measured a minimum value of the above recessed distance minus the depth of the stress absorbing portion in the sample F1 and found that it is 0.04 mm. Therefore, in the sample F1, the recessed distance 233 of the recessed portions 232 of the adjacent electrode 235 which is connected to the negative electrode side is greater than the depth 111 of the positive electrode side stress absorbing portion 12 by at least 0.04 mm or more (see FIG. 33). Additionally, the recessed distance 243 of the recessed portion 242 of the inner electrode layer 241 which is connected to the positive side electrode 18 and located adjacent the negative electrode side absorbing portion 11 in the laminating direction is greater than the depth 121 of the negative electrode side stress absorbing portion 11 by at least 0.04 mm or more.

The samples F2 and F3 are the stacked piezoelectric devices in which averaged values of the above described recessed distance minus depth of the stress absorbing portion are 0.39 mm and 0.58 mm, and minimum values thereof are 0.28 mm and 0.49 mm, respectively.

The samples G1 and G2 are the stacked piezoelectric devices in which averaged values of the above described recessed distance minus depth of the stress absorbing portion is 0.05 mm and −0.20 mm, and minimum values thereof are −0.03 mm and −0.30 mm, respectively.

We measured the recessed distances of all the recessed portions of the inner electrode layers connected to the positive side electrode of each of the samples. The averages and ranges (variations) thereof are shown in table 3. Similarly, we measured the recessed distances of all the recessed portions of the inner electrode layers connected to the negative side electrode of each of the samples. The averages and ranges (variations) thereof are also shown in table 3.

We also measured the depth of all the stress absorbing portions exposed to the same side surface (i.e., the side surface with the positive side electrode). The averages and ranges (variations) are shown in table 3. Similarly, we also measured the depth of all the stress absorbing portions exposed to the same side surface (i.e., the side surface with the negative side electrode). The averages and ranges (variations) are shown in table 3.

Next, we measured the durability of these stacked piezoelectric devices (i.e., the samples F1 to F3 and samples G1 and G2) in the same durability test as in the embodiment 1.

TABLE 3

| Sample No. | Recessed distance on the positive side (mm) | | Depth of stress absorbing portion on positive side (mm) | | Recessed distance on negative side (mm) | | Depth of stress absorbing portion on negative side (mm) | | Recessed distance-depth of stress absorbing portion (mm) | | Life (h) |
|---|---|---|---|---|---|---|---|---|---|---|---|
| | Average | Range | Average | Range | Average | Range | Average | Range | Average | Minimum | |
| F1 | 0.43 | 0.22-0.73 | 0.55 | 0.43-0.63 | 0.4 | 0.23-0.74 | 0.56 | 0.48-0.66 | 0.2 | 0.04 | >500 |
| F2 | 0.42 | 0.23-0.98 | 0.58 | 0.43-0.60 | 0.41 | 0.23-0.95 | 0.5 | 0.41-0.63 | 0.39 | 0.28 | >500 |
| F3 | 0.43 | 0.20-1.10 | 0.53 | 0.46-0.66 | 0.4 | 0.25-1.16 | 0.56 | 0.47-0.65 | 0.58 | 0.49 | >500 |
| G1 | 0.43 | 0.20-0.66 | 0.54 | 0.44-0.60 | 0.38 | 0.23-0.62 | 0.53 | 0.42-0.62 | 0.05 | 0.03 | 200 |
| G2 | 0.45 | 0.23-0.55 | 0.51 | 0.46-0.59 | 0.38 | 0.25-0.45 | 0.57 | 0.46-0.67 | −0.2 | −0.3 | 200 |

Table 3 shows that any of the samples F1 to F3 and G1 and G2 meets the relation of the average of all the recessed distances<the average of the depths of all the stress absorbing portions.

Table 3 also shows that in the samples F1 to F3, as viewed in the cross section of the stacked piezoelectric device in the laminating direction, averaged values of the recessed distances 233 of the recessed portions 232 of the adjacent electrode 235 connected to the negative electrode side is greater than the depth 111 of the positive electrode side absorbing portions 12 by 0.2 mm or more, and a minimum value thereof is greater than it by 0.04 mm or more, and that the averaged value of the recessed distances 243 of the recessed portions 242 of the inner electrode layers 241 which are located adjacent the negative electrode side absorbing portions 11 in the laminating direction and which are connected to the positive side electrode 18 is greater than the depth 121 of the negative electrode side stress absorbing portion 11 by 0.2 mm or more, and a minimum value thereof is greater than it by 0.04 mm or more (see FIG. 33). Table 3 also shows that in the samples F1 to F3, each have the separate portions 6 and 7 which are defined by an interval in a direction perpendicular to the laminating direction between the outer peripheral ends 539 and 549 of the inner electrode portions 531 and 541 of the adjacent electrode layers 54 connected to the positive side electrode 18 and the top ends 122 and 112 of the stress absorbing portions 12 and 11 located on the same side surfaces as the recessed portions 532 and 542 of the inner electrode layers 53 and 54, respectively (see FIG. 35). Therefore, the samples F1 to F3 according to this embodiment in which the piezoelectric ceramic layers 10 equipped with the stress absorbing portions 11 and 12 serve as drive layers reduce or avoid the application of excessive electric field to the stress absorbing portions 11 and 12 and found from table 3 to have a service life two times longer than that of comparative examples (i.e., the samples G1 and G2).

Table 3 also shows that in the sample G1, the averaged value of the above recessed distance minus the depth of the stress absorbing portion is greater than 0.03 mm or more, but it has a portion where the recessed distance is smaller than the depth of the stress absorbing portion by 0.05 mm.

Table 3 also shows that in the sample G2, the averaged value and the minimum value are smaller than the depth of the stress absorbing portion.

Therefore, in the samples G1 and G2, an excessive electric field may be applied to at least the top of the stress absorbing portion. The samples G1 and G2 are found from table 2 to have a service life much shorter than that of the samples F1 to F3.

As apparent from the above, it is possible to provide the stacked piezoelectric device (samples F1 to F3) which avoids the drop in insulation resistance and is excellent in durability without sacrificing the ability of deformation thereof.

Figure 43:
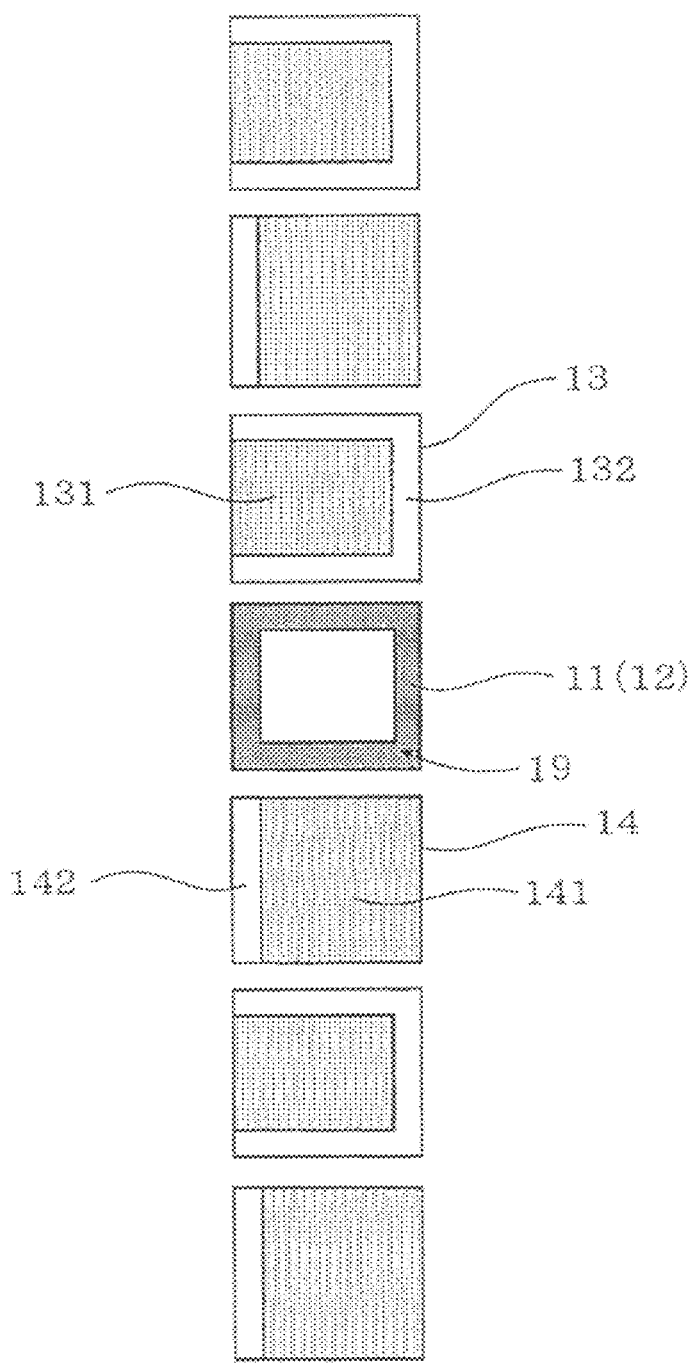
FIG. 43 is a development view of a ceramic laminate which shows a pattern in which inner electrode portions and slit layers are formed according to the embodiment 3.

In this embodiment, the inner electrode layers 231 and 241 and the slit layers 11 and 12 are formed in the pattern, as illustrated in FIG. 43. The invention is not limited to such a pattern. When seen therethrough in the laminating direction, it is preferable that the ceramic laminate has overlapping portions that are areas where all the inner electrode portions overlap each other and non-overlapping portions that are areas where the inner electrode portions at least partially overlap each other or do not overlap at all and that the stress absorbing portions are formed in the non-overlapping portions 19.

Figure 44:
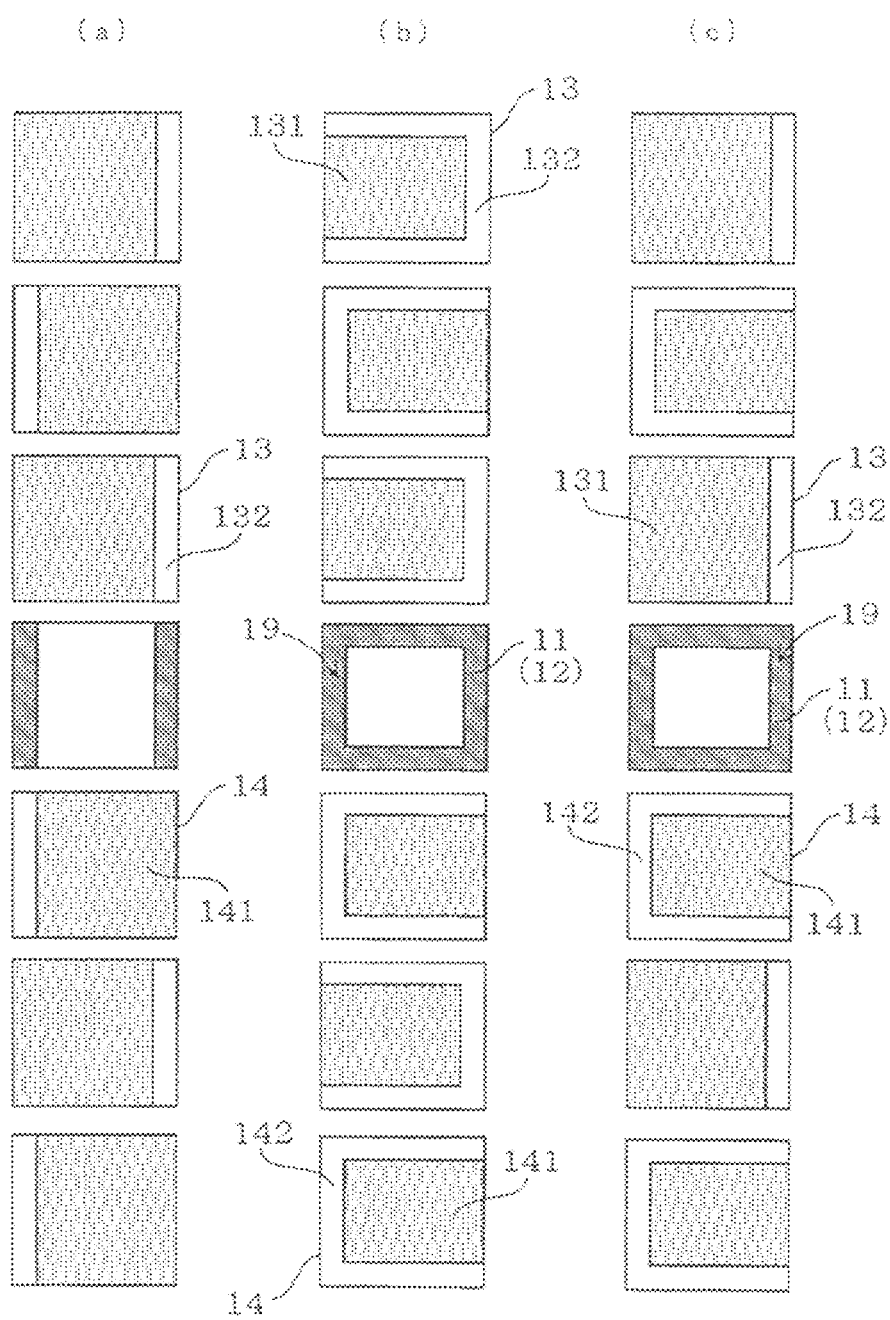
FIG. 44 is an explanatory view which shows variations (a) to (c) of a pattern in which inner electrode portions and slit layers are formed according to the embodiment 3.
Figure 45:
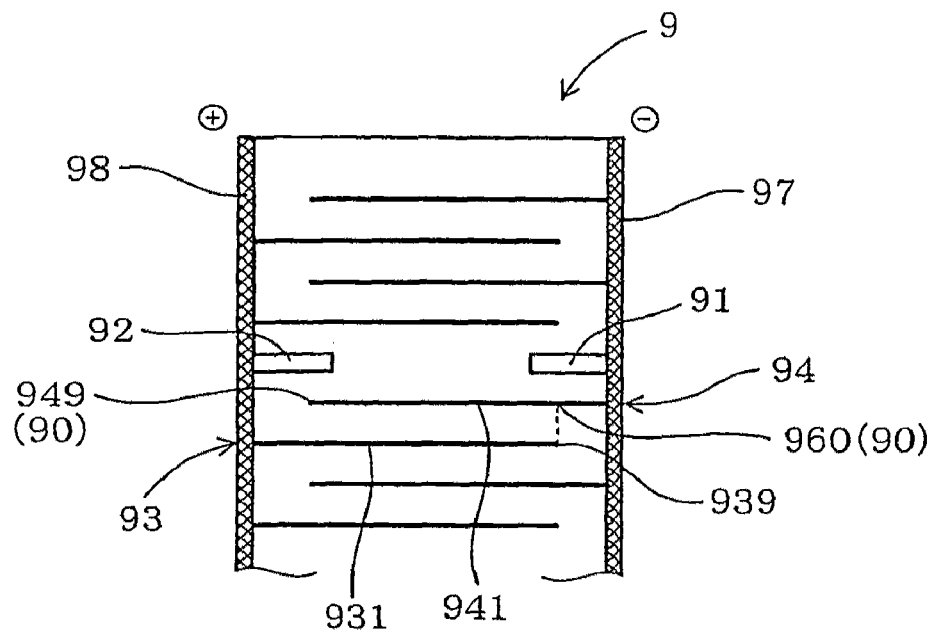
FIG. 45 is an explanatory view which shows a sectional structure of a stacked piezoelectric device near a stress absorbing portion and a piezoelectric driving area ends of the stacked piezoelectric device on which both the electric field intensity and the stress arising from the inverse piezoelectric effect concentrate.

Possible combinations of the inner electrode portions 231 and 241 and the slit layers 11 and 12 are demonstrated in FIGS. 44(a) to 44(c). Any of the combinations offers sufficient effects of the invention.

What is claimed is:

1. A stacked piezoelectric device including a ceramic laminate formed by laminating a plurality of piezoelectric ceramic layers and a plurality of inner electrode layers alternately and a pair of side electrodes formed on side surfaces extending in a direction perpendicular to a laminating direction of the ceramic laminate, characterized in that
    said inner electrode layers have a conductive inner electrode-formed area and an inner electrode-unformed area where an outer peripheral edge of said inner electrode-formed area is recessed inwardly from an outer peripheral surface of said ceramic laminate by a given recessed distance and are each connected electrically to one of said side electrodes alternately at the inner electrode-formed areas,
    said ceramic laminate has slit-like stress absorbing portions recessed inwardly from the side surfaces thereof to have given depths, and
    said recessed distances of said inner electrode-unformed areas of two of the inner electrode layers which interleave the stress absorbing portion therebetween and lie next thereto are respectively greater than the depths of the stress absorbing portions which are located on the same side surfaces as said inner electrode-unformed areas and lie next to said inner electrode-unformed areas in the laminating direction in a cross section of the stacked piezoelectric device, as taken in the laminating direction.

2. A stacked piezoelectric device as set forth in claim 1, characterized in that in the cross section of the stacked piezoelectric device, as taken in the laminating direction, the recessed distance of the inner electrode-unformed area of at least one of the inner electrode layers which placed between two of the stress absorbing potions and other two of the stress absorbing portions lying closest to each other in the laminating direction except two of the inner electrode layers interleaving the stress absorbing portions therebetween is smaller than the depths of the stress absorbing portions.

3. A stacked piezoelectric device as set forth in claim 1, characterized in that in the cross section of the stacked piezoelectric device, as taken in the laminating direction, an averaged value of the depths of all the stress absorbing portions exposed to the same side surface of said ceramic laminate is greater than an averaged value of the recessed distances of all the inner electrode-unformed areas formed on the same side surface as the all stress absorbing portions.

4. A stacked piezoelectric device as set forth in claim 1, characterized in that in the cross section of the stacked piezoelectric device, as taken in the laminating direction, the recessed distances of the inner electrode-unformed areas of all the inner electrode layers except one of two of the inner electrode layers interleaving the stress absorbing portion therebetween which has the inner electrode-unformed area on the same side surface as the stress absorbing portion are smaller than the minimum depths of the stress absorbing portions formed on the same side surfaces as said inner electrode-unformed areas.

5. A stacked piezoelectric device as set forth in claim 1, characterized in that in the cross section of the stacked piezoelectric device taken in the laminating direction, the recessed distance of one of the inner electrode-unformed areas of two of the inner electrode layers interleaving the stress absorbing portion therebetween which lies at the same side surface as said stress absorbing portion is greater than the depth of said stress absorbing portion by 0.04 mm or more.

6. A stacked piezoelectric device as set forth in claim 1, characterized in that in the cross section of the stacked piezoelectric device taken in the laminating direction, the recessed distance of one of the inner electrode-unformed areas of two of the inner electrode layers interleaving the stress absorbing portion therebetween which lies at the same side surface as said stress absorbing portion is greater than the depth of the stress absorbing portion which is lies on the same side surface as the one of said inner electrode-unformed areas by 0.2 mm or more on an average.

7. A stacked piezoelectric device as set forth in claim 1, characterized in that the piezoelectric ceramic layers are made to have a main component of zirconate titanate, and the inner electrode-formed areas are made to have a main component of AgPd alloy.

8. A stacked piezoelectric device as set forth in claim 1, characterized in that the stacked piezoelectric device is used in a fuel injector.

9. A stacked piezoelectric device including a ceramic laminate formed by laminating a plurality of piezoelectric ceramic layers and a plurality of inner electrode layers alternately and a pair of side electrodes formed on side surfaces extending in a direction perpendicular to a laminating direction of the ceramic laminate, characterized in that said inner electrode layers have a conductive inner electrode-formed area and an inner electrode-unformed area where an outer peripheral edge of said inner electrode-formed area is recessed inwardly from an outer peripheral surface of said ceramic laminate by a given recessed distance and are each connected electrically to one of said side electrodes alternately at the inner electrode-formed areas, said ceramic laminate has slit-like stress absorbing portions recessed inwardly from the side surfaces thereof to have given depths, if, in a cross section of the stacked piezoelectric device, as taken in the laminating direction, the stress absorbing portions connected to a negative side of the side electrodes are defined as negative electrode side absorbing portions, and one of two of the inner electrode layers interleaving the negative electrode side absorbing portion which is connected to the negative side of the side electrodes is defined as a reference electrode layer, the recessed distance of the inner electrode-unformed area of each of the inner electrode layers which is located next to the reference electrode layer, interleaves the reference electrode layer between itself and the negative electrode side absorbing portion in the laminating direction, and is connected to a positive side of the side electrodes is greater than the depths of the negative electrode side absorbing portions, and if, in the cross section of the stacked piezoelectric device in the laminating direction, the stress absorbing portions connected to a positive side of the side electrodes are defined as positive electrode side absorbing portions, of two of the inner electrode layers which are located next to and interleave the positive electrode side absorbing portion therebetween, the recessed distance of the inner electrode-unformed area of one connected to the negative side of the side electrodes is greater than the depths of the positive electrode side absorbing portions.

10. A stacked piezoelectric device as set forth in claim 9, characterized in that in the cross section of the stacked piezoelectric device in the laminating direction, the recessed distances of the inner electrode-unformed areas of all the inner electrode layers except the inner electrode layer which is situated next to the stress absorbing portion and interleaves the reference electrode layer between itself and the stress absorbing portion and connected to the positive side of the side electrodes and one of two of the inner electrode layers located next to and interleaving the positive electrode side absorbing portion therebetween which is connected electrically to the negative side of the side electrodes are smaller than the minimum depths of the stress absorbing portions formed on the same side surfaces as the inner electrode-unformed areas, respectively.

11. A stacked piezoelectric device as set forth in claim 9, characterized in that in the cross section of the stacked piezoelectric device, as taken in the laminating direction, an averaged value of the depths of all the stress absorbing portions exposed to the same side surface of said ceramic laminate is greater than an averaged value of the recessed distances of all the inner electrode-unformed areas formed on the same side surface as the all stress absorbing portions.

12. A stacked piezoelectric device as set forth in claim 9, characterized in the cross section of the stacked piezoelectric device in the laminating direction, two of the inner electrode layers which are located next to and interleave the positive electrode side stress absorbing portion therebetween, the recessed distance of the inner electrode-unformed area of one which is connected electrically to the negative side of the side electrodes is greater than or equal to the depth of the positive electrode side absorbing portions by 0.04 mm or more.

13. A stacked piezoelectric device as set forth in claim 9, characterized in the cross section of the stacked piezoelectric device in the laminating direction, an averaged value of the recessed distances of the inner electrode-unformed areas of the inner electrode layers each of which is one of two of the inner electrode layers, as placed next to and interleaving the positive electrode side absorbing portion, which is connected electrically to the negative side of the side electrodes is greater than an averaged value of the depths of the positive electrode side absorbing portions by 0.2 mm or more.

14. A stacked piezoelectric device including a ceramic laminate formed by laminating a plurality of piezoelectric ceramic layers and a plurality of inner electrode layers alternately and a pair of side electrodes formed on side surfaces extending in a direction perpendicular to a laminating direction of the ceramic laminate, characterized in that said inner electrode layers have a conductive inner electrode-formed area and an inner electrode-unformed area where an outer peripheral edge of said inner electrode-formed area is recessed inwardly from an outer peripheral surface of said ceramic laminate by a given recessed distance and are each connected electrically to one of said side electrodes alternately at the inner electrode-formed areas, said ceramic laminate has slit-like stress absorbing portions recessed inwardly from the side surfaces thereof to have given depths, if two of the inner electrode layers interleaving said stress absorbing portion therebetween are defined as adjacent electrode layers, in a cross section of the stacked piezoelectric device, as taken in the laminating direction, separation portions are provided which are each defined by an interval in a direction perpendicular to the laminating direction between said outer peripheral edge of the inner electrode-formed area of the adjacent layer and a top end of the stress absorbing portion located on the same side surface as the inner electrode-unformed portion of said adjacent layer.

15. A stacked piezoelectric device as set forth in claim 14, characterized in that in the cross section of the stacked piezoelectric device in the laminating direction, except the adjacent electrode layers, the recessed distance of at least one of the inner electrode layers interleaved between one of the stress absorbing portions and another of the stress absorbing portions which is formed closes to the one of the stress absorbing portions in the laminating direction is smaller than the depths of the stress absorbing portions.

16. A stacked piezoelectric device as set forth in claim 14, characterized in that in the cross section of the stacked piezoelectric device, as taken in the laminating direction, an averaged value of the depths of all the stress absorbing portions exposed to the same side surface of said ceramic laminate is greater than an averaged value of the recessed distances of all the inner electrode-unformed areas formed on the same side surface as the all stress absorbing portions.

17. A stacked piezoelectric device as set forth in claim 14, characterized in that the interval is greater than or equal to 0.04 mm.

18. A stacked piezoelectric device as set forth in claim 14, characterized in that in the stacked piezoelectric device, an average of the intervals is greater than or equal to 0.2 mm or more.

* * * * *